(12) United States Patent
Zhu et al.

(10) Patent No.: US 10,236,457 B2
(45) Date of Patent: Mar. 19, 2019

(54) SYNTHESIS OF PORPHYRIN MATERIALS FOR HIGHLY EFFICIENT ORGANIC PHOTOVOLTAICS

(71) Applicant: Hong Kong Baptist University, Hong Kong (HK)

(72) Inventors: Xunjin Zhu, Hong Kong (HK); Song Chen, Hong Kong (HK); Wai Yeung Wong, Hong Kong (HK); Wai Kwok Wong, Hong Kong (HK)

(73) Assignee: Hong Kong Baptist University, Hong Kong (HK)

( * ) Notice: Subject to any disclaimer, the term of this patent is extended or adjusted under 35 U.S.C. 154(b) by 122 days.

(21) Appl. No.: 15/635,563

(22) Filed: Jun. 28, 2017

(65) Prior Publication Data

US 2018/0006248 A1 Jan. 4, 2018

Related U.S. Application Data

(60) Provisional application No. 62/356,018, filed on Jun. 29, 2016.

(51) Int. Cl.
| | | |
|---|---|---|
| *C07D 487/22* | (2006.01) |
| *H01L 51/00* | (2006.01) |
| *C09B 47/00* | (2006.01) |
| *C09B 23/04* | (2006.01) |
| *C09B 57/00* | (2006.01) |
| *C09B 3/78* | (2006.01) |
| *H01G 9/20* | (2006.01) |
| *H01L 51/42* | (2006.01) |

(52) U.S. Cl.
CPC ............ *H01L 51/0092* (2013.01); *C09B 3/78* (2013.01); *C09B 23/04* (2013.01); *C09B 47/00* (2013.01); *C09B 57/00* (2013.01); *H01G 9/20* (2013.01); *H01L 51/4253* (2013.01); *Y02E 10/549* (2013.01)

(58) Field of Classification Search
CPC .................................................. C07D 487/22
See application file for complete search history.

(56) References Cited

FOREIGN PATENT DOCUMENTS

CN 103724355 A 4/2014
CN 105017264 A 11/2015

OTHER PUBLICATIONS

A. Shah, P. Torres, et al., "Photovoltaic Technology: The Case for Thin-Film Solar Cells", Science 285, No. 5428, 592-698,1999.
G. Li, R. Zhu, et.al., "Polymer solar cells", Nature Photonics vol. 6, 2012, 153-161.
E Dietel, et al., "A macrocyclic [60]fullerene—porphyrin dyad involving p-p stacking interactions", Chem. Commun., 1998, 18, 1981p.
S. Mathew, et al., "Dye-sensitized solar cells with 13% efficiency achieved through the molecular engineering of porphyrin sensitizers" Nat Chem. vol. 6, 2014, 242-247.
A. Yella, et al., "Porphyrin-Sensitized Solar Cells with Cobalt (II/III)—Based Redox Electrolyte Exceed 12 Percent Efficiency" Science vol. 334, 2011, 629-634.
J. Hatano, et al., "Soluble porphyrin donors for small molecule bulk heterojunction solar cells", J. Mater. Chem., 2012, 22, 19258-19263.
L. L. Li, et.al., "Porphyrin-sensitized solar cells" Chem. Soc. Rev., 2013, 42, 291-304.
C. L. Mai, et al., "Synthesis and characterization of diporphyrin sensitizers for dye-sensitized solar cells", Chem. Commun., 2010, 46, 809-811.
C. J. Brabec, et al., "Plastic Solar Cells", Adv. Funct. Mater., 2001, 11, 15-26.
S. Günes, et al., "Conjugated Polymer-Based Organic Solar Cells" Chem. Rev., 2007, 107, 1324-1338.
Y.-J. Cheng, et al., "Synthesis of Conjugated Polymers for Organic Solar Cell Applications", Chem. Rev., 2009, 109, 5868-5923.
Q. Zhang, et al., "Small-molecule solar cells with efficiency over 9%" Nat Photonics, 2014, 9, 35-41.
B. Kan, et al., "Solution-Processed Organic Solar Cells Based on Dialkylthiol-Substituted Benzodithiophene Unit with Efficiency near 10%" J. Am. Chem. Soc., 2014, 136, 15529-15532.
S. Chen, et al., "Solution-processed new porphyrin-based small molecules as electron donors for highly efficient organic photovoltaics" Chem. Commun., 2015, 51, 14439-14442.
H. Wang, et al., "Structural engineering of porphyrin-based small molecules as donors for efficient organic solar cells" Chem. Sci., 2016, 7, 4301.

(Continued)

*Primary Examiner* — Brian E McDowell
(74) *Attorney, Agent, or Firm* — Spruson & Ferguson (Hong Kong) Limited

(57) ABSTRACT

The present disclosure relates to porphyrin small molecules that can be represented by, e.g., a compound of Formula IV designed and synthesized for bulk heterojunction (BHJ) organic solar cells (OSCs). Provided are synthesized materials with strong and ordered self-assembly property, leading to form bi-continuous, interpenetrating networks which are required for efficient charge separation and transport in organic solar cells. The power conversion efficiency (PCE) of the solar cells devices based on the embodiments of the present disclosure have the highest PCE among the solution-processed BHJ solar cell based on porphyrin small molecules to date.

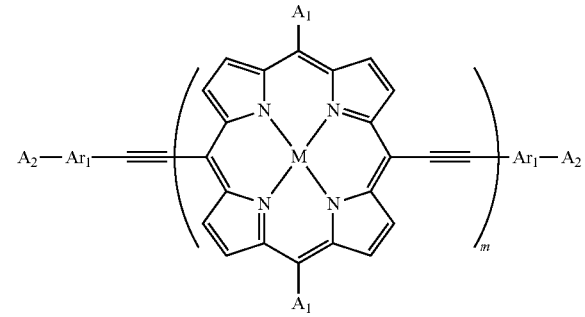

IV

14 Claims, 17 Drawing Sheets

(56) References Cited

OTHER PUBLICATIONS

L. Xiao, et al., "New Terthiophene-Conjugated Porphyrin Donors for Highly Efficient Organic Solar Cells", ACS Appl. Mater. Inter., 2016, 8, 30176-30183.
S. Chen, et al. "Study of Arylamine-Substituted Porphyrins as Hole-Transporting Materials in High-Performance Perovskite Solar Cells" ACS Appl. Mater. Inter., 2017, 9, 13231.
H.-P. Wu, et al., "Molecular engineering of cocktail co-sensitization for efficient panchromatic porphyrin-sensitized solar cells" Energy Environ. Sci., 2012, 5, 9843-9848.
J.-W Shiu, et al., "Panchromatic co-sensitization of porphyrinsensitized solar cells to harvest near-infrared light beyond 900 nm" J. Mater. Chem. A, 2015, 3, 1417-1420.
International Search Report and Written Opinion of PCT Application No. PCT/CN2017/090897 issued from the International Search Authority dated Sep. 27, 2017.
Chen et al.; Solution-Processed New Porphyrin-Based Small Molecules as Electron Donors for Highly Efficient Organic Photovoltaics; Chemical Communications; Oct. 4, 2015; pp. 14439-14442; vol. 51, Issue 77; The Royal Society of Chemistry; United Kingdom.
Arrechea et al.; New Acceptor—$\pi$-Porphyrin—$\pi$-Acceptor Systems for Solution-Processed Small Molecule Organic Solar Cells; Dyes and Pigments; May 8, 2015; pp. 109-117; vol. 121; Elsevier B.V.; Netherlands.
Lee et al.; Porphyrin sensitized solar cells: TiO2 sensitization with a $\pi$-extended porphyrin possessing two anchoring groups; Chemical Communication; Jul. 23, 2010; pp. 6090-6092; vol. 46, Issue 33; The Royal Society of Chemistry; United Kingdom.
Kumar et al.; A-$\pi$-D-$\pi$-A Based Porphyrin for Solution Processed Small Molecule Bulk Hetero Junction Solar Cells; Journal of Materials Chemistry A; Jul. 2, 2015; pp. 16287-16301; vol. 3, Issue 31; The Royal Society of Chemistry; United Kingdom.
Gao et al.; Solution-Processed Bulk Heterojunction Solar Cells Based on Porphyrin Small Molecules with Very Low Energy Losses Comparable to Perovskite Solar Cells and High Quantum Efficiencies; Journal of Materials Chemistry C; Jan. 21, 2016; pp. 3843-3850; vol. 4, Issue17; The Royal Society of Chemistry; United Kingdom.
Moran et al.; CuSCN as Selective Contact in Solution Processed Small Molecule Organic Solar Cells Leads to over 7% Efficient Porphyrin Based Device; Journal of Materials Chemistry A; Jun. 14, 2016; pp. 11009-11022; vol. 4, Issue 28; The Royal Society of Chemistry; United Kingdom.

SYNTHESIS OF PORPHYRIN MATERIALS FOR HIGHLY EFFICIENT ORGANIC PHOTOVOLTAICS

CROSS-REFERENCE TO RELATED APPLICATIONS

This application claims priority from U.S. Provisional Patent Application Ser. No. 62/356,018 filed on Jun. 29, 2016, the disclosure of which is hereby incorporated by reference.

FIELD OF INVENTION

The present disclosure relates to porphyrin small molecules useful for bulk heterojunction (BHJ) organic solar cells (OSCs) applications. Provided are synthesized materials that can have strong and ordered self-assembly properties, leading to form bi-continuous, interpenetrating networks, which can be used for efficient charge separation and transport in organic solar cells. The power conversion efficiency (PCE) of the solar cells based on the embodiments described herein can have high PCE relative to traditional solution-processed BHJ solar cell devices based on porphyrin small molecules.

BACKGROUND OF INVENTION

Solution-processed organic photovoltaics have been recognized as one of the most promising alternative next-generation green technologies to inorganic solar cells. They have drawn much attention due, in part, to their potential eco-friendliness and low-cost conversion of solar energy to clean electricity due to, e.g., their solution processability, light weight and flexibility of organic solar cells (OSCs).

As a result of the remarkable improvements in power conversion efficiencies (PCEs) of up to 13.2% that have been achieved for single-junction bulk heterojunction (BHJ) polymer OSCs, small molecule (SM) BHJ OSCs are under intense study recently.

Small molecule BHJ OSCs have several advantages over single-junction BHJ polymer OSCs. Such advantages include, e.g., defined molecular structure and molecular weight, high purity, and good batch-to-batch reproducibility of small molecules in comparison with their polymer counterparts.

These properties have the potential to allow researchers to better understand the relationships between the molecular structures and device performance. They may also provide a path to design higher performance photovoltaic materials and finally realize commercial applications especially when the PCEs of solution-processed small molecule based solar cells have increased dramatically up to 10% for single layer cells structure, which is closing the gap to the much widely investigated polymer based solar cells.

Inspired by the natural photosynthetic systems which utilize chlorophylls to absorb light and carry out photochemical charge separation to store light energy, porphyrins and their derivatives have been explored as the active materials from the beginning of OSC studies. However, the PCEs of the BHJ OSCs based on them have traditionally been very low.

It is an objective of the present disclosure to provide materials for building BHJ OSC to achieve higher PCEs.

SUMMARY OF INVENTION

The present disclosure relates to porphyrin small molecules designed and synthesized for bulk heterojunction (BHJ) organic solar cells (OSCs). Provided herein are synthesized materials with strong and ordered self-assembly properties, leading to form bi-continuous, interpenetrating networks, which are required for efficient charge separation and transport in organic solar cells. The power conversion efficiency (PCE) of the solar cells devices based on the embodiments described herein have the highest PCE among the solution-processed BHJ solar cell based on porphyrin small molecules to date.

In one aspect of the present disclosure, provided is a porphyrin small molecule having a molecular formula represented by Type 1, Type 2, Type 3, or Type 4:

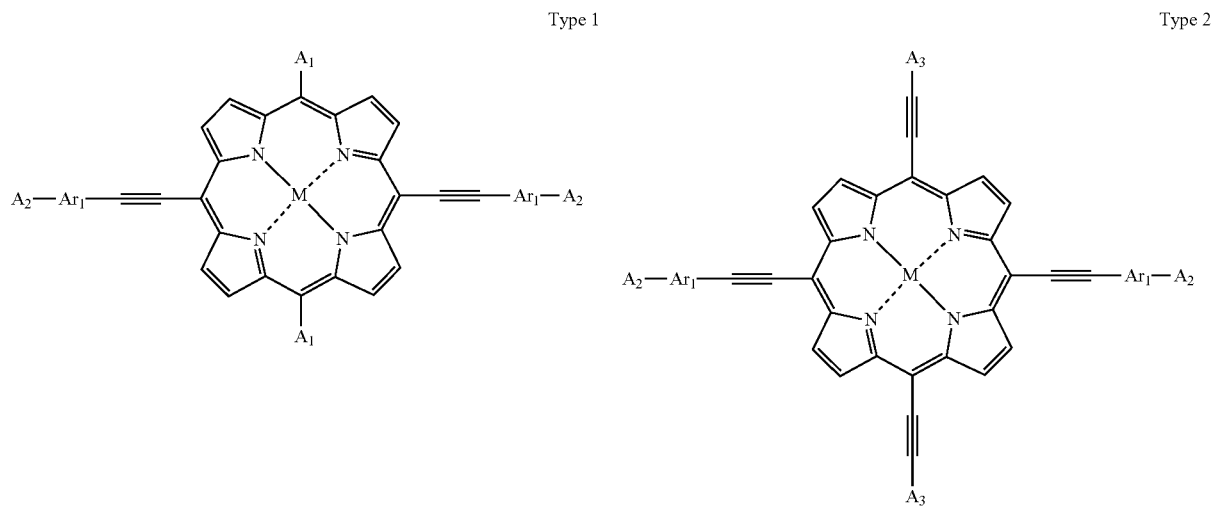

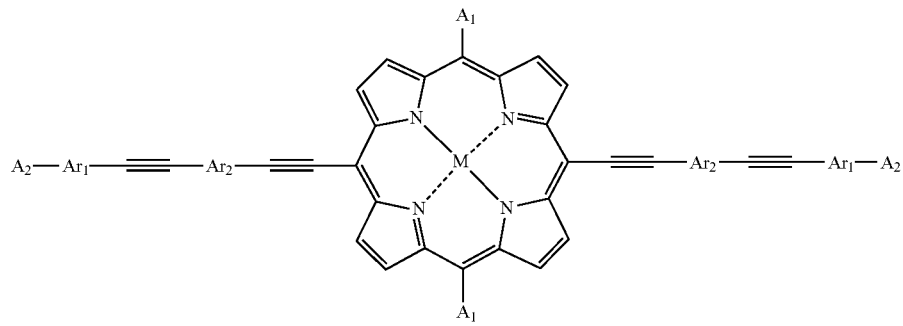
Type 3
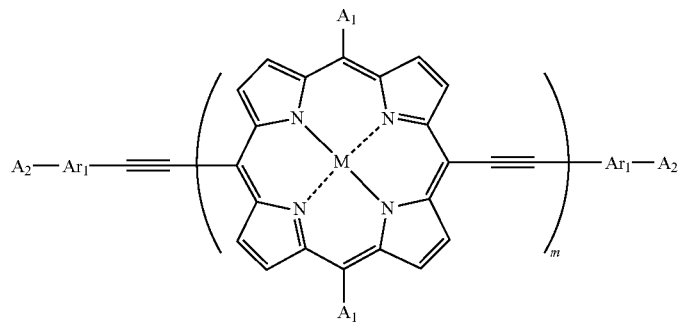
Type 4
wherein,
m is an integer selected from 2, 3, 4, or 5;
M is selected from the group consisting of $Fe^{2+}$, $Fe^{3+}$, $Co^{2+}$, $Co^{3+}$, $Ni^{2+}$, $Zn^{2+}$, $Cu^{2+}$, $Ru^{2+}$, $Pd^{2+}$, and $Pt^{2+}$;
Ar1 for each occurrence is independently selected from the group consisting of:
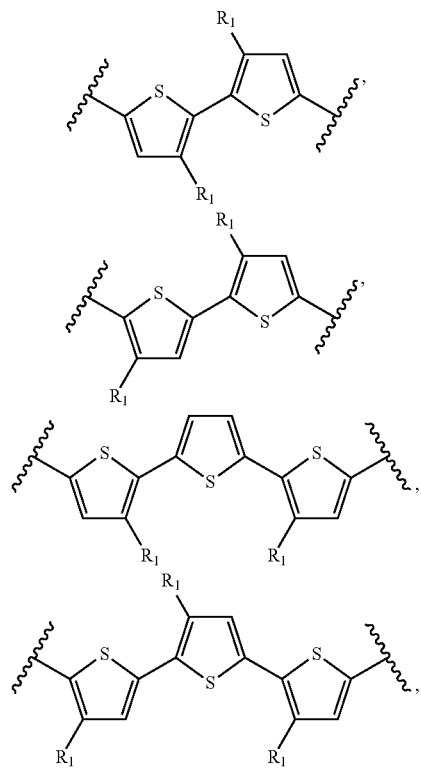
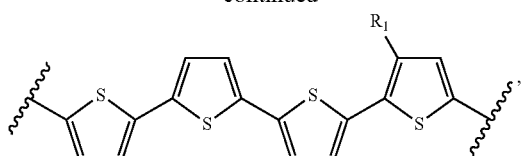
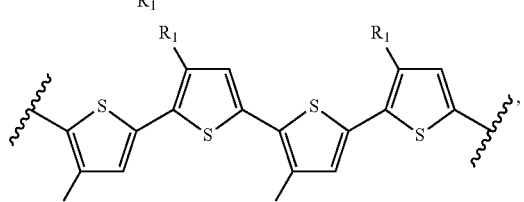
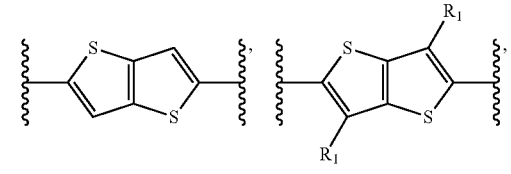
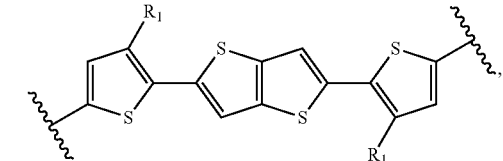
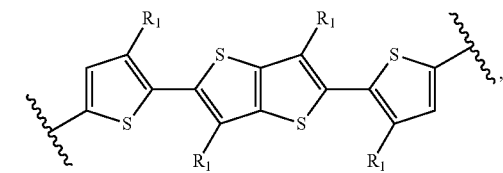

-continued
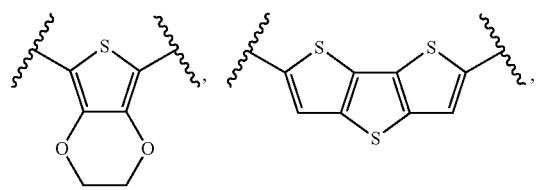
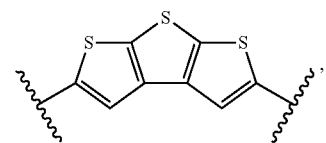
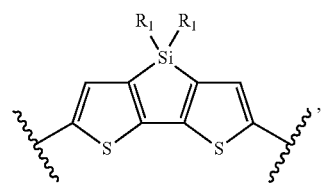
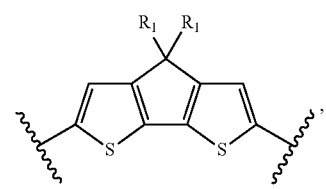
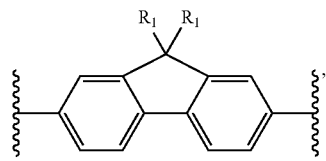
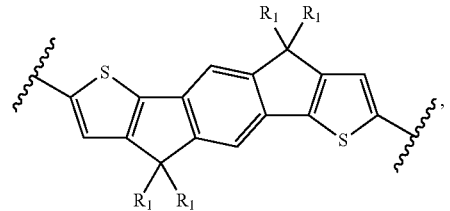
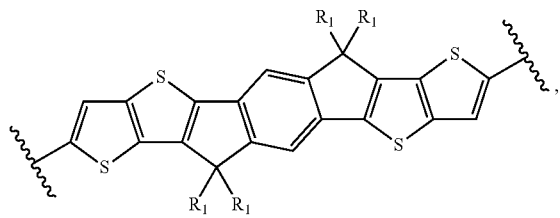
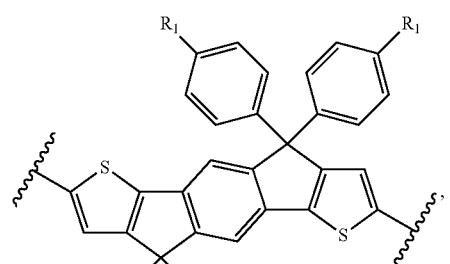
-continued
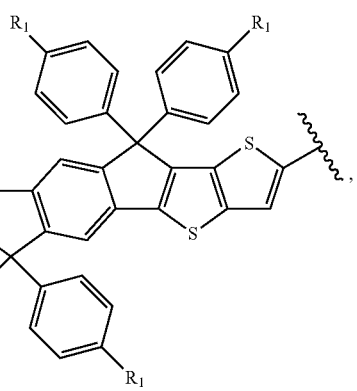
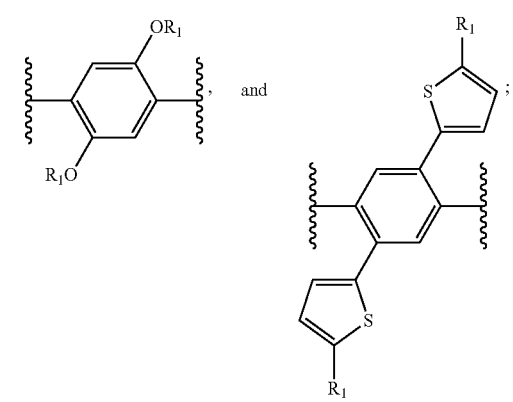
$Ar_2$ for each occurrence is independently selected from the group consisting of:

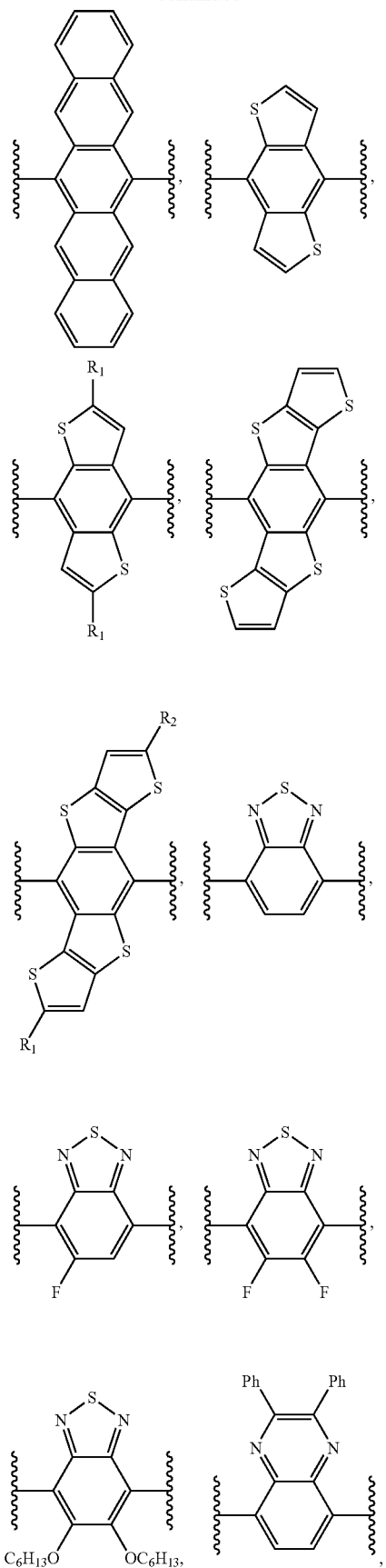
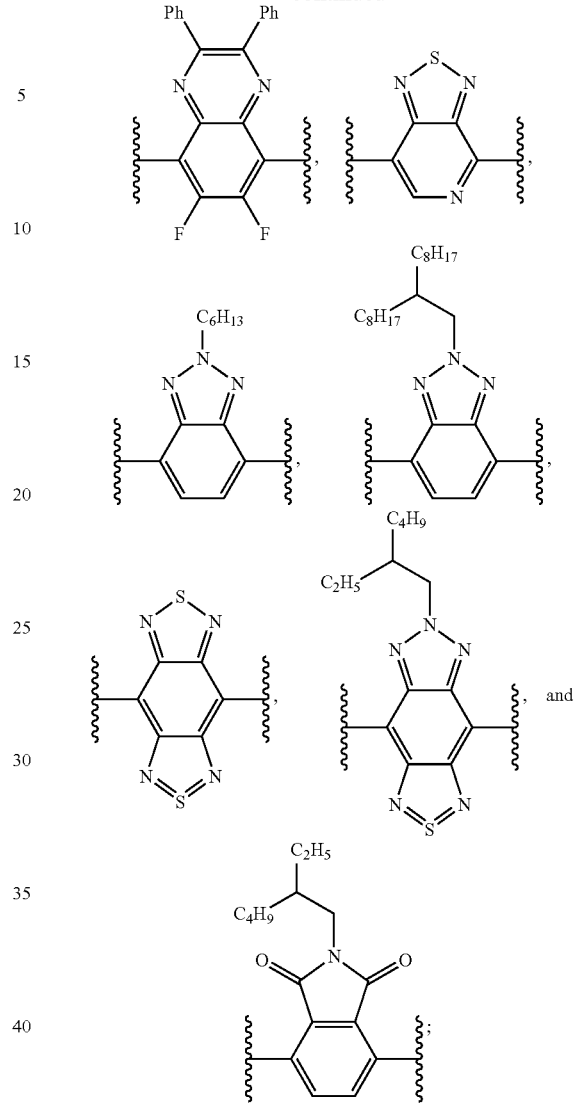

$A_1$ for each instance is independently selected from the group consisting of hydrogen, alkyl, cycloalkyl, cyclohexyl, cycloheptyl, cyclooctytl, haloalkyl, perhaloalkyl, ether, —$R_3$, —$CH(R_3)(R_4)$, —$CH_2CH(R_3)(R_4)$, —$CH_2CH_2CH(R_3)(R_4)$, —$CH_2(OCH_2CH_2)_nOCH_3$, —$CH_2(OCH_2CH_2)_2OCH_3$, —$CH_2(CH_2)_nCF_3$, —$CH_2(CH_2)_5CF_3$, and —$CF_2(CF_2)_5CF_3$;

$A_2$ for each instance is independently selected from the group consisting from the group consisting of:

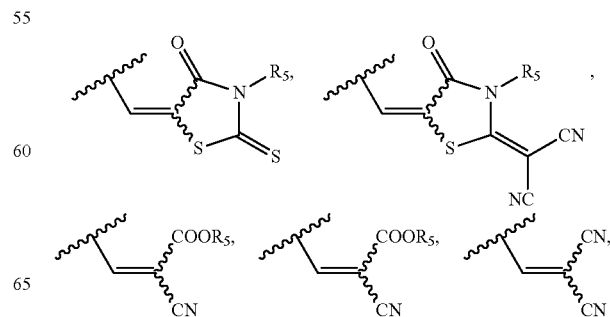

-continued

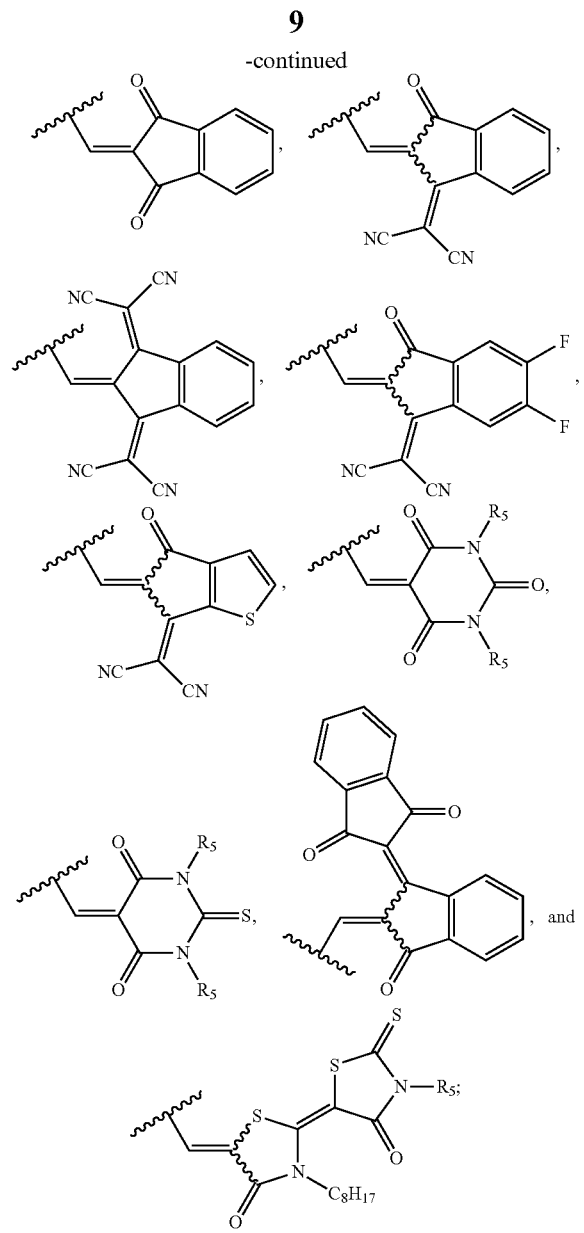

$A_3$ for each instance is independently selected from the group consisting of:

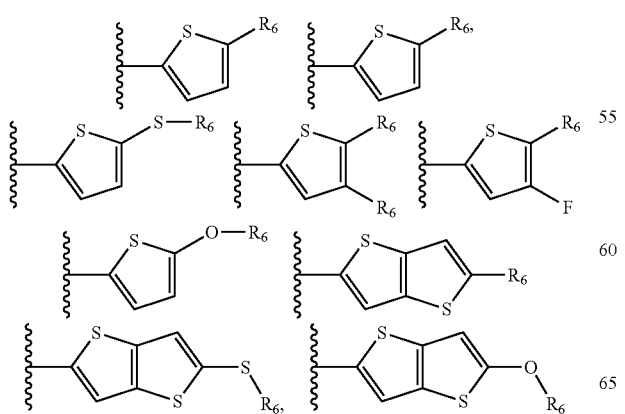

-continued

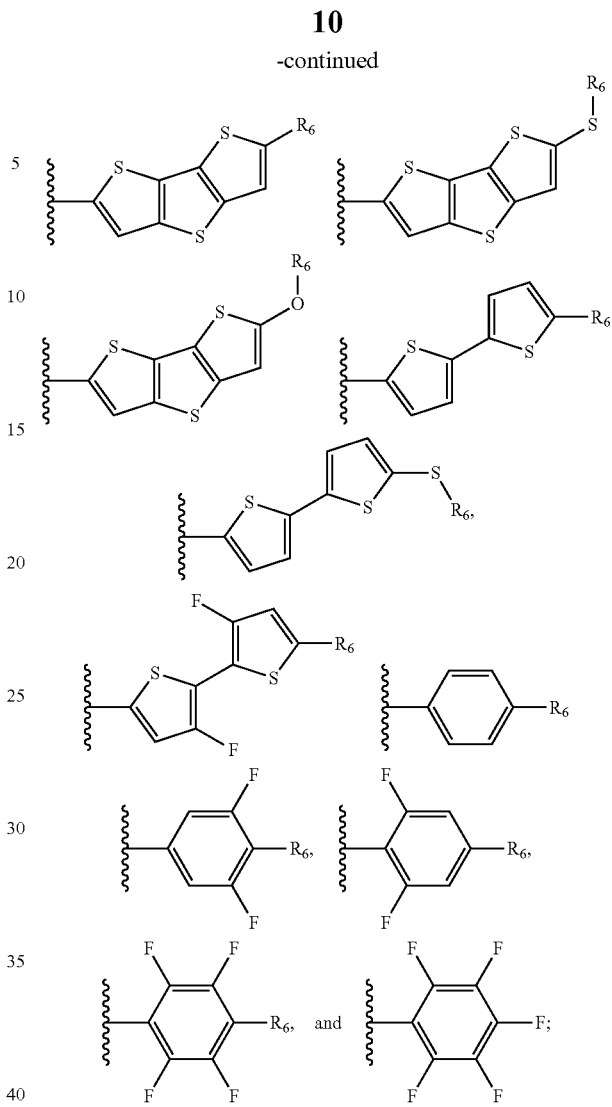

each instance of $R_1$, $R_2$, $R_5$, and $R_6$, is independently selected from the group consisting of hydrogen, halogen, cyano, alkyl, haloalkyl, alkoxy, haloalkoxy, aryl, haloaryl, aryloxy, halogenated aryloxy, cycloalkyl, heterocyclic alkyl, halogenated heterocyclic alkyl, heterocyclic alkoxy, halogenated heterocyclic alkoxy, heteroaryl, halogenated heteroaryl, heteroaryloxy, halogenated heterocyclic aryloxy, amino, halogenated amino, nitro

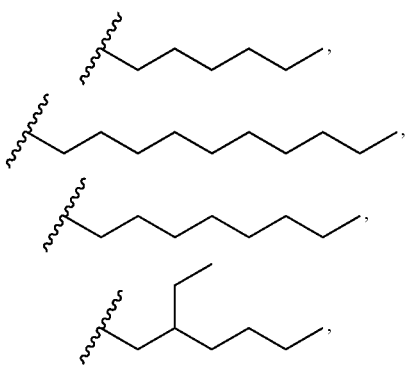

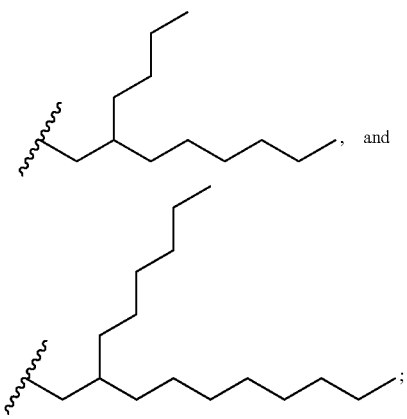

and

R₃ and R₄ are independently selected from the group consisting of $C_1$-$C_{20}$ alkyl, $C_2$-$C_8$ alkyl, $C_4$-$C_{12}$ alkyl, $C_5$-$C_8$ alkyl, cycloalkyl, alkoxyl, aryloxyl, thioalkoxyl, and thioaryloxyl.

In certain embodiments, the porphyrin small molecule has a molecular formula represented by Formula I:

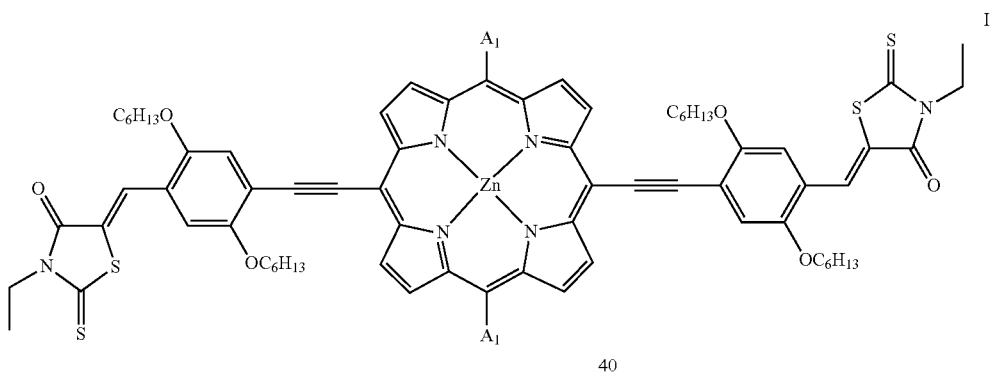

wherein, $A_1$ for each instance is independently selected from the group consisting of:

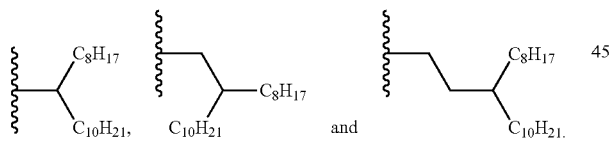

In certain embodiments, the porphyrin small molecule has a molecular formula represented by formula II or III:

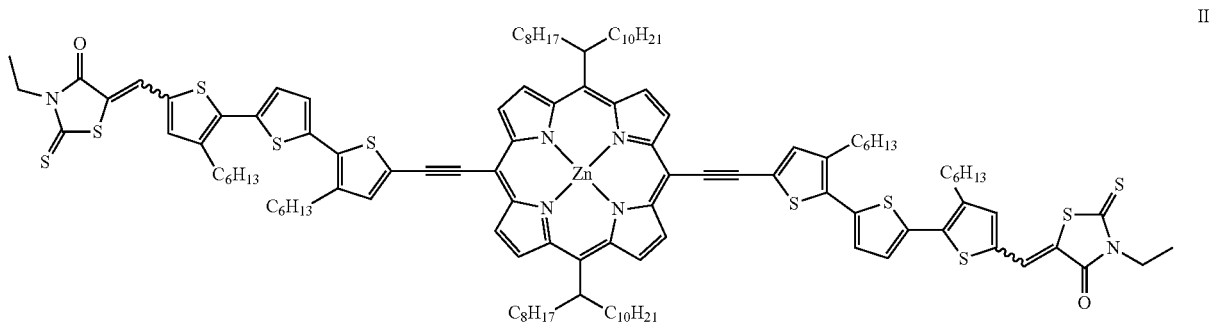

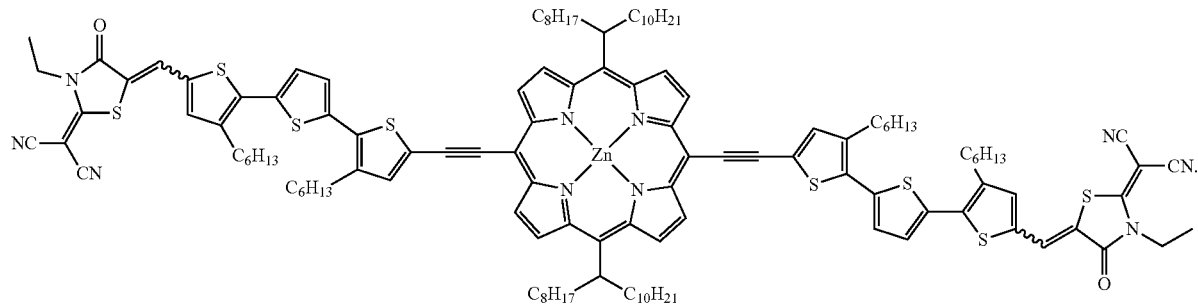
III
In certain embodiments, the porphyrin small molecule has a molecular formula represented by IV or V:
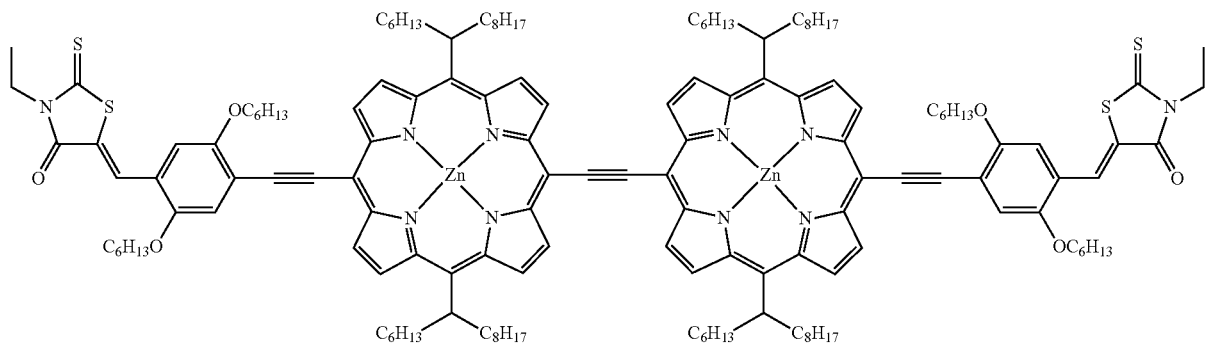
IV
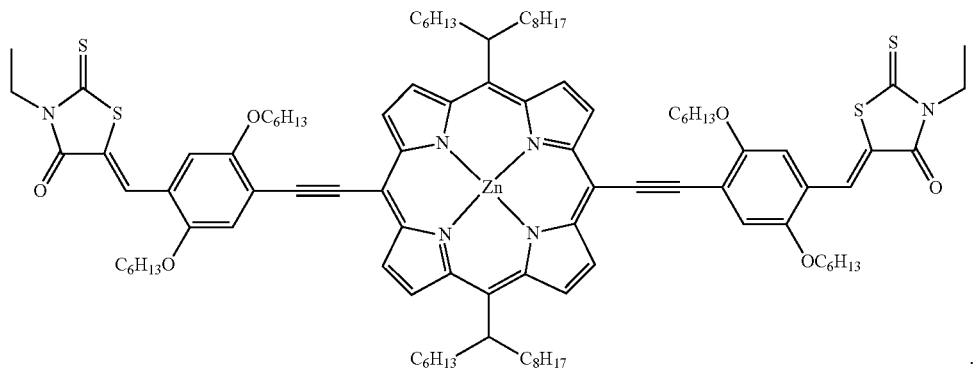
V In certain embodiments, the porphyrin small molecule has a molecular formula represented by the structure VI:

VI
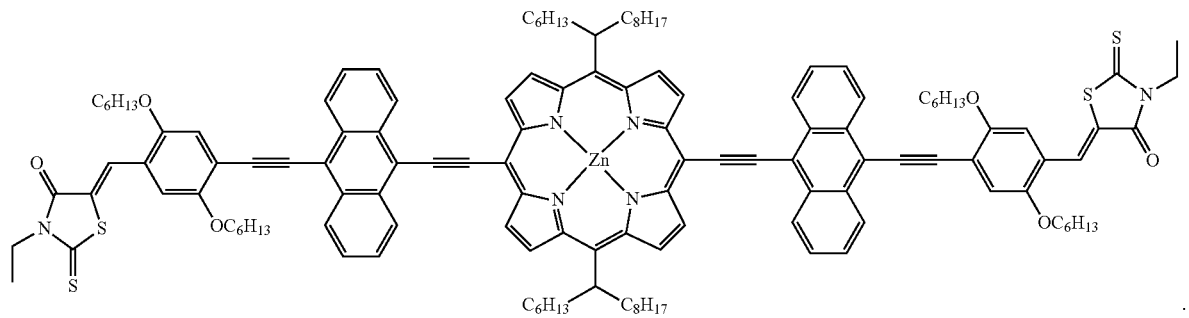

In another aspect of the present disclosure, provided is a method of preparing a porphyrin small molecule represented by Formula I, comprising the steps of: contacting a compound with molecular formula VII:

VII
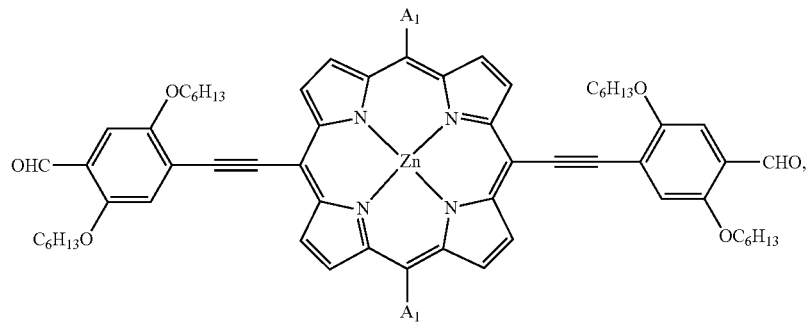

with 3-ethylrhodanine or a conjugate base thereof, and optionally a base thereby forming the porphyrin small molecule represented by Formula I, wherein $A_1$ is

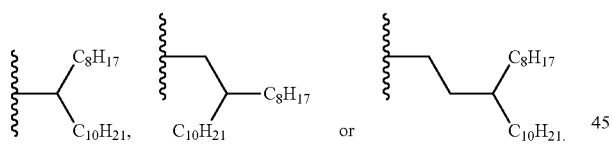

In another aspect of the present disclosure, provided is a method of preparing a porphyrin small molecule represented by Formula II or III, comprising the steps of: contacting a compound of formula VIII:

VIII
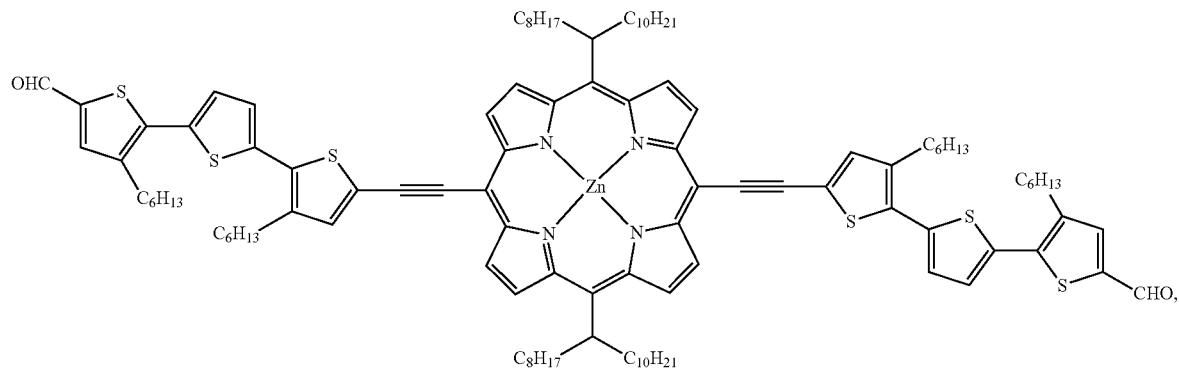

3-ethylrhodanine or 2-(1,1-dicyanomethylene),3-ethylrhodanine or a conjugate base thereof, and optionally a base thereby forming the porphyrin small molecule represented by Formula II or III.

In another aspect of the present disclosure, provided is a method of preparing the porphyrin small molecule represented by Formula IV or V, comprising the steps of: contacting a compound of formula IX or X:

3-ethylrhodanine or a conjugate base thereof, and optionally a base thereby forming the porphyrin small molecule represented by Formula VI.

In another aspect of the present disclosure, provided is the porphyrin small molecule of claim represented by Formula

IX

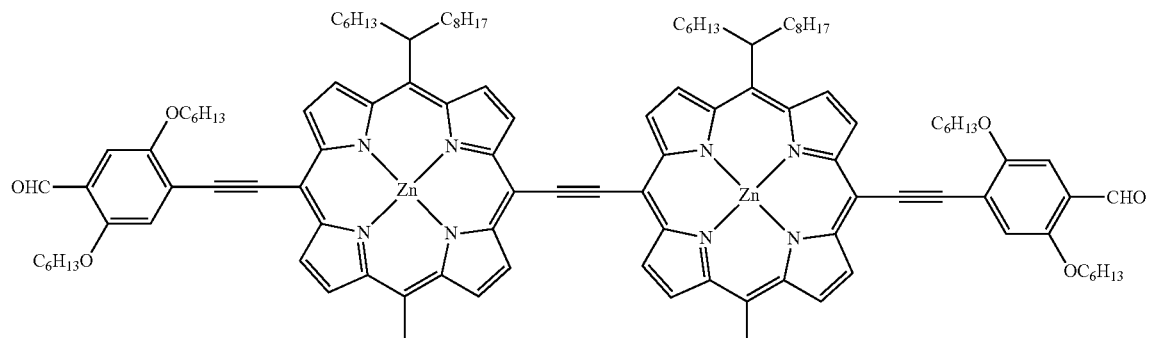

X

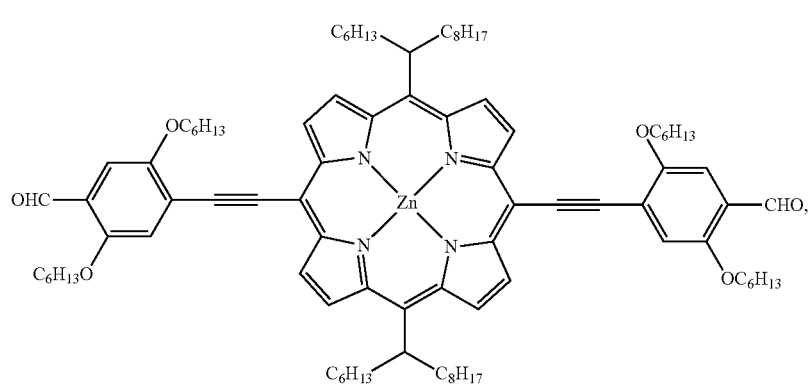

3-ethylrhodanine or a conjugate base thereof, and optionally a base thereby forming the porphyrin small molecule represented by Formula IV or V.

In another aspect of the present disclosure, provided is a method of preparing the porphyrin small molecule represented by Formula VI, comprising the steps of: contacting a compound of formula XI:

I for use in the construction of bulk heterojunction (BHJ) organic solar cells.

In another aspect of the present disclosure, provided is the porphyrin small molecule represented by Formula II for use in the construction of bulk heterojunction (BHJ) organic solar cells.

XI

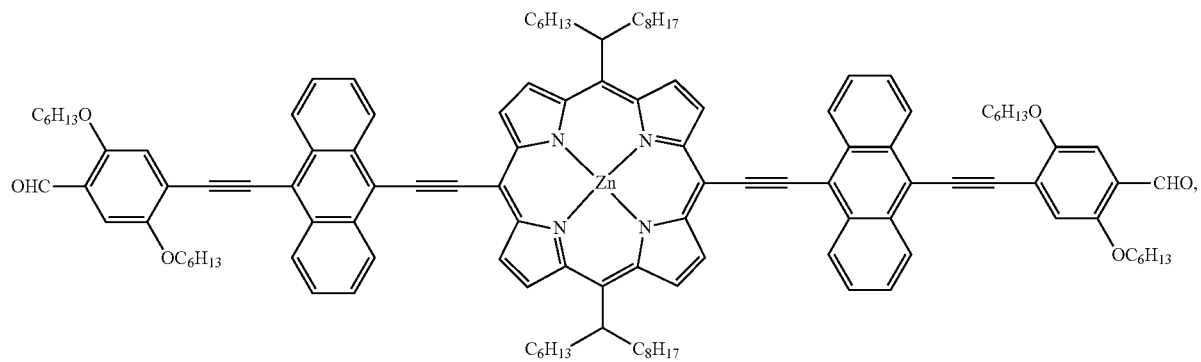

In another aspect of the present disclosure, provided is the porphyrin small molecule represented by Formula III for use in the construction of bulk heterojunction (BHJ) organic solar cells.

In another aspect of the present disclosure, provided is the porphyrin small molecule represented by Formula IV for use in the construction of bulk heterojunction (BHJ) organic solar cells.

In another aspect of the present disclosure, provided is the porphyrin small molecule represented by Formula V for use in the construction of bulk heterojunction (BHJ) organic solar cells.

Throughout this specification, unless the context requires otherwise, the word "include" or "comprise" or variations such as "includes" or "comprises" or "comprising", will be understood to imply the inclusion of a stated integer or group of integers but not the exclusion of any other integer or group of integers. It is also noted that in this disclosure and particularly in the claims and/or paragraphs, terms such as "included", "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the present invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

Other definitions for selected terms used herein may be found within the detailed description of the present invention and apply throughout. Unless otherwise defined, all other technical terms used herein have the same meaning as commonly understood to one of ordinary skill in the art to which the present invention belongs.

Other aspects and advantages of the present invention will be apparent to those skilled in the art from a review of the ensuing description.

BRIEF DESCRIPTION OF DRAWINGS

The above and other objects and features of the present disclosure will become apparent from the following description of the present disclosure, when taken in conjunction with the accompanying drawings, in which.

DETAILED DESCRIPTION OF THE INVENTION

Figure 1A:
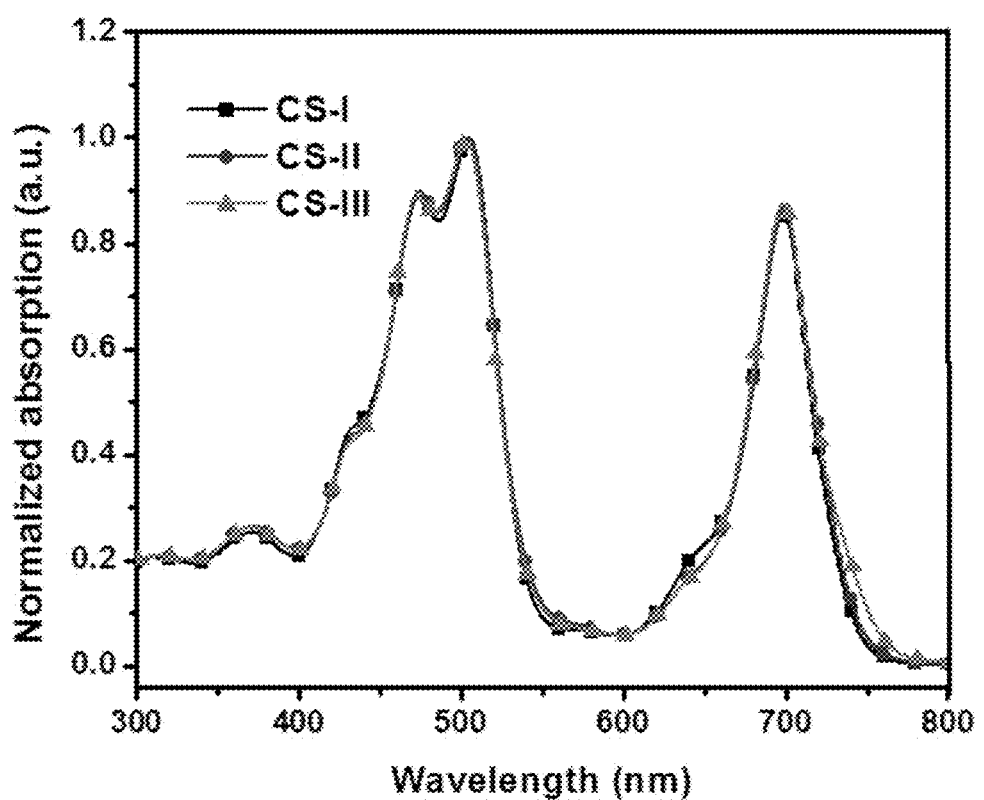
FIG. 1A shows absorption spectra of CS-I, CS-II and CS-III in $CHCl_3$ solution.

The present disclosure is further illustrated by the following experiments and embodiments. It should be understood that the subject matter disclosed in the experiments and embodiments are used for illustrative purpose are not intended to limit the scope of the present disclosure.

Solution-processed bulk heterojunction organic solar cells (BHJ OSCs) have been well studied and recognized as one of the most promising next-generation green technology alternatives to inorganic solar cells, because of their solution processability, low cost, light weight, and high flexibility.

In the last decade, there has been intense research on developing new organic semi-conducting materials, including polymers and small molecules for BHJ photovoltaic devices. Though great progress has been made for polymeric electron donor material, recent studies show that polymers are not the single approach to achieve a suitable interpenetrating network and thereby a high performance OPV device, since intrinsic batch to batch variation issue could hamper the performance reproducibility. In contrast, small molecules organic solar cell devices demonstrate many prominent advantages, as could be synthesized with certain structure, easily tuned absorptions and energy levels resulting from a dedicated chemical structure design, have defined molar weight, can be obtained in batch to batch variations. (A. Shah, P. Torres, et al., *Science*, 1999, 285, 692; G. Li, R. Zhu, Y. Yang, *Nat. Photonics*, 2012, 6, 153.)

In dye-sensitized solar cells, porphyrin-based push-pull photosensitizers have demonstrated their potential as large and rigid planar conjugated structures, which can enhance the π-electron delocalization and promote intermolecular π-π interaction, as well as charge transport in devices. (E. Dietel, et al., *Chem. Commun.*, 1998, 18, 1981; S. Mathew, et al., *Nat. Chem.*, 2014, 6, 242; A. Yella, et al., *Science*, 2011, 334, 629.) However, porphyrin-based polymers or small molecules (SM) have less contribution in BHJ OSC, and the main performance impediments are the unfavorable aggregation, short exciton diffusion length and the low charge mobility. (J. Hatano, et al., *J. Mater Chem.*, 2012, 22, 19258; L. L. Li, and E. W. G. Diau, *Chem. Soc. Rev.*, 2013, 42, 291; C. L. Mai, et al., *Chem. Commun.*, 2010, 46, 809.) Recently, the inventors employed A-π-D-π-A strategy to synthesize porphyrin organic photovoltaic materials demonstrating that porphyrins are promising OSCs. However, porphyrin-based light-harvesting donor materials still remained underexposed in bulk heterojunction OSC. And it is very challenging to achieve a balance between solubility and intermolecular interactions for porphyrin molecules, simultaneously targeting optimally positioned energy levels (to ensure a high $V_{OC}$) and increased solar flux coverage (to ensure a high $J_{SC}$) and charge carrier mobility (to ensure a high FF). Also the inventors believe that porphyrin-based small molecules should play more important roles in BHJ OSCs due to high molar absorption coefficients, easy chemical structure modification and unique photophysical properties, which motivate the inventors to design new molecules to better understand the structure-property-function relationships and improve the performance of OSCs.

Bulk heterojunction (BHJ) OSCs are based on a solution processed active layer blend composed of an organic electron donating and an electron accepting material. The BHJ OSCs working processes are described as follow. The first step is light absorption of blend film to form an exciton. Then, the singlet excitons diffuse to the BHJ interface to form interfacial charge transfer (CT) excited state species that then dissociate into free holes and electrons. The free charges then move to the respective electrodes, and photocurrent comes from the extraction of the charge carrier. The simplified working mechanism of an OPV device involves four distinct events: (i) optical absorption and formation of excitons, (ii) exciton diffusion to the donor-acceptor interface, (iii) exciton dissociation at the donor-acceptor interface, and (iv) charge collection at the electrodes. These four steps are significantly influenced by the morphology, structure, unique physical and chemical properties of the materials. (C. J. Brabec, et al., *Adv. Funct. Mater*, 2001, 11, 15; S. Günes, et al., *Chem. Rev.*, 2007, 107, 1324; Y.-J. Cheng, et al., *Chem. Rev.*, 2009, 109, 5868.)

The diffusion of excitons to the active interface thus plays a critical role in organic solar cells. In order to make a contribution to the photocurrent, the exciton diffusion length in a good organic solar cell must at least be in the order of magnitude of the typical penetration depth of light, in order that the predominant portion of the light can be utilized. Organic crystals or thin layers which are perfect in terms of structure and with regard to chemical purity do indeed satisfy this criterion. Solution-processed organic solar cells based on bulk heterojunction (BHJ) blends have drawn much attention in recent years as a promising alternative green energy complimentary to silicon technologies. Impressively, small-molecular (SM) active materials have been fast developed for the least batch-to-batch variation in physical and optoelectronic properties, and the reported power conversion efficiency (PCE) of single-junction small-area devices reach 10%. (Q. Zhang, et al., *Nat. Photonics*, 2014, 9, 35; B. Kan, et al., *J. Am. Chem. Soc.*, 2014, 136, 15529.) Among them, porphyrins as one unique family have also been successfully demonstrated as active materials because of their superior light-harvesting capability in the visible region and freely tunable photophysical and photochemical properties by facile structural modification. Though porphyrin-based donor materials have demonstrated their enormous potentiality in photovoltaic applications with outstanding performance, porphyrin based materials are disadvantaged by the lack of light-harvesting ability beyond 850 nm, thus limiting their cell performances. Since 50% of the total solar photon flux is located in the red and near-infrared (NIR) spectra (600~1000 nm), it's quite urgent to develop efficient NIR absorbing molecules for high performance organic solar cells.

The current status and limitations of research provided motivation to develop a new class of conjugated porphyrin to optimize light absorption and energy level, with the highlight of pushing light absorption into near infrared region, and developing highly efficient NIR organic solar cells (OSCs).

The performance of A-π-D-π-A type porphyrin-based small molecules strongly depends on the molecular structure. Because this is one of the important aspects to control the film morphology and crystallinity, thus enhancement of intermolecular charge transport and consequently higher fill factor. In addition, the materials should possess lower-lying HOMO energy level to get higher open-circuit voltage ($V_{OC}$), since $V_{OC}$ of bulk heterojunction PSCs is generally proportional to the gap between the HOMO of the donor and the LUMO of the acceptor. On the other hand, suitable and matching energy levels of donor and acceptor are essential for efficient excitons dissociation in the photoactive layers for higher $J_{SC}$. Therefore, broadening the absorption and effectively tuning the HOMO energy levels of the porphyrin-based small molecules are crucial for designing high-efficiency donor materials. Several strategies have been exploited to address this issue, such as replacement of different acceptor ($A_2$) units, expanding the length of π bridge and side chains engineering of the conjugated structures. One of the promising approaches to enhance orbital coupling is to use molecules that extended π-conjugated structure. Meanwhile, controlling the π-conjugated length of backbones also can tune optoelectronic properties, intermolecular interaction, and solubility. These properties are expected to fulfill the various requirements for device fabrication in solution-processed BHJ OSCs.

Devices based on porphyrin donors show efficient photocurrent response from 300-850 nm, indicating that there is yet plenty of space to further widen the light-harvesting region. To achieve better performance, an attempt on fusion of π-extended porphyrin can further improve the device performance with the following considerations: 1) extended π-electron conjugation systems with even stronger light-harvesting abilities both in the visible and the near-infrared region; 2) ample intermolecular interactions for efficient charge transfer, thus enhanced charge mobility; 3) well-defined and rigid molecular structures to ensure molecular ordered arrangement in solid state; 4) flexible side chains can ensure the high level of solubility and suppress molecular aggregation. Also, the physical properties of expanded porphyrin small molecules was investigated by various experimental methods, and superior light harvesting ability towards the near-infrared region exhibit a remarkable feature because it might be adopted into the system of ternary or tandem organic solar cells to improve the device performance.

Described herein, is the design and preparation of a series of porphyrin small molecules based on four different type structure architectures as below (Type 1, Type 2, Type 3 and Type 4), in which electron transport groups ($Ar_1$ and $Ar_2$) were conjugated meso-ethynyl porphyrin core, and then ended with electron-acceptor terminal units ($A_1$, $A_2$ and $A_3$), respectively. In certain embodiments, the electron transport groups ($Ar_1$ and $Ar_2$) are symmetrically conjugated to meso-ethynyl porphyrin core.

In certain embodiments, Type 1 porphyrin donors extend the backbone conjugation and enhance intermolecular π-π interaction by different electron transport groups ($Ar_1$), in which the metalloporphyrin core was linked, e.g., symmetrically, with $Ar_1$ via an acetylene bridge and ended with acceptor terminal units ($A_2$). The conjugation of π groups not only effectively increase the solar flux coverage between the conventional Soret and Q bands, but also enhanced the directional intermolecular π-π stacking in films together with two aliphatic substitutions instead of aromatic meso-substitutions on porphyrin core. The blended films with [6,6]-phenyl-$C_{71}$-butyric acid methyl ester ($PC_{61}BM$) or [6,6]-phenyl-$C_{71}$-butyric acid methyl ester ($PC_{71}BM$) are characteristic of bi-continuous, interpenetrating networks required for efficient charge separation and transportation. Therefore, developing new porphyrin materials for blend film is critical for widespread application of organic solar cells.

Although porphyrin derivatives are a favorable choice for producing high performance solar cells, limited empirical research to investigate the relationship of PCE and structure optimizations has been done. On the contrary, side chain engineering is usually done in the establishment of high-performance OSCs; especially in benzodithiophene (BDT) based polymers. In comparison to the introduction of new or different building blocks conjugated to the porphyrin to tune the energy levels and surface morphology, optimizing side-chains offers an ideal route to optimize materials. As the simple and effective method in tuning solubility, optical absorption, thermal stability, photostability and crystallinity, the various of side chains are being recognized as an important factor determine the exciton diffusion, charge separation, and charge transport properties, but there are less correlation studies focused on the porphyrin unit. Hence, we explored the different peripheral substitutions ($A_1$) substituted on porphyrin ring to finely tune its physical and chemical properties.

Type 2 porphyrin donors expand the π-conjugation based on the Type 1, in which the peripheral substitutions ($A_3$) connect to porphyrin ring via an acetylene bridge. It is also believed that the selection of appropriate peripheral substitutions could balance the solubility of small molecules in common organic solvent and the self-assemble property, as well as morphology of blend films. Type 3 porphyrin donors are tethered via ethynyl linker ($Ar_1$), and ended with electron deficient group ($A_2$) via the second ethynyl linker ($Ar_2$). Moreover, side chain substitutions ($A_1$) can be readily introduced to the orthogonal position in porphyrins to manipulate material solubility and solid-state packing. Additionally, Type 4 porphyrin donors are based on the coupling several porphyrin macrocycles (m=1, 2, 3, 4 . . . ) through an ethynyl linker, which is an effective way to extend the absorption of a porphyrin toward deep-absorption region. Besides, employing meso-meso linked porphyrin molecules can improve extinction coefficients regularly with the strong exciton coupling between two porphyrin moieties and decrease the π-π* gap concomitantly with the increased π-conjugation. (C.-L. Mai, et al., *Chem. Commun.*, 2010, 46, 809; H.-P. Wu, et al., *Energy Environ. Sci.*, 2012, 5, 9843. J.-W. Shiu, et al., *J. Mater Chem. A*, 2015, 3, 1417.)

Biologically important porphyrin derivatives in natural world are all metal porphyrins. Metal porphyrins have also received much attention in connection with their intrinsically interesting spectroscopic, magnetic, and electrochemical properties. So, substitution of the metal center (M) in porphyrin core was studied, which yielded very useful information about their electronic structure and optical spectra,

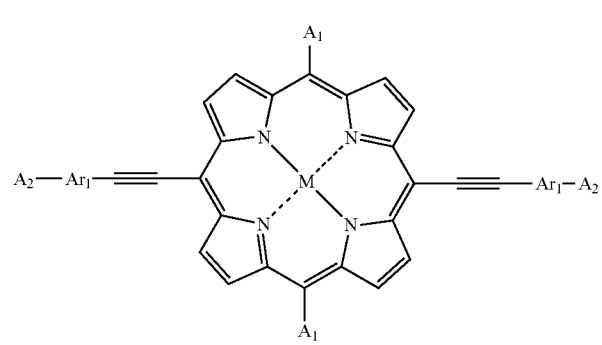

Type 1

-continued

Type 2

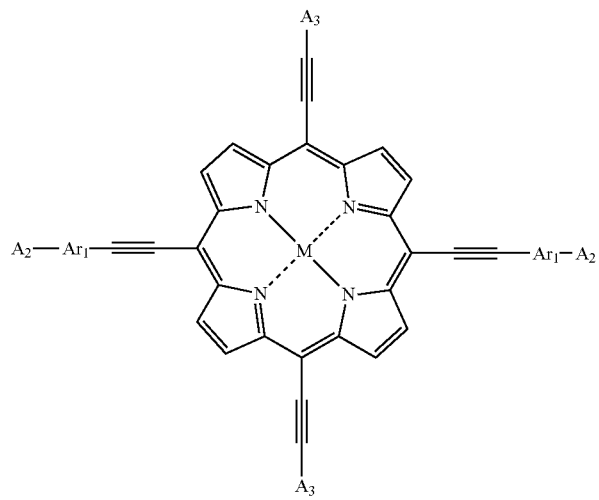

Type 3

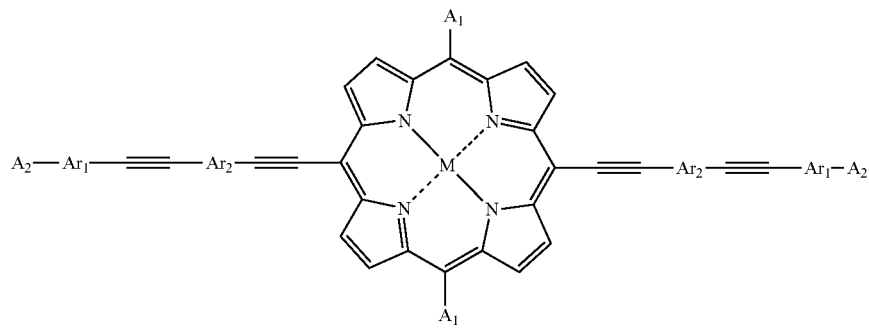

Type 4

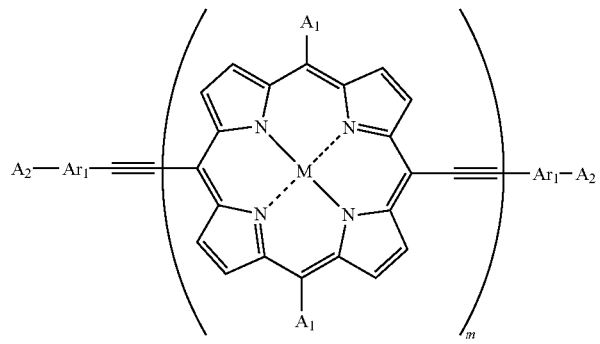

m = 1,2,3,4,5

M = $Fe^{2+}$, $Fe^{3+}$, $Co^{2+}$, $Co^{3+}$, $Ni^{2+}$
$Zn^{2+}$, $Cu^{2+}$, $Ru^{2+}$, $Pd^{2+}$, $Pt^{2+}$

Wherein:
m can be an integer number ranging from 0 to 5, e.g., from 1 or 2;

In certain embodiments, $Ar_1$ is an aromatic group or heteroaryl group. The term "heteroaryl groups" means aromatic heterocyclic groups, penta- or hexa-atomic, also benzocondensed or heterobicyclic, containing from 1 to 4 heteroatoms selected from nitrogen, oxygen, sulfur, silicon, selenium, phosphorus. Said heteroaryl groups can be optionally substituted with one or more groups, the same or different from each other, selected from: halogen atoms such as, for example, fluorine, bromine, chlorine, and fluorine; hydroxyl groups; $C_1$-$C_{12}$ alkyl groups; $C_1$-$C_{12}$ alkoxyl groups; cyano groups; amino groups; nitro groups. In the present invention, "substituents comprising thiophene moiety" is understood to denote in particular the substituents either comprising one thiophene ring or multiple thiophene rings with or without an anchoring group. The substituents comprising one thiophene ring may further comprise other ring(s) connected to the thiophene ring, e.g. 3,4-ethylenedioxythiophene (EDOT), and/or may be substituted by other groups, such as alkyl groups, alkoxy groups, aryl groups or aryloxy groups. The substituents comprising multiple thiophene rings include oligothiophenes in which the multiple thiophene rings are joined by single bond(s) (e.g. mono-, di-, tri-, and tetra-thiophene) or in which the multiple thiophene rings are fused (e.g. [n]thienoacenes, wherein, n is usually an integer from 2 to 7) or [n]thienohelicenes (wherein, n is usually an integer from 2 to 7), and oligothiophenes fused with other ring(s) than the thiophene rings. The oligothiophenes may further be substituted by other groups, such as optional halogenated alkyl groups, alkoxy groups, aryl groups or aryloxy groups. The substituents may be any combination of the same or different substituents. Non-limiting examples of the substituents comprising thiophene moiety include at least one structure selected from the following structures: 3,3'-dialkyl-2,2'-bithiophene, 3,3"-dialkyl-2,2':5',2"-terthiophene, 3,3'''-dialkyl-2,2':5',2":5",2'''-quaterthiophene, 3,4'-dialkyl-2,2'-bithiophene, 3,4',4"-trialkyl-2,2':5',2"-terthiophene, 3,4',4",4'''-tetraalkyl-2,2':5',2":5",2'''-quaterthiophene, thieno[3,2-b]thiophene, 3,6-dialkylthieno[3,2-b]thiophene, 2,5-bis(3-alkylthiophen-2-yl)thieno[3,2-b]-thiophene, 3,6-dialkyl-2,5-bis(3-alkylthiophen-2-yl)thieno[3,2-b]thiophene, 1,4-dialkylbenzene, 1,4-bis(5-alkylthiophen-2-yl)benzene, pyridine, methylpyridine, methoxypyridine, phenylpyridine, fluoropyridine, pyrimidine, pyridazine, pyrazine, triazine, tetrazine, quinoline, quinoxaline, quinazoline, furan, thiophene, pyrrole, oxazole, thiazole, isooxazole, isothiazole, oxadiazole, thiadiazole, pyrazole, imidazole, triazole, tetrazole, indole, benzofuran, benzothiophene, benzooxazole, benzothiazole, benzooxadiazole, benzothiadiazole, benzopyrazole, benzimidazole, benzotriazole, triazolepyridine, triazolepyrimidine, coumarin.

In certain embodiments, $A_{R1}$ is a moiety selected from the group below:

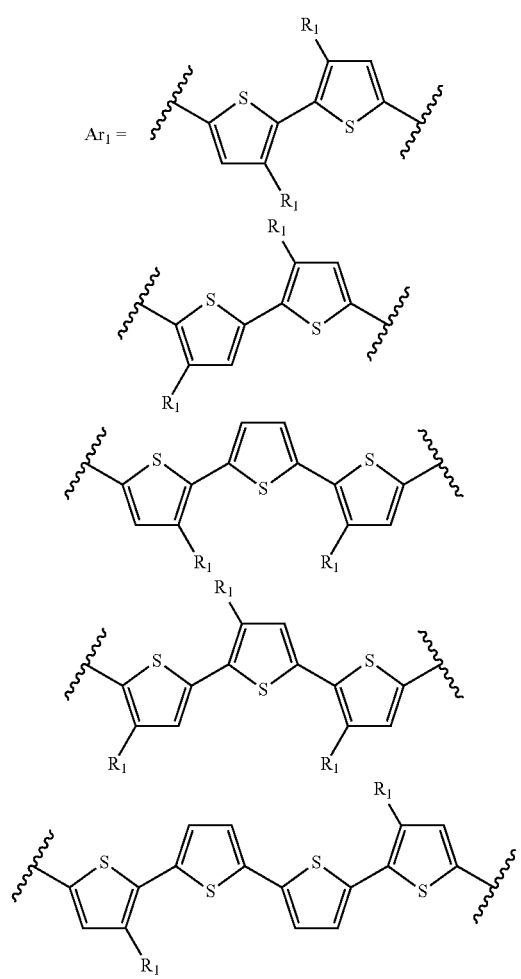

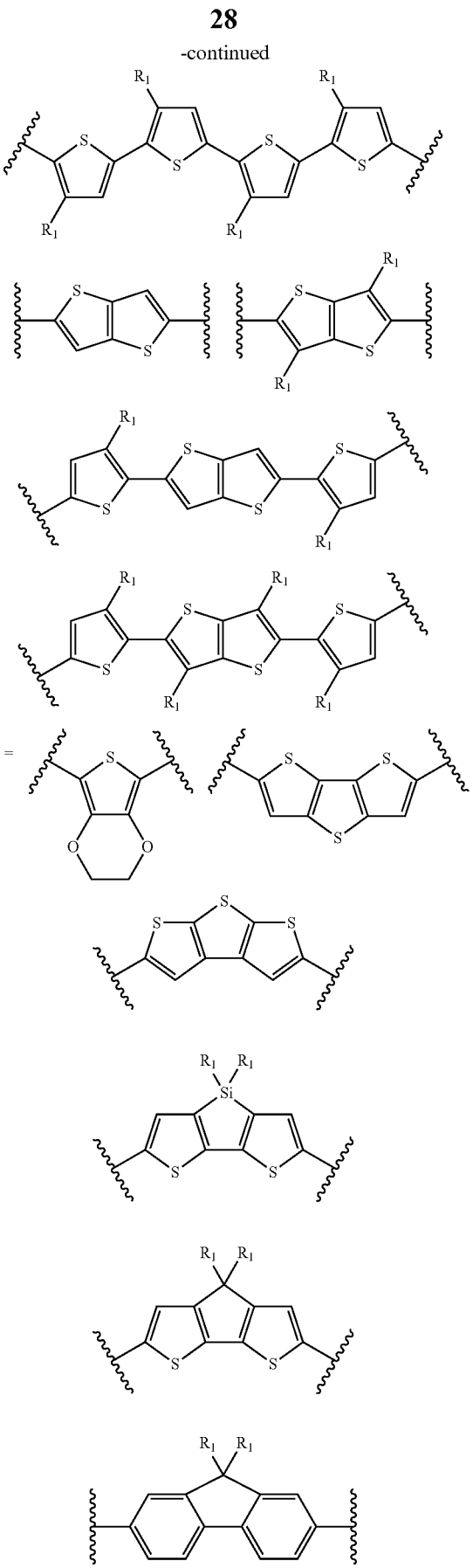

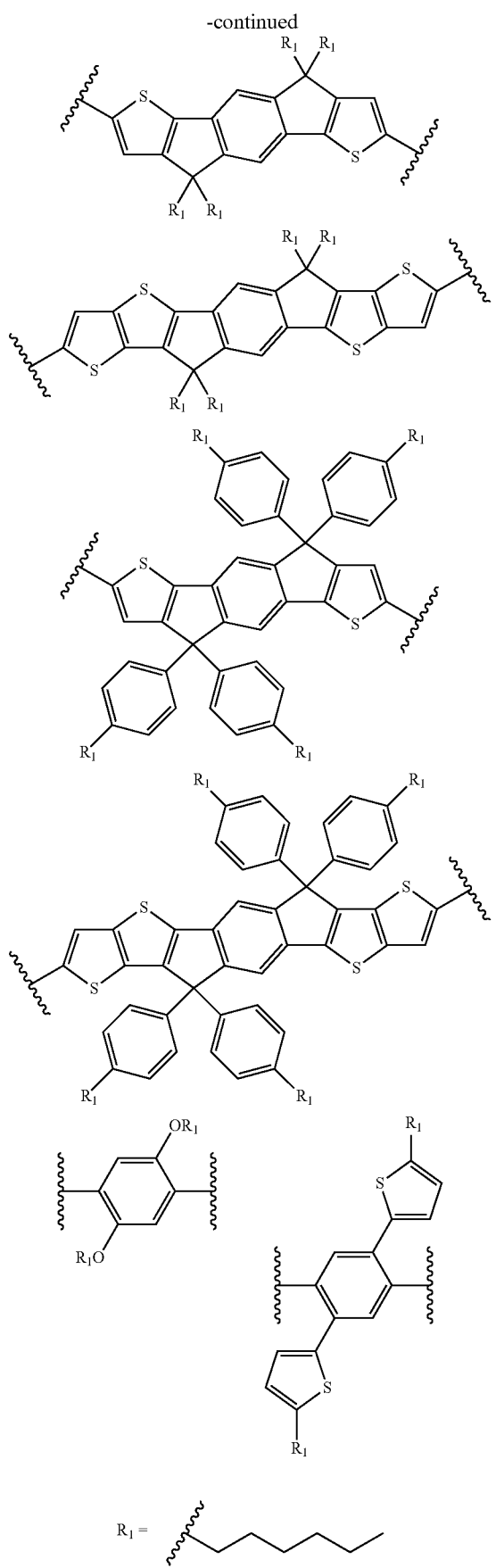

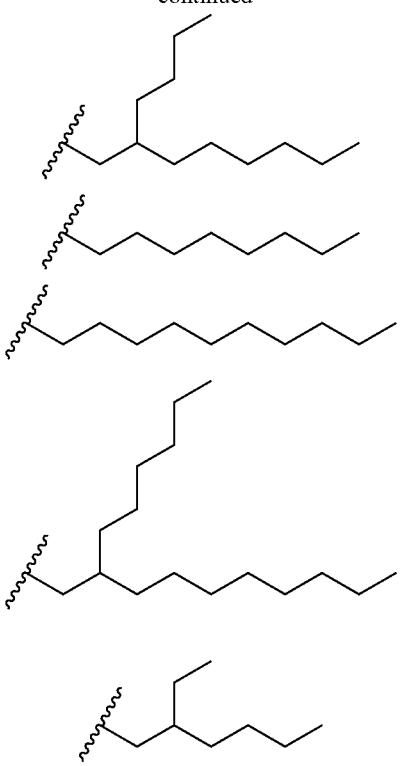

In certain embodiments, Ar$_2$ is an aromatic group or a heteroaryl group. The term "heteroaryl groups" means aromatic heterocyclic groups, penta- or hexa-atomic, also benzocondensed or heterobicyclic, containing from 1 to 4 heteroatoms selected from nitrogen, oxygen, sulfur, silicon, selenium, phosphorus. Said heteroaryl groups can be optionally substituted with one or more groups, the same or different from each other, selected from: halogen atoms such as, for example, fluorine, bromine, chlorine, and fluorine; hydroxyl groups; C$_1$-C$_{12}$ alkyl groups; C$_1$-C$_{12}$ alkoxyl groups; cyano groups; amino groups; nitro groups. In the present invention, "substituents comprising thiophene moiety" is understood to denote in particular the substituents either comprising one thiophene ring or multiple thiophene rings with or without an anchoring group. The substituents comprising one benzene ring may further comprise other ring(s) connected to the aromatic group, and/or may be substituted by other groups, such as alkyl groups, alkoxy groups, aryl groups or aryloxy groups. The aromatic groups may further be substituted by other groups, such as optional halogenated alkyl groups, alkoxy groups, aryl groups or aryloxy groups. The substituents may be any combination of the same or different substituents.

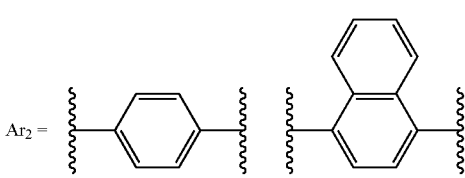

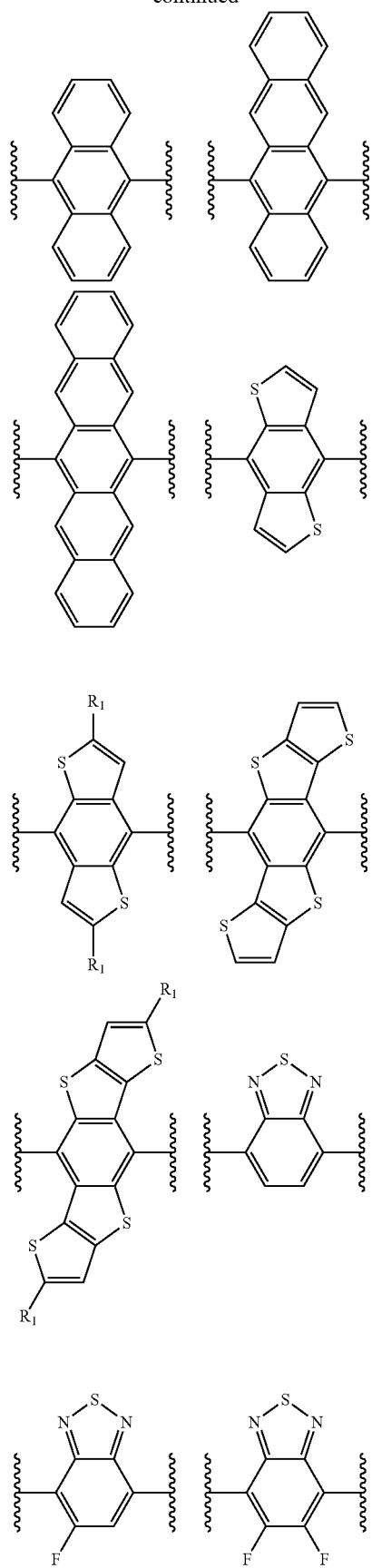
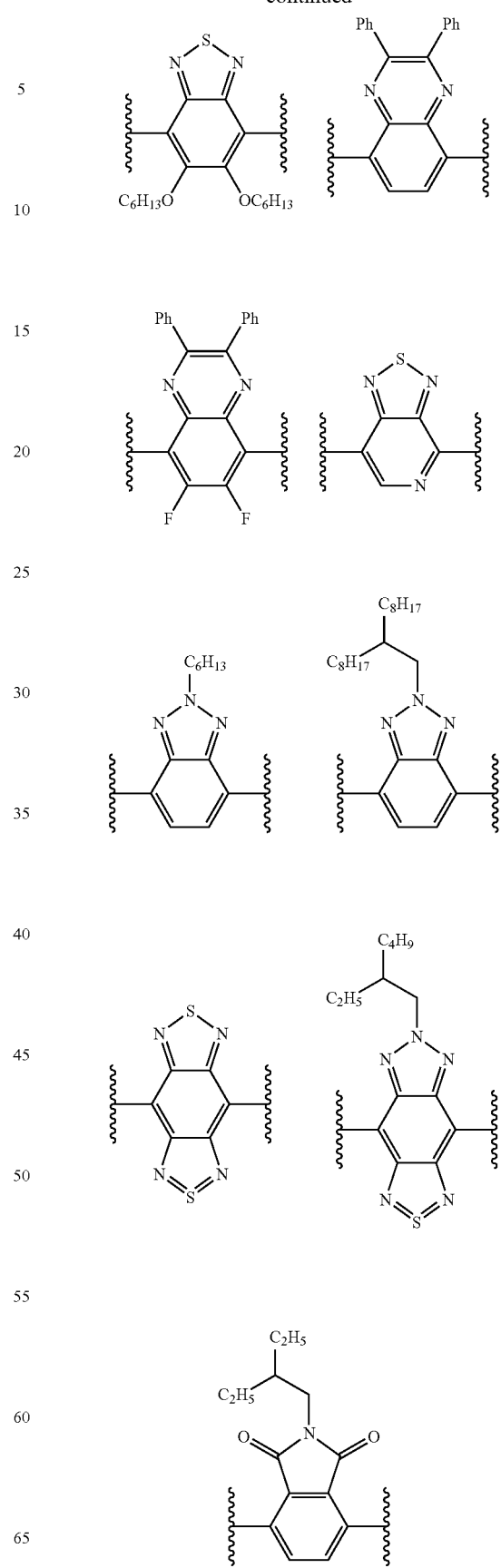

$R_1 =$ 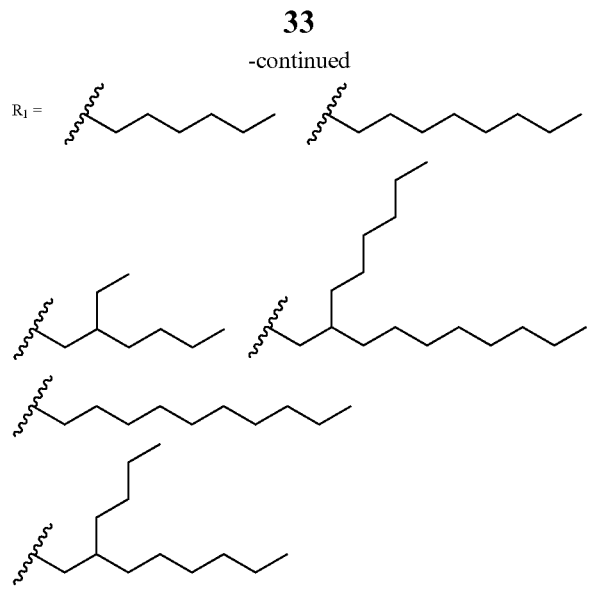

In certain embodiments, each instance of $A_1$ can be the same or different from each other, and represents a hydrogen atom, alkyl chain that formula —$CH_2R$, —$CH(R_1)(R_2)$, —$CH_2CH(R_1)(R_2)$, —$CH_2CH_2CH(R_1)(R_2)$, —$CH_2(OCH_2CH_2)_nCH_3$, —$CH_2(CH_2)_nCF_3$, —$CF_2(CF_2)_nCF_3$ and —$(CH_2)_n$, wherein $R_1$ and $R_2$ independently represent $C_1$-$C_{20}$, for example $C_2$-$C_8$, containing linear or branched, saturated or unsaturated, optionally containing heteroatoms, $C_4$-$C_{12}$, $C_5$-$C_8$, cycloalkyl groups, alkoxyl or aryloxyl groups, thioalkoxyl or thioaryloxyl groups, halogen atoms attached to the alkyl chain such as, for example, fluorine, chlorine, bromine, iodine, a fluorine, wherein n is an integer number ranging from 0 to 20, for example from 4 to 12.

In certain embodiments, $A_1$ has the chemical structures as depicted below:

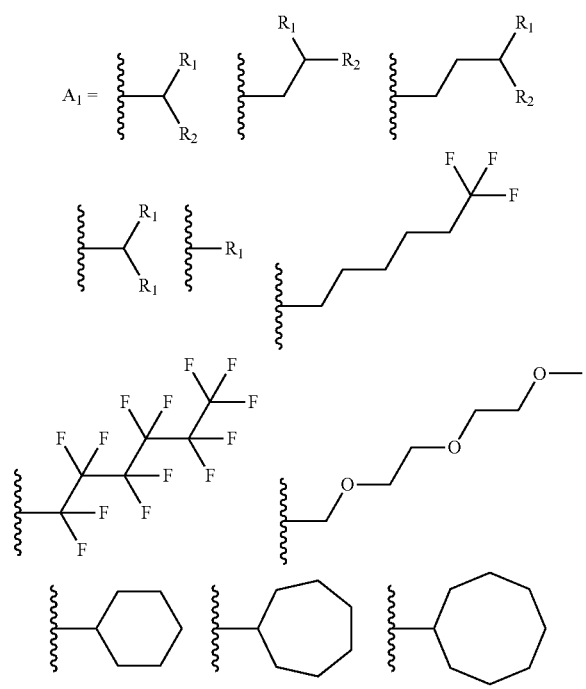

$R_1 =$ 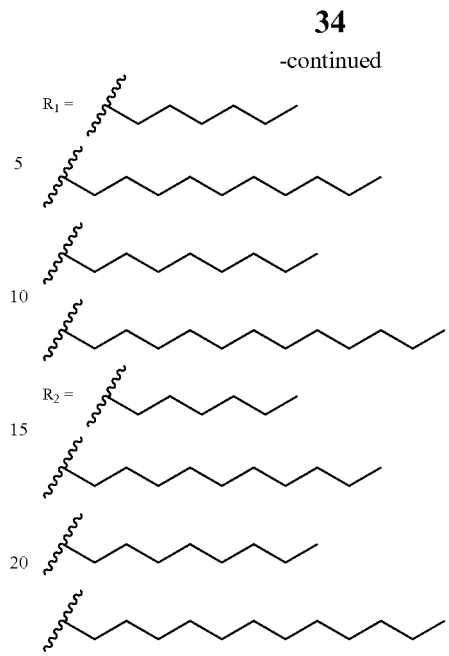

$R_2 =$ wherein $R_1$ and $R_2$ each independently represents $C_1$-$C_{20}$, for example $C_2$-$C_8$, containing linear or branched, saturated or unsaturated, optionally containing heteroatoms, $C_4$-$C_{12}$, for example $C_5$-$C_8$, cycloalkyl groups, alkoxyl or aryloxyl groups, thioalkoxyl or thioaryloxyl groups, halogen atoms attached to the alkyl chain such as, for example, fluorine, chlorine, bromine, iodine, and fluorine.

In certain embodiments, $A_2$ is selected from group consisting of halogen, cyano, alkyl, halogenated alkyl, alkoxy, halogenated alkoxy, aryl, halogenated aryl, aryloxy, halogenated aryloxy, heterocyclic alkyl, halogenated heterocyclic alkyl, heterocyclic alkoxy, halogenated heterocyclic alkoxy, heterocyclic aryl, halogenated heterocyclic aryl, heterocyclic aryloxy, halogenated heterocyclic aryloxy, amino, halogenated amino, and $NO_2$. Specific examples of heteroaryl groups suitable for $A_2$ include, but are not limited to, 3-ethyl-2-thioxothiazolidin-4-one, 2-(3-ethyl-4-oxothiazolidin-2-ylidene)-malononitrile, 1,3-diethyl-2 thioxodihydropyrimidine-4,6(1H,5H)-dione, octyl 2-cyanoacetate, octyl 2-cyanoacetate, malononitrile, 1H-indene-1,3(2H)-dione, 2-(3-oxo-2,3-dihydro-1H-inden-1-ylidene)malononitrile, 2,2'-(1H-indene-1,3(2H)-diylidene)dimalononitrile, [1,2'-biindenylidene]-1',3,3'(2H)-trione, (Z)-3'-ethyl-3-octyl-2'-thioxo-2'H,3H-[2,5'-bithiazolylidene]-4,4'(3'H,5H)-dione, 1,3-diethyl-pyrimidine-2,4,6(1H,3H,5H)-trione.

In certain embodiments, $A_2$ has the chemical structures as depicted below:

$A_2 =$ 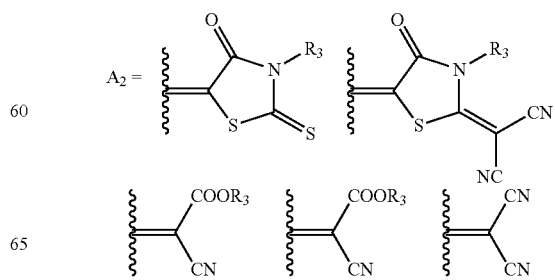

-continued

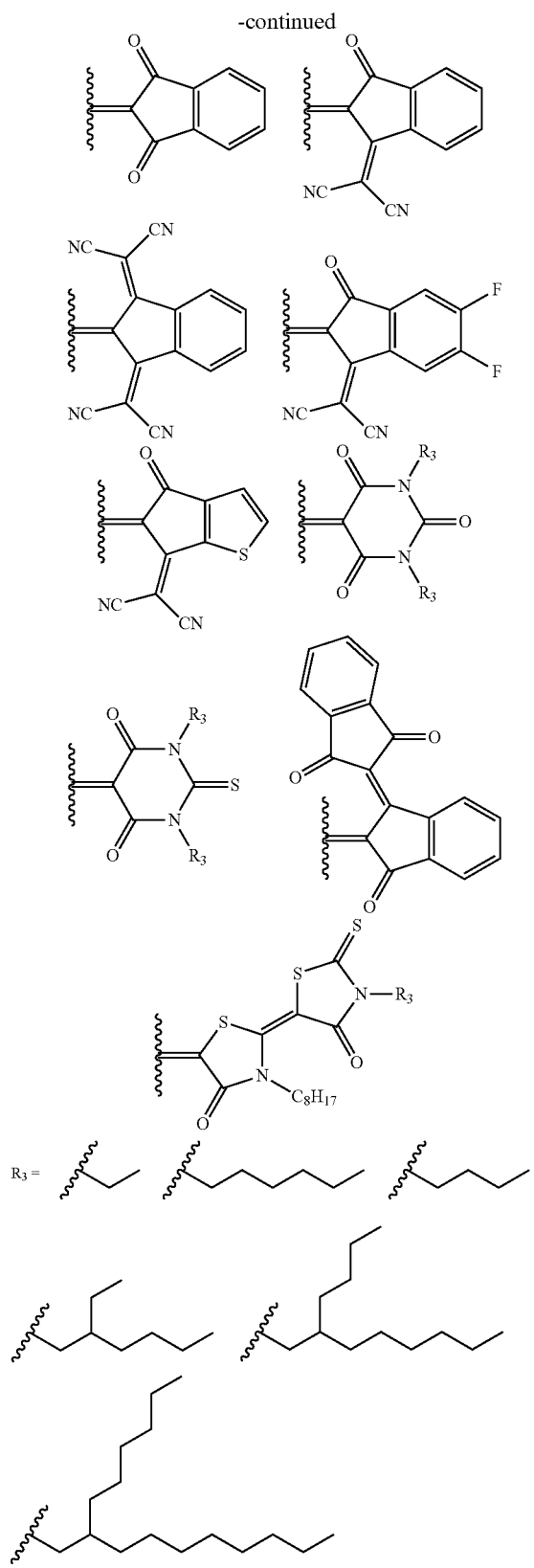

wherein $R_3$ represents $C_1$-$C_{20}$, for example $C_2$-$C_8$, containing linear or branched, saturated or unsaturated, optionally containing heteroatoms, $C_4$-$C_{12}$, for example $C_5$-$C_8$, cycloalkyl groups, alkoxyl or aryloxyl groups, thioalkoxyl or thioaryloxyl groups, halogen atoms attached to the alkyl chain such as, for example, fluorine, chlorine, bromine, iodine, and fluorine.

In certain embodiments, $A_3$ is a heterocycles group. In the present invention, "heterocycles" is understood to denote in particular a cyclic compound which has at least one heteroatom as a member of its one or more rings. Frequent heteroatoms within the ring include sulfur, oxygen and nitrogen. The heterocycles can be either saturated or unsaturated, and may be 3-membered, 4-membered, 5-membered, 6-membered or 7-membered ring. The heterocycles can be further fused with other one or more ring systems. The heterocycles can further be substituted by other groups, such as alkyl groups, alkoxy groups, aryl groups or aryloxy groups as defined above. In the present disclosure, those substituted heterocycles may alternatively be named as "heterocyclic alkyl groups" when alkyl groups is substituted, "heterocyclic alkoxy groups" when alkoxy groups is substituted, "heterocyclic aryl groups" when aryl groups is substituted, or "heterocyclic aryloxy groups" when aryloxy groups is substituted.

Examples of suitable heterocycles for $A_3$ include pyrrolidines, oxolanes, thiolanes, pyrroles, furans, thiophenes, piperidines, oxanes, thianes, pyridines, pyrans, and thiopyrans, and their derivatives. In certain embodiments, $A_3$ group comprising one or more thiophene moieties. In instances where $A_3$ contains a group comprising two or more thiophene moieties, the thiophene moieties can be covalently attached by a single bond or fused together at two carbons of the thiophene ring structure.

In certain embodiments, $A_3$ has the chemical structure as depicted below:

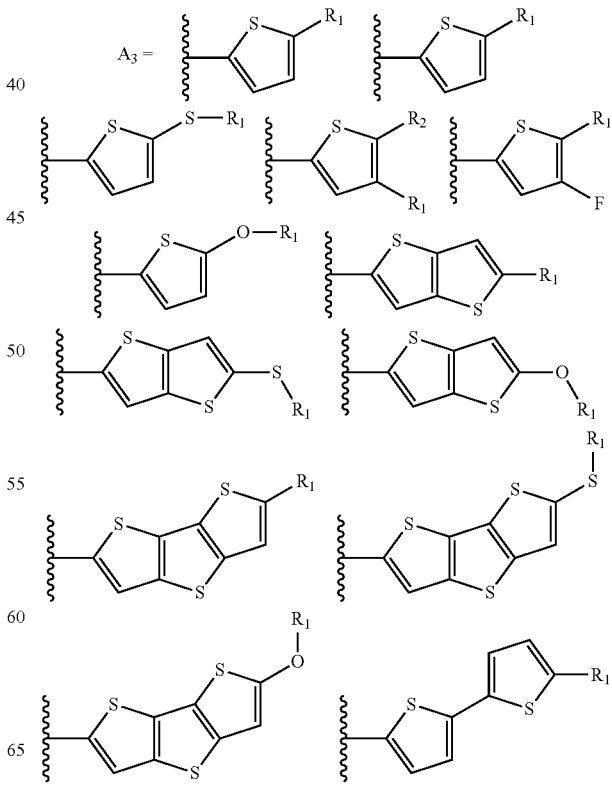

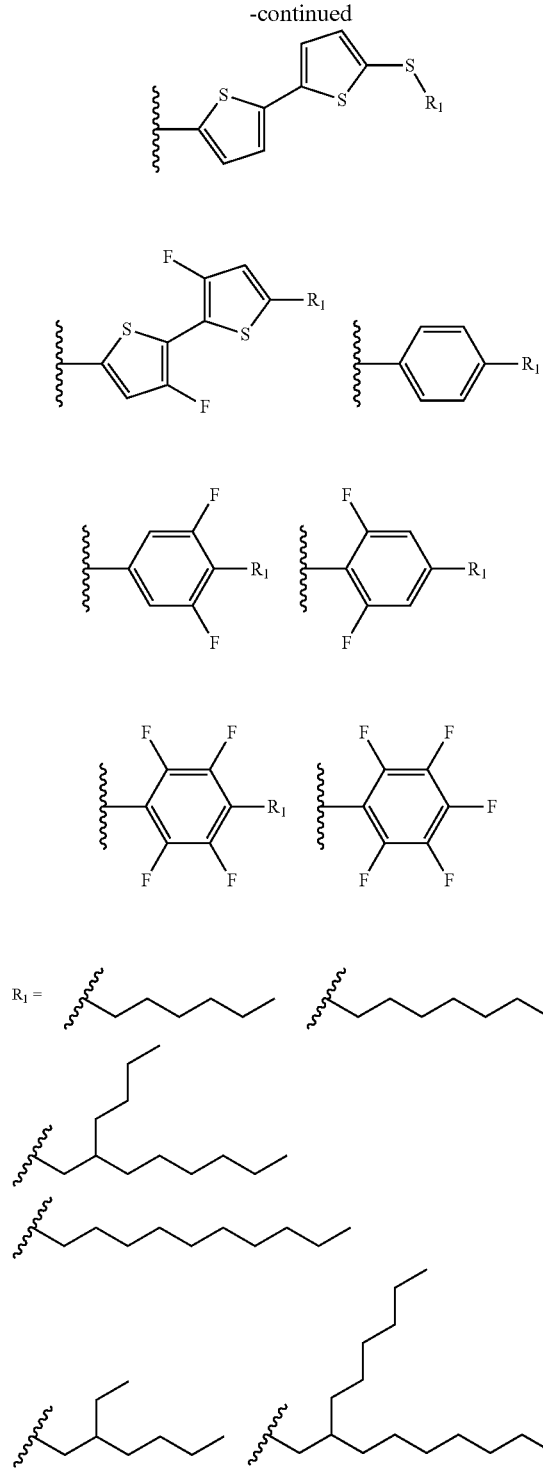

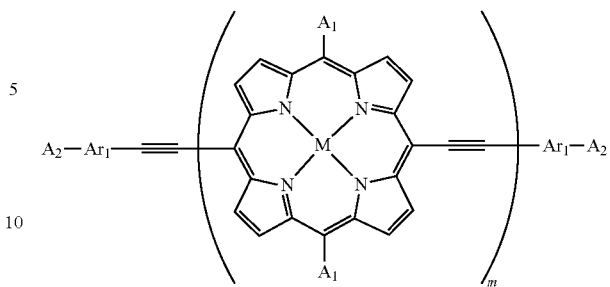

wherein, m is a whole number selected between 1 and 2;

M is metal selected from the group consisting of $Fe^{2+}$, $Fe^{3+}$, $Co^{2+}$, $Ni^{2+}$, $Zn^{2+}$, $Cu^{2+}$, $Ru^{2+}$, $Pd^{2+}$, and $Pt^{2+}$;

$A_1$ is hydrogen or $C_1$-$C_{30}$ alkyl;

$A_2$ is a moiety selected from the group consisting of:

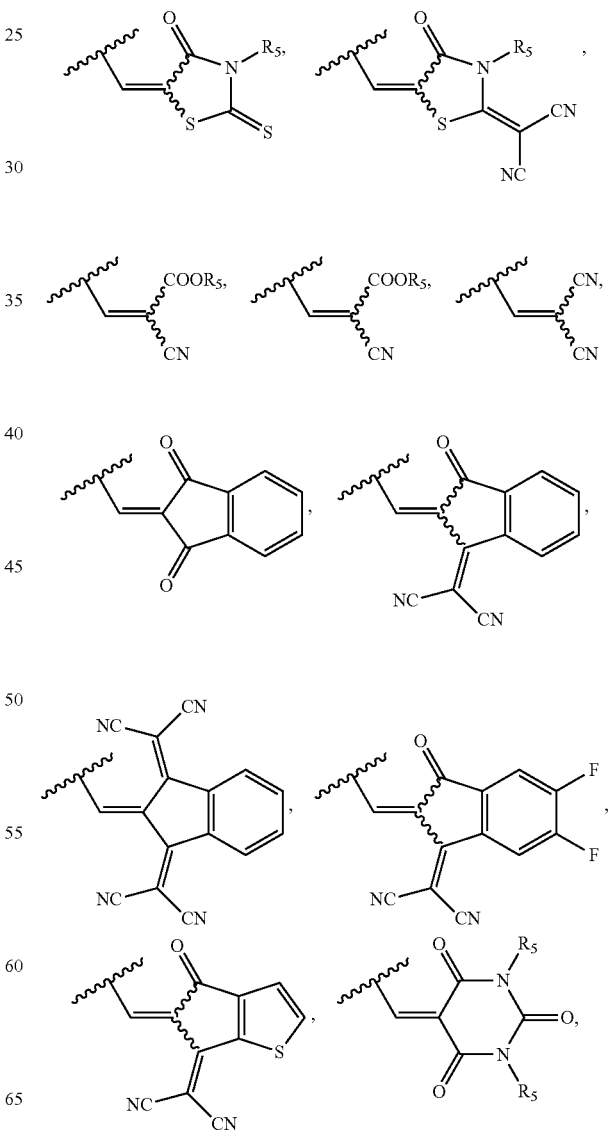

wherein $R_1$ and $R_2$ each independently represents $C_1$-$C_{20}$, for example $C_2$-$C_8$, containing linear or branched, saturated or unsaturated, optionally containing heteroatoms, $C_4$-$C_{12}$, for example $C_5$-$C_8$, cycloalkyl groups, alkoxyl or aryloxyl groups, thioalkoxyl or thioaryloxyl groups, halogen atoms attached to the alkyl chain such as, for example, fluorine, chlorine, bromine, iodine, and fluorine.

In certain embodiments, the porphyrin small molecule can represented by the compound below:

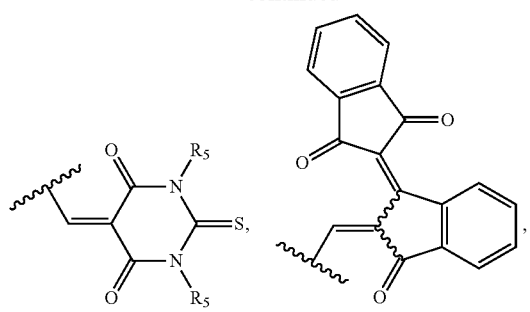
, and
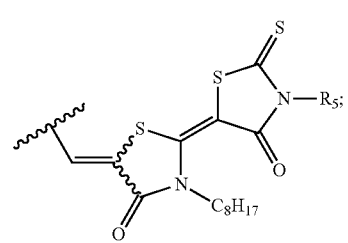
$Ar_1$ is moiety selected from the group consisting of:
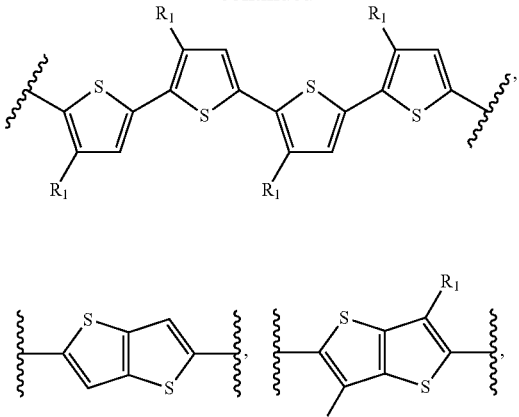
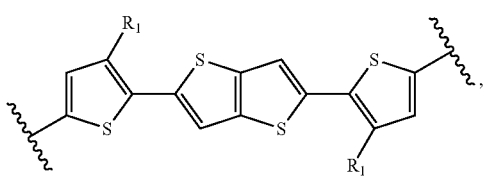
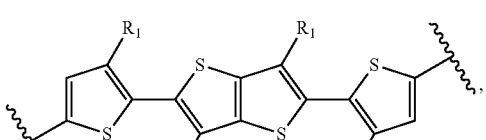
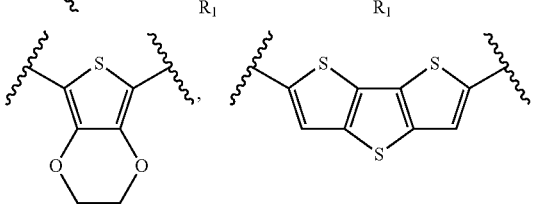
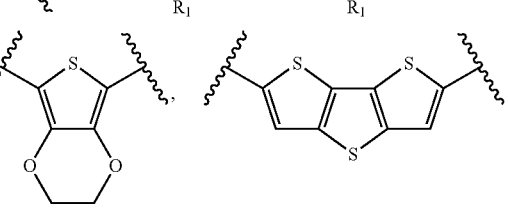
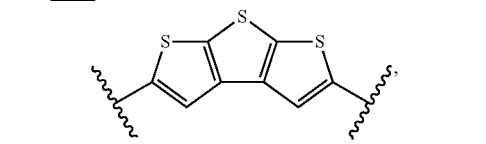
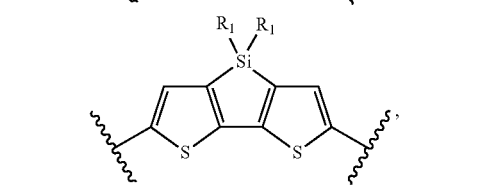
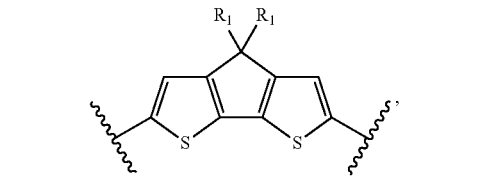
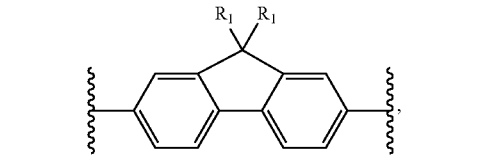

-continued
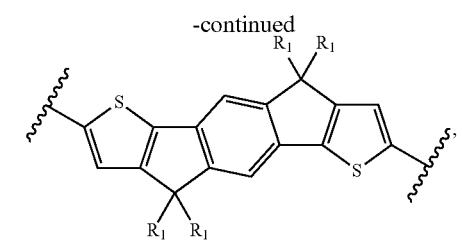
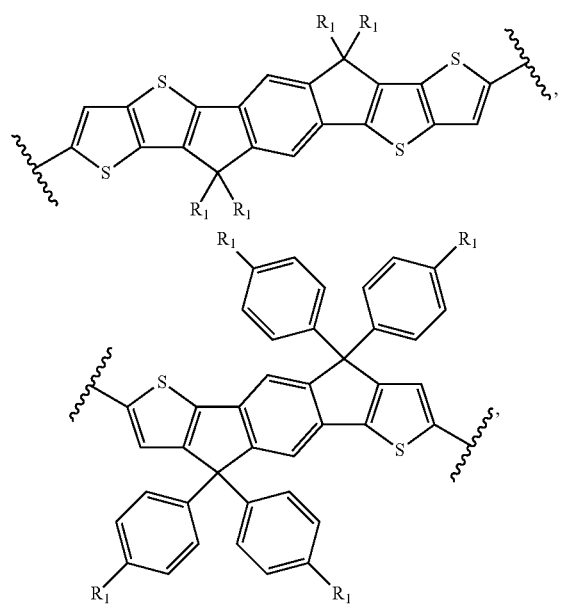
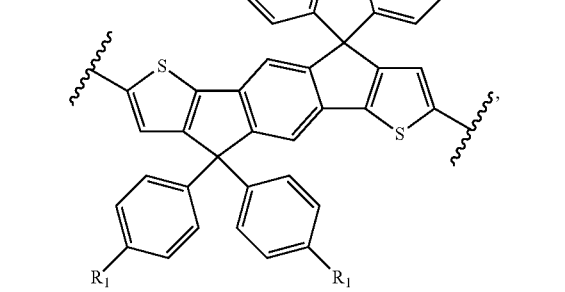
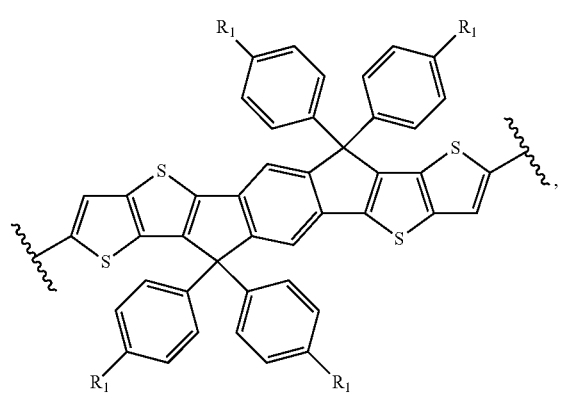
or Ar₁ is a moiety selected from the group consisting of:
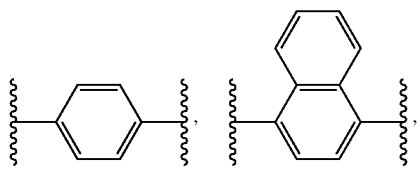
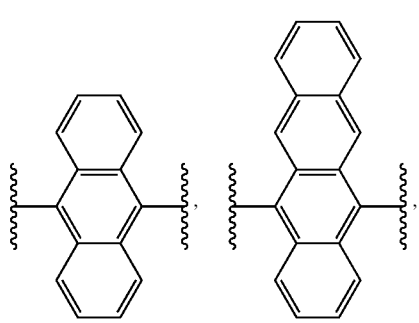
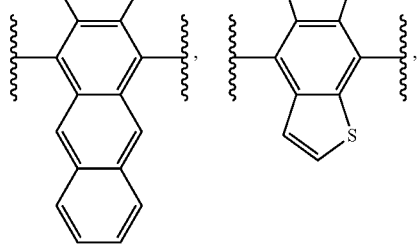
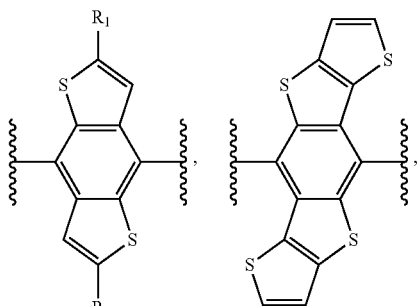

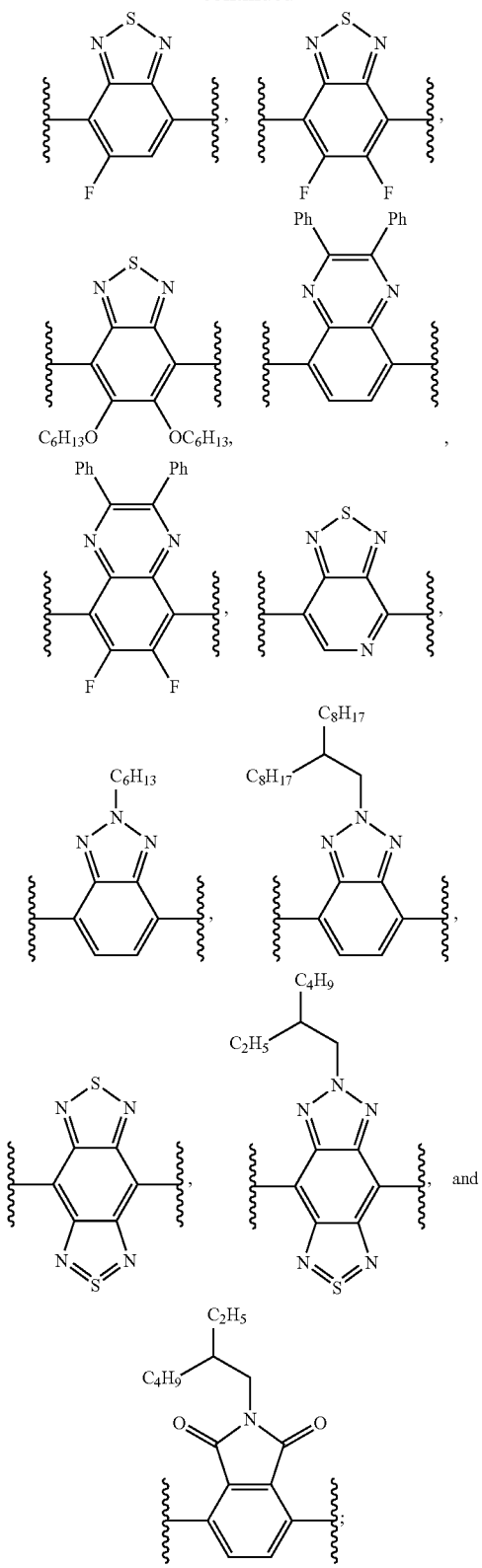

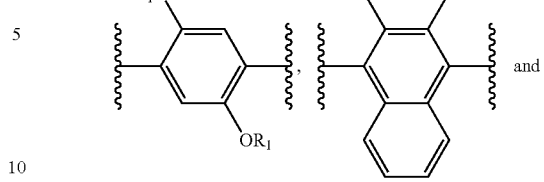

In certain embodiments, $A_2$ is a moiety selected from the group consisting of:

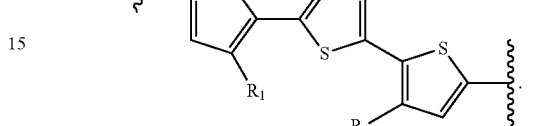

wherein $R_5$ is $C_1$-$C_6$ alkyl. In certain embodiments, $R_5$ is methyl, ethyl, n-propyl, i-propyl, cyclopropryl, n-butyl, iso-butyl, t-butyl, cyclobutyl, pentyl, cyclopentyl, hexyl, or cyclohexyl.

In certain embodiments, $A_1$ is $C_5$-$C_{30}$ alkyl; $C_5$-$C_{25}$ alkyl; $C_5$-$C_{20}$ alkyl; $C_5$-$C_{15}$ alkyl or $C_6$-$C_{16}$ alkyl.

In certain embodiments, independently for each occurrence $R_1$, $R_2$, and $R_5$, are selected $C_5$-$C_{30}$ alkyl; $C_5$-$C_{25}$ alkyl; $C_5$-$C_{20}$ alkyl; $C_5$-$C_{16}$ alkyl; $C_8$-$C_{16}$ alkyl; and $C_{10}$-$C_{16}$ alkyl.

In certain embodiments, $Ar_1$ is a moiety selected from the group consisting of:

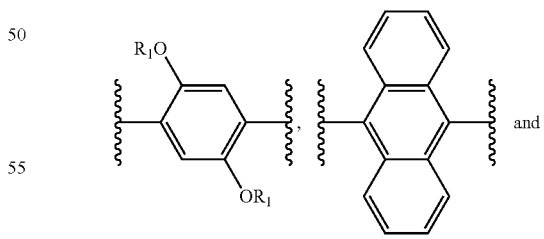

and independently for each occurrence $R_1$, $R_2$, and $R_5$, are selected from hydrogen and $C_1$-$C_{30}$ alkyl.

In certain embodiments, $Ar_1$ is a moiety selected from the group consisting of:

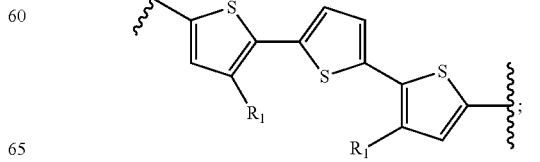

A₂ is a moiety selected from the group consisting of:

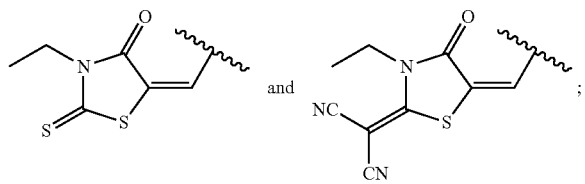 [SMILES: */C=C1/SC(=S)N(CC)C1=O ; */C=c1/sc(=C(C#N)C#N)n(CC)c1=O]

and ;

A₁ is $C_5$-$C_{30}$ alkyl; $C_5$-$C_{25}$ alkyl; $C_5$-$C_{20}$ alkyl; $C_5$-$C_{15}$ alkyl or $C_6$-$C_{16}$ alkyl; and independently for each occurrence $R_1$, $R_2$, and $R_5$, are selected $C_5$-$C_{30}$ alkyl; $C_5$-$C_{25}$ alkyl; $C_5$-$C_{20}$ alkyl; $C_5$-$C_{16}$ alkyl; $C_8$-$C_{16}$ alkyl; and $C_{10}$-$C_{16}$ alkyl.

In certain embodiments, provided herein is a solar cell, comprising a porphyrin small molecule represented by molecular formula I, II, III, IV, V, VI, or a combination thereof.

The synthesis of a number of new unsymmetrical push-pull A-D-A small molecules (e.g., CS-I, CS-II and CS-III in Scheme 1) consisting of meso-alkyl substituted porphyrins 5,15-bis(2-octylundecyl)-porphyrin, 5,15-bis(3-octyl-1-tridecyl)-porphyrin and 5,15-bis(4-octyl-1-tetradecyl)-porphyrin as electron rich donor (D) units, ethynylbenzene as π-linkage, and 3-ethylrhodanine (RH) as electron deficient acceptor (A) are described herein.

The effect of the branching point of the alkyl chains on the film morphology, charge mobility and photovoltaic performance was investigated.

As shown in Scheme 1, the precursors ZnPCHO were prepared in about 80% yield via Pd-catalyzed Sonogashira reactions between ZnBrP and 4-ethynyl-2,5-bis(hexyloxy)-benzaldehyde. Subsequently, the Knoevengel condensation of ZnPCHO with 3-ethylrhodanine afforded the target molecules CS-I, CS-II and CS-III. It was observed that these three π-conjugated small molecules have good solubility in most common organic solvent.

Scheme 1 Synthetic routes to CS-I, CS-II and CS-III.

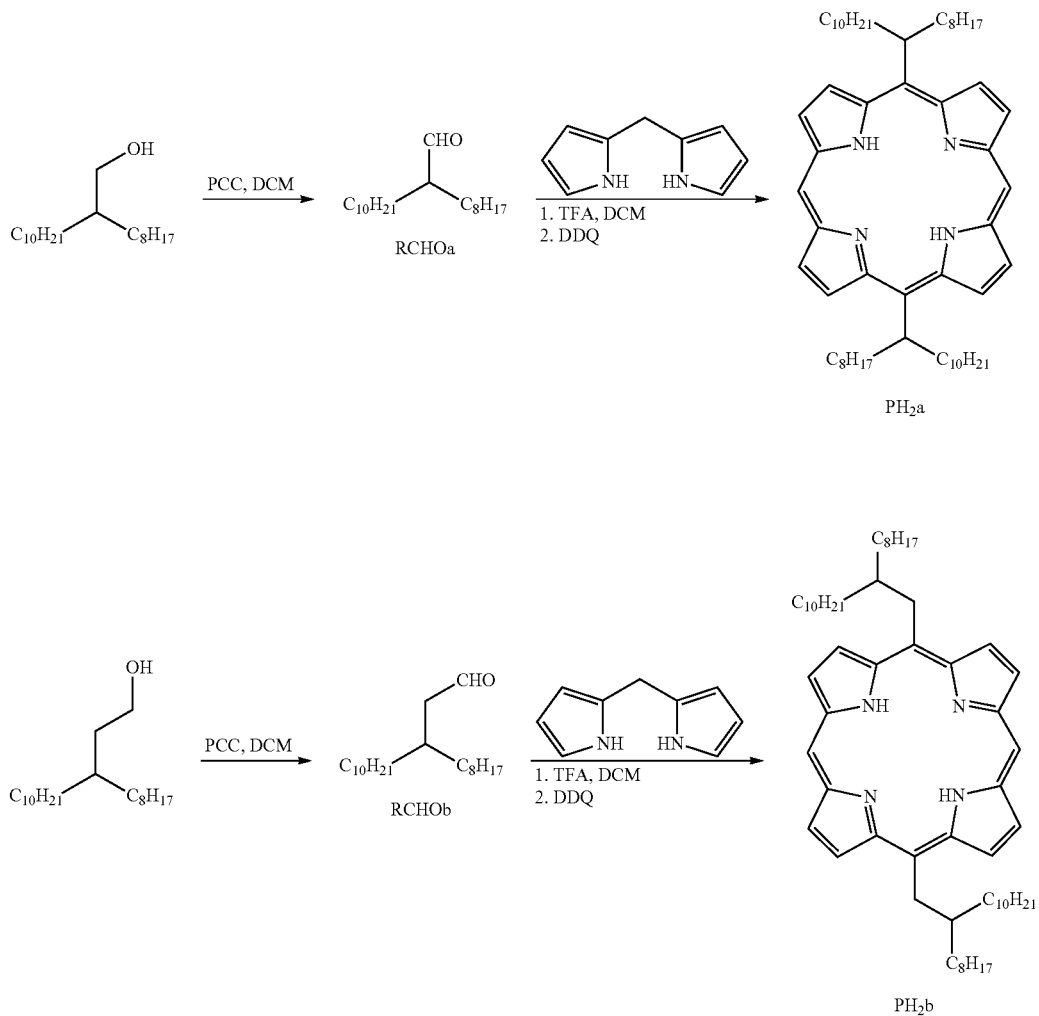

-continued
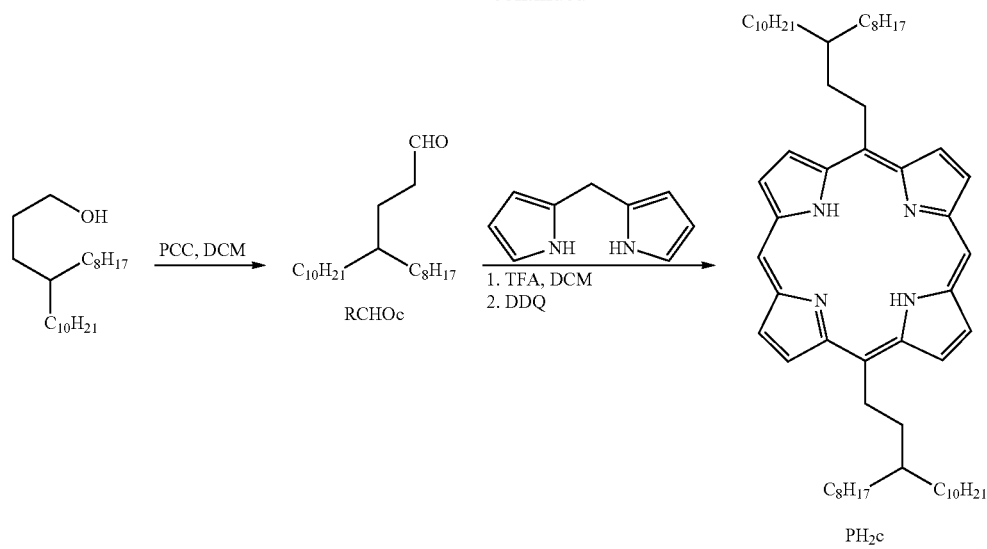
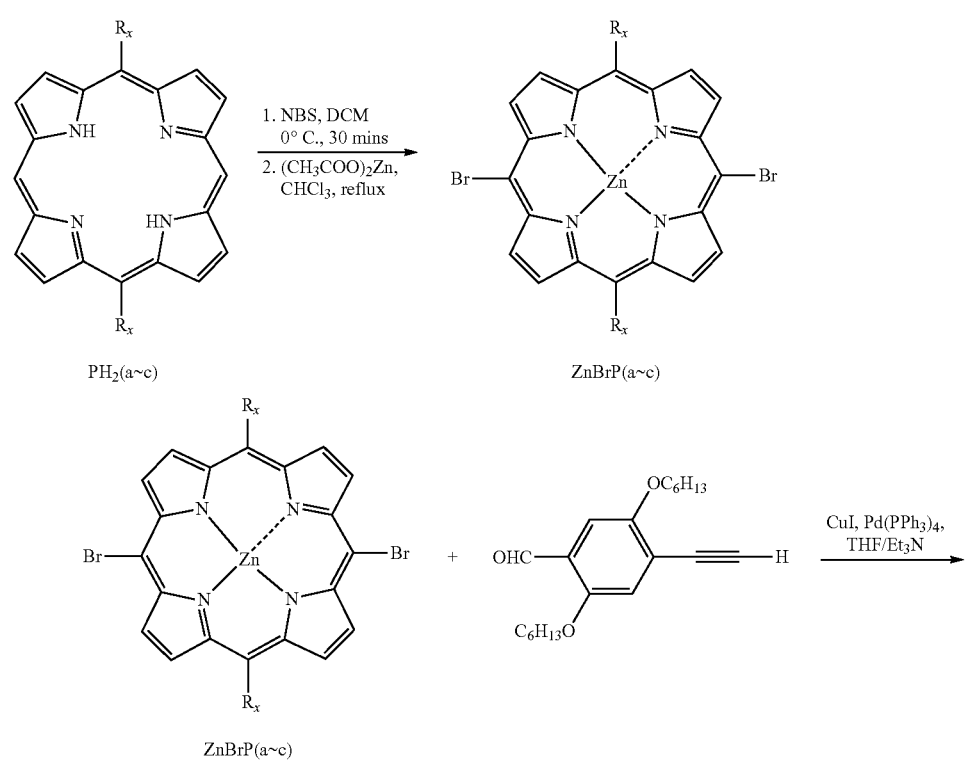
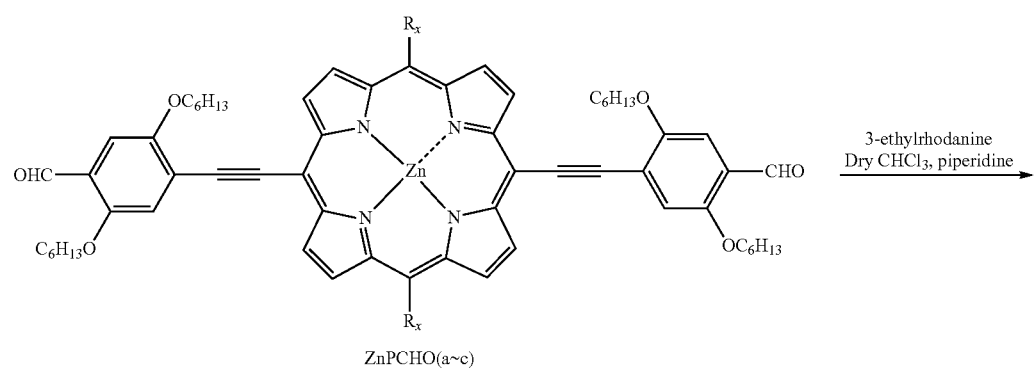

-continued

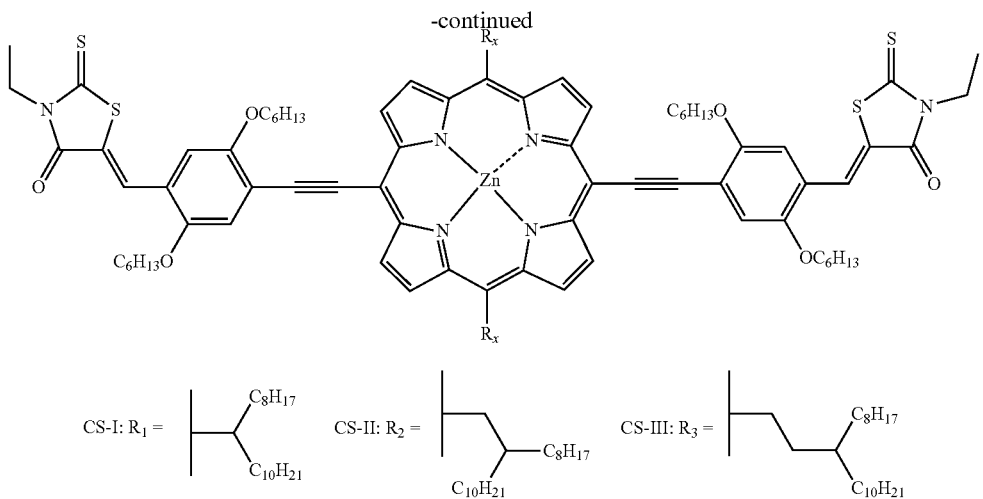

CS-I: R₁ = (branched with C₈H₁₇ and C₁₀H₂₁)   CS-II: R₂ = (branched with C₁₀H₂₁ and C₈H₁₇, C₈H₁₇)   CS-III: R₃ = (branched with C₈H₁₇ and C₁₀H₂₁)

General Procedure for Synthesis Alkyl Side-Chain Aldehyde [RCHO(a~c)]:

To the mixture of side-chain alkyl alcohol components (15 mmol) and dichloromethane (35 mL), PCC (4.52 g, 21 mmol) was added at room temperature. After stirring for another 4 hours, The mixture was filtered and the filtrate was distilled under reduced pressure gives the crude products, which was flash chromatographed on short silica column ($CH_2Cl_2$) affording the title compound as a colourless oil.

General Procedure for Synthesis 5,15-Dialkylated Porphyrin Derivatives [PH₂(a~c)]:

A solution of dipyrromethane (3 g, 21 mmol) and aldehyde derivatives (21 mmol) in $CH_2Cl_2$ (1.5 L) was degassed by bubbling with nitrogen for 30 min. Then trifluoroacetic acid (TFA, 145 µL, 2.0 mmol) was added. After the solution was stirred for overnight at room temperature under nitrogen, 2,3-dichloro-5,6-dicyanobenzoquinone (DDQ, 7.28 g, 32 mmol) was added, and the reaction mixture was stirred for a further 2 h. Triethylamine (5 mL) was added. The solvent was evaporated and the crude product was purified by silica chromatography using $CH_2Cl_2$/n-hexane (1:4) as the eluent, to give a purple product.

General Procedure for Synthesis Brominated 5,15-Dialkylated Metalloporphyrin Derivatives [ZnBrP(a~c)]:

Solution of PH₂(1.00 mmol), NBS (373 mg, 2.10 mmol) and pyridine (0.1 mL) in $CH_2Cl_2$ (200 mL) was stirred at 0° C. for 30 min. Acetone (5 mL) was added, and the solvent was removed in vacuo. The residue was purified via chromatography on silica gel using $CH_2Cl_2$/n-hexane (1:4) as the eluent. Then, BrPH₂ (1.00 mmol) and zinc acetate (1.095 g, 5 mmol) were refluxed in $CHCl_3$ (200 mL) for 4 h. The solvent was removed and the residue was purified via chromatography on silica gel using $CH_2Cl_2$/n-hexane (1:4) as the eluent, to give the product in quantitative yield.

General Procedure for Synthesis ZnPCHO(a~c):

A mixture of RPZnBr (0.150 mmol) and 4-ethynyl-2,5-bis(hexyloxy)benzaldehyde (115.7 mg, 0.350 mmol) in THF (15 mL) and Et₃N (5 ml) was degassed with nitrogen for 10 min, and then Pd(PPh₃)₄ (25 mg, 0.022 mmol), CuI (5 mg, 0.022 mmol) were added to the mixture, the solution was refluxed for 12 h under nitrogen. The solvent was removed under vacuum, and the solid residue was purified by preparative thin layer chromatography using a $CHCl_3$/hexane (3:1) as eluents. Recrystallization from $CHCl_3$/methanol gave ZnPCHO(a~c) as a green solid.

ZnPCHOa:

¹H NMR (400 MHz, $CDCl_3$) δ (ppm): 0.68-0.76 (m, 12H, $CH_3$), 0.89 (t, J=7.2 Hz, 6H), 0.98 (t, J=7.2 Hz, 6H), 1.05-1.45 (m, 64H, $CH_2$), 1.59 (m, 12H, $CH_2$), 1.78-1.86 (m, 4H, $CH_2$), 1.92-1.99 (m, 4H, $CH_2$), 2.34 (m, 4H, $CH_2$), 2.76 (m, 4H, $CH_2$), 2.95 (m, 4H, $CH_2$), 4.25 (m, 4H, $OCH_2$), 4.35 (m, 4H, $OCH_2$), 5.18 (m, 2H, CH), 7.44-7.51 (m, 4H, ArH), 9.64 (m, 2H, β-pyrrolic H), 9.73 (m, 2H, β-pyrrolic H), 9.86-9.94 (m, 4H, β-pyrrolic H), 10.50 (s, 2H, CHO).

ZnPCHOb:

¹H NMR (400 MHz, $CDCl_3$) δ (ppm): 0.72 (t, J=7.2 Hz, 6H), 0.78 (t, J=7.2 Hz, 6H), 0.92-1.18 (m, 68H), 1.32-1.58 (m, 22H, $CH_2$), 1.68 (m, 8H, $CH_2$), 1.86 (m, 4H, $CH_2$), 2.04 (m, 4H, $CH_2$), 2.37 (m, 4H, $CH_2$), 4.17 (d, J=6.8 Hz, 4H), 4.27 (t, J=6.4 Hz, 4H, $OCH_2$), 4.36 (t, J=6.4 Hz, 4H, $OCH_2$), 7.34 (s, 2H, ArH), 7.49 (s, 2H, ArH), 8.71 (d, J=4 Hz, 2H, β-pyrrolic H), 9.22 (d, J=4.4 Hz, 4H, β-pyrrolic H), 10.53 (s, 2H, CHO).

ZnPCHOc:

¹H NMR (400 MHz, $CDCl_3$) δ (ppm): 0.87-1.01 (m, 24H), 1.21-1.56 (m, 84H), 1.83 (m, 6H, $CH_2$), 1.96 (m, 4H, $CH_2$), 2.20-2.34 (m, 8H, $CH_2$), 4.23 (t, J=5.6 Hz, 4H, $OCH_2$), 4.32 (t, J=5.6 Hz, 4H, $OCH_2$), 4.44 (s, 4H, $CH_2$), 7.40 (s, 2H, ArH), 7.47 (s, 2H, ArH), 8.98 (d, J=4 Hz, 4H, β-pyrrolic H), 9.51 (d, J=4.4 Hz, 4H, β-pyrrolic H), 10.50 (s, 2H, CHO).

General Procedure for Synthesis CS-X (where X=I, II, III): Compound ZnPCHO(a~c)

(0.066 mmol) was dissolved in a solution of dry $CHCl_3$, two drops of piperdine and then 3-ethylrhodanine (106 mg, 0.66 mmol) were added, and the resulting solution was refluxed and stirred for 12 hours under argon. The reaction was quenched into water (30 mL). The aqueous layers were extracted with $CHCl_3$ (3×20 mL). The organic layer was dried over $NaSO_4$. After removal of solvent, it was purified by chromatography on a silica gel column using $CHCl_3$ as eluent and was purified by preparative thin layer chromatography using a $CHCl_3$ as eluents. Then the crude solid was recrystallized from $CHCl_3$ and methanol mixture to afford final product as a gray green solid.

CS-I:

¹H NMR (400 MHz, $CDCl_3$) δ (ppm): 0.72-0.79 (m, 12H, $CH_3$), 0.90-0.94 (m, 6H, $CH_2$), 0.96-1.38 (m, 62H, $CH_2$), 1.44-1.50 (m, 16H), 1.60-1.66 (m, 8H), 1.81-1.91 (m, 10H), 1.92-2.01 (m, 4H), 2.31-2.40 (m, 4H), 2.63-2.76 (m, 4H), 2.87-2.99 (m, 4H), 4.21-4.26 (m, 8H), 4.31-4.38 (m, 4H), 5.09-5.20 (m, 2H), 7.08 (s, 2H), 7.45 (s, 2H), 8.28 (s, 2H), 9.54 (d, J=5.2 Hz, 2H), 9.63 (d, J=5.2 Hz, 2H), 9.81 (m, 4H). (MALDI-TOF, m/z) calculated for $C_{110}H_{154}N_6O_6S_4Zn$: 1849.0115; found: 1849.0006.

CS-II:
$^1$H NMR (400 MHz, CDCl$_3$) δ (ppm): 0.82 (m, 12H), 0.96 (m, 20H), 1.11-1.28 (m, 48H), 1.33 (m, 6H), 1.49 (m, 20H), 1.63 (m, 8H), 1.81 (m, 4H), 1.96 (m, 4H), 2.28 (m, 4H), 2.38 (m, 4H), 4.17-4.24 (m, 12H), 4.68 (d, J=3.2 Hz, 2H), 6.87 (s, 2H), 7.23 (s, 2H), 7.31 (s, 2H), 8.19 (s, 2H), 9.22 (d, J=4.4 Hz, 4H), 9.66 (d, J=4.4 Hz, 4H). (MALDI-TOF, m/z) calculated for $C_{112}H_{158}N_6O_6S_4Zn$: 1877.0428; found: 1877.0422.

CS-III:
$^1$H NMR (400 MHz, CDCl$_3$) δ (ppm): 0.86 (m, 18H), 0.92 (m, 6H), 1.24-1.42 (m, 72H), 1.56-1.65 (m, 16H), 1.79 (m, 4H), 1.95 (m, 4H), 2.23 (m, 4H), 2.37 (m, 4H), 4.19 (m, 12H), 4.71 (m, 2H), 6.84 (s, 2H), 7.19 (s, 2H), 7.28 (s, 2H), 8.15 (s, 2H) 9.22 (d, J=4.4 Hz, 4H), 9.65 (d, J=4.4 Hz, 4H). (MALDI-TOF, m/z) calculated for $C_{114}H_{162}N_6O_6S_4Zn$: 1905.0743; found: 1905.0756.

Figure 1B:
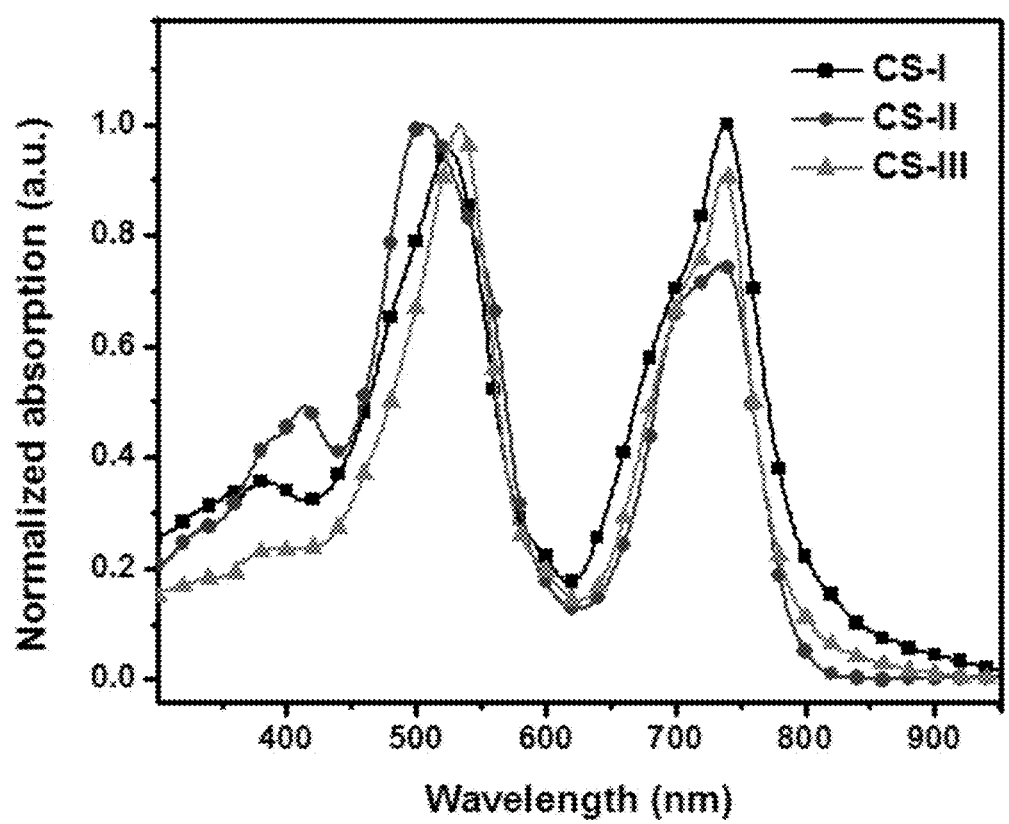
FIG. 1B shows absorption spectra of CS-I, CS-II and CS-III in film.

As shown in FIG. 1A, the UV-Vis absorption spectra of CS-I, CS-II and CS-III, measured in dilute chloroform (CHCl$_3$) solution exhibits identical peak maxima at around 474, 505 and 698 nm with similar molar extinction coefficients of $1.6 \times 10^{-5}$ cm$^{-1}$. As shown in FIG. 1B, it should be noted that a strong and broad absorption in the region of 600 to 760 nm was observed due the characteristics of A-D-A molecular structure. Comparing to their spectra in solution, their thin films prepared by spin-coating from chlorobenzene solutions red-shift to 740 nm for Q bands. Obviously, the strong intermolecular π-π stacking of the molecules leads to a broader absorption from visible to near-infrared (NIR) regions. Such an ordered packing of small molecules is in favor of achieving efficient charge mobility as discussed below. Besides, CS-I in solid film shows a broader absorption band that presumably comes from stronger intermolecular interactions.

Figure 2A:
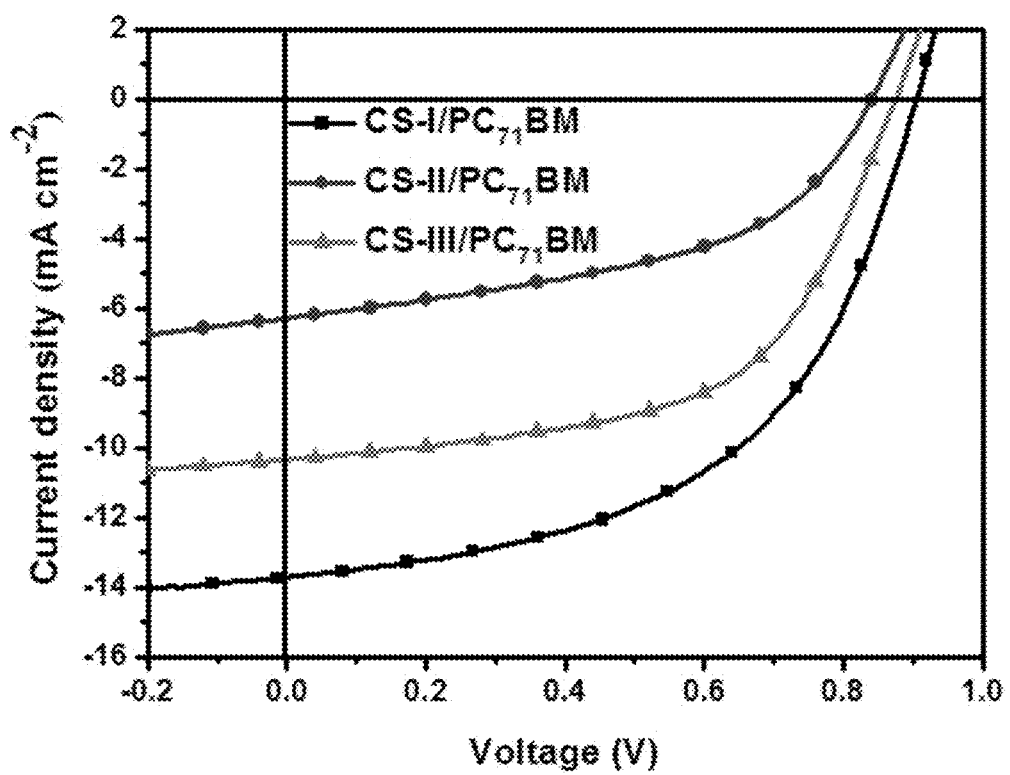
FIG. 2A shows J-V curves of the BHJ OSCs based on donor/$PC_{71}BM$; wherein the donor can be CS-I; CS-II CS-III (1:1) under the illumination of AM 1.5G at 100 mW $cm^{-2}$.
Figure 2B:
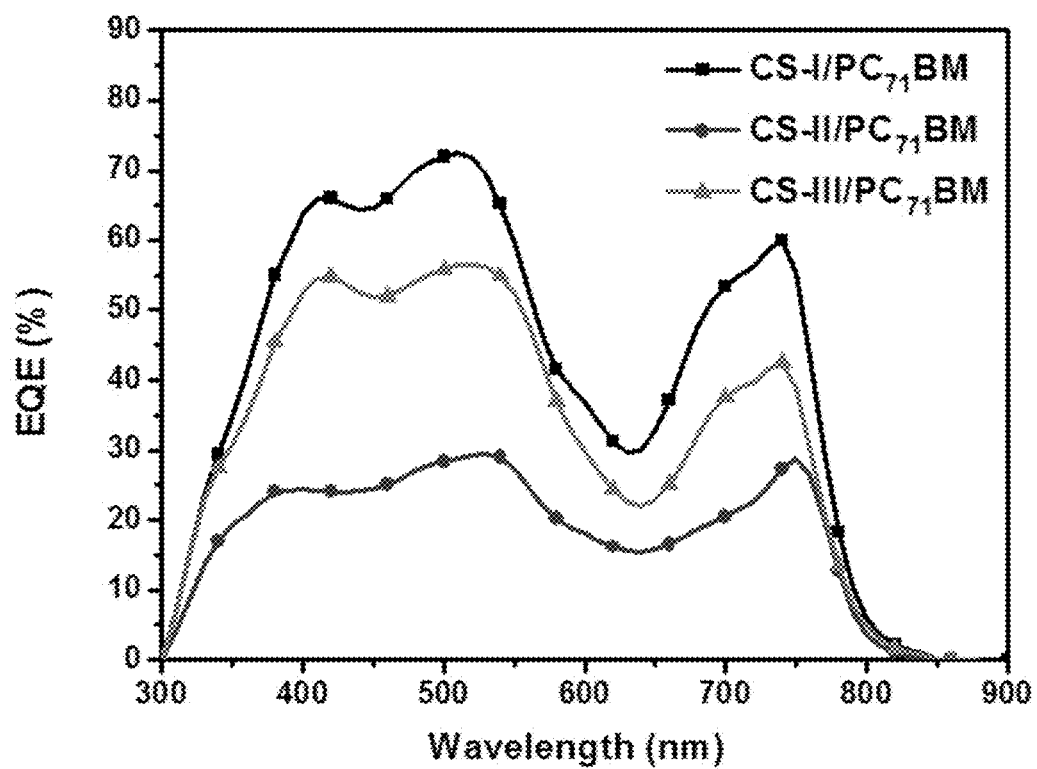
FIG. 2B shows EQE curve of the devices based on donor/$PC_{71}BM$ (1:1); wherein donor can be CS-I; CS-II; CS-III).
Figure 3:
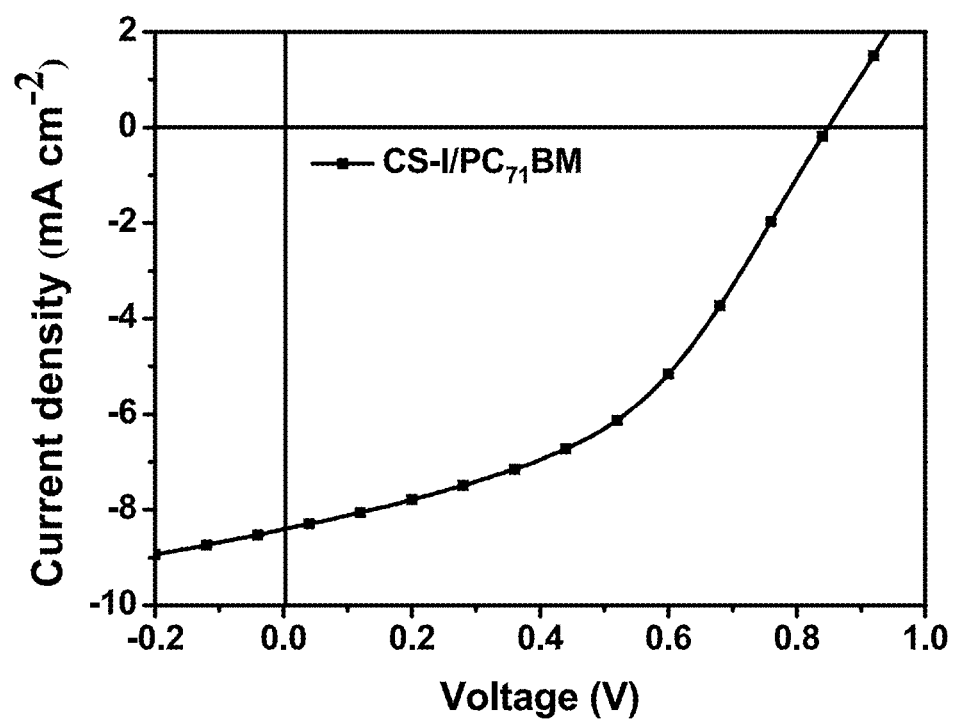
FIG. 3 J-V curves of the OSCs based on CS-I/$PC_{71}BM$ (without additive) under the illumination of AM 1.5G at 100 mW $cm^{-2}$.
Figure 4:
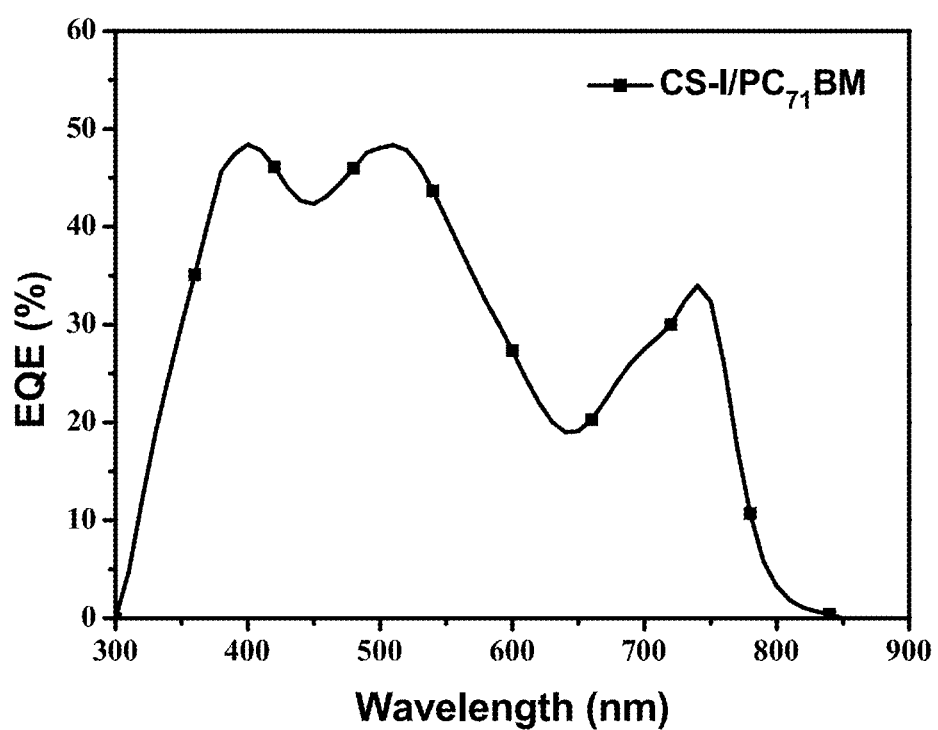
FIG. 4 EQE curve of the devices based on CS-I/$PC_{71}BM$ (1:1) (without additive).

The solution-processed BHJ OSCs were fabricated utilizing PC$_{71}$BM as the electron acceptor and three small molecules as the electron donors under a conventional device structure of ITO/PEDOT:PSS/donor:PC$_{71}$BM/poly[(9,9-bis(3'-(N,N-dimethylamino)-propyl)-2,7-fluorene)]-alt-2,7-(9,9-dioctylfluorene PFN)/Al, and then measured under AM 1.5 illumination. The ratio of small molecule donor and PC$_{71}$BM was optimized to be 1:1 (w/w) and those blend films were processed with or without pyridine additive from chlorobenzene. The current density-voltage (J-V) characteristics and external quantum efficiency (EQE) are shown in FIGS. 2A-2B, FIGS. 4 and 5A-5B, and the key device parameters are included in Table 1. A PCE of 3.19% with $V_{OC}$=0.85 V, $J_{SC}$=8.41 mA cm$^{-2}$ and FF=44.79% was achieved for CS-I without pyridine additive (FIG. 3). With 3% pyridine as additive for the blend film, the device shows a much improved photovoltaic performance with $V_{OC}$=0.90 V, $J_{SC}$=13.72 mA cm$^{-2}$ and FF=52.12%, corresponding to a PCE of 6.49% (FIG. 2A). The highly enhanced $J_{SC}$ originates from the change of molecular assembly of the zinc porphyrin in the specific solvent additive. As shown in FIG. 2B, the external quantum efficiency (EQE) of the optimized device of 1:1 CS-I/PC$_{71}$BM ratio with 3% pyridine and without pyridine additive (FIG. 4) was measured. Both the devices show a very wide range of photocurrent generation in the region of 300 to 850 nm, with the highest EQE value of 72.46% at 510 nm and 60.04% at 740 nm achieved for the device based on CS-I/PC$_{71}$BM blend film with 3% pyridine additive. Unexpectedly, the performance of the device based on CS-II shows much inferior performance with a $J_{SC}$ of 6.29 mA cm$^{-2}$, FF of 0.48 and PCE of 2.53% (FIG. 2A). This result is due to the inefficient exciton splitting in accordance with the macroscopic phase separation (vide infra). As for CS-III, a comparable $V_{OC}$ value of 0.87 V and a lower $J_{SC}$ of 10.50 mA cm$^{-2}$ constrain the PCE to 5.12% (FIG. 2A).

TABLE 1

Photovoltaic properties of the OSCs based on donor/PC$_{71}$BM (1:1, with or without additives) under the illumination of AM 1.5 G, 100 mW cm$^{-2}$.

| Donor | $J_{SC}$(mA cm$^{-2}$) | $V_{OC}$(V) | FF(%) | PCE(%) | Additive |
|---|---|---|---|---|---|
| CS-I | 8.41 | 0.85 | 44.79 | 3.19 | No |
| CS-I | 13.72 | 0.90 | 52.12 | 6.49 | 3% pyridine |
| CS-II | 6.29 | 0.85 | 47.88 | 2.53 | 3% pyridine |
| CS-III | 10.50 | 0.87 | 56.87 | 5.12 | 3% pyridine |

In certain embodiments, provided is a method of preparing the porphyrin small molecule represented by the formula I:

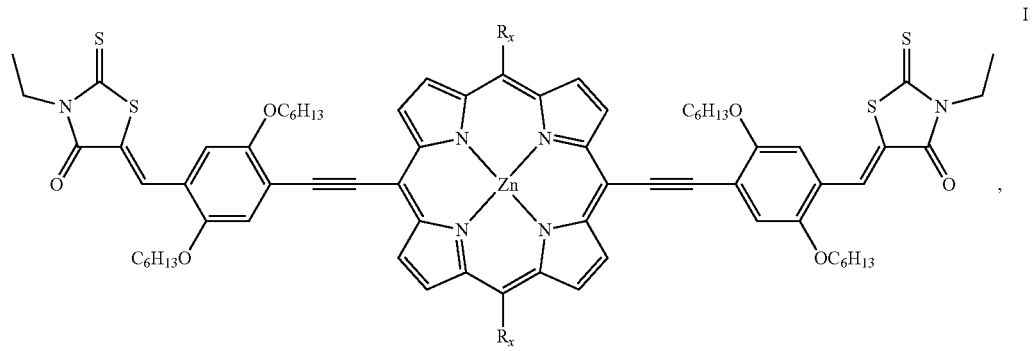

comprising the steps of:
contacting a compound of formula VII:
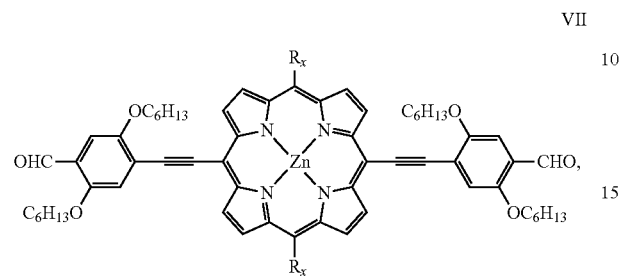
VII
3-ethylrhodanine or a conjugate base thereof, and optionally a base thereby forming a compound of formula I.
In certain embodiments, provided is a method of preparing a porphyrin small molecule represented by formulas IV and V:
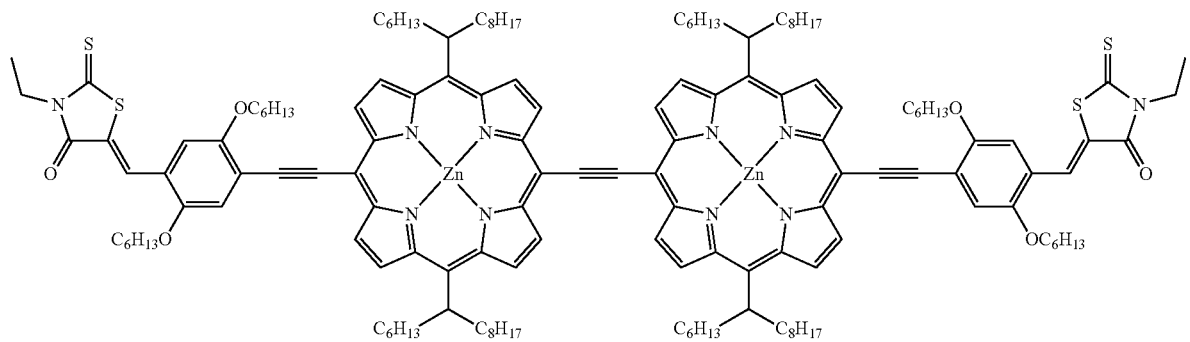
IV
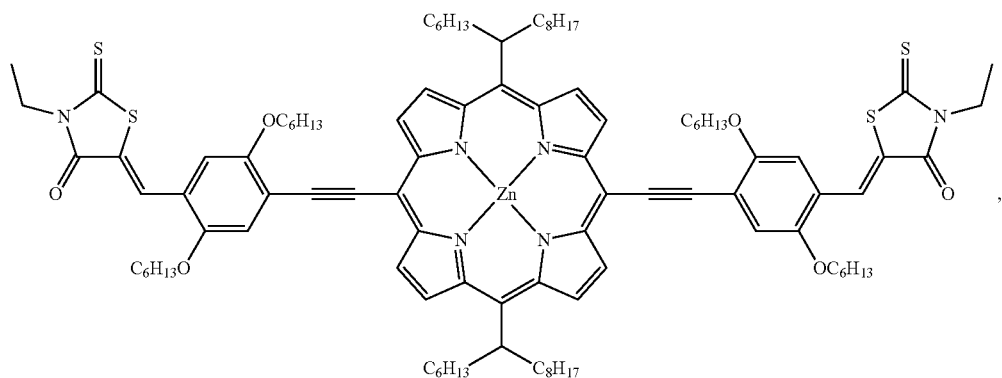
V comprising the steps of:
contacting a compound of formula IX or X:
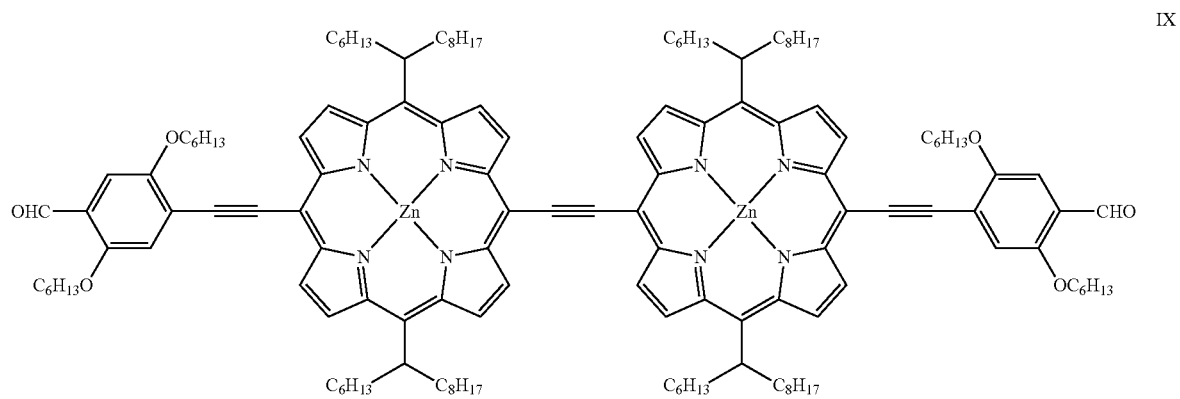
IX
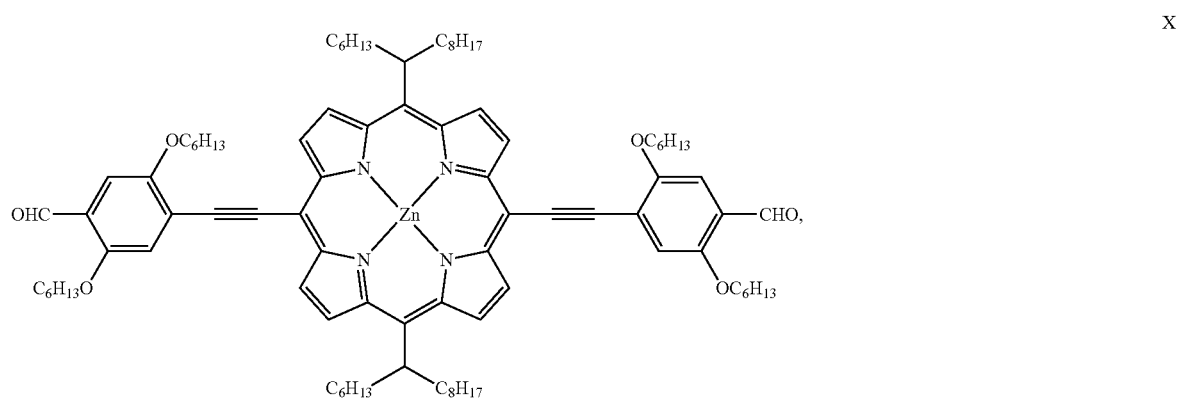
X
3-ethylrhodanine or a conjugate base thereof, and optionally a base thereby forming a compound of molecular formula IV or V.
In certain embodiments, provided is a method of preparing a porphyrin small molecule represented by the structure VI:
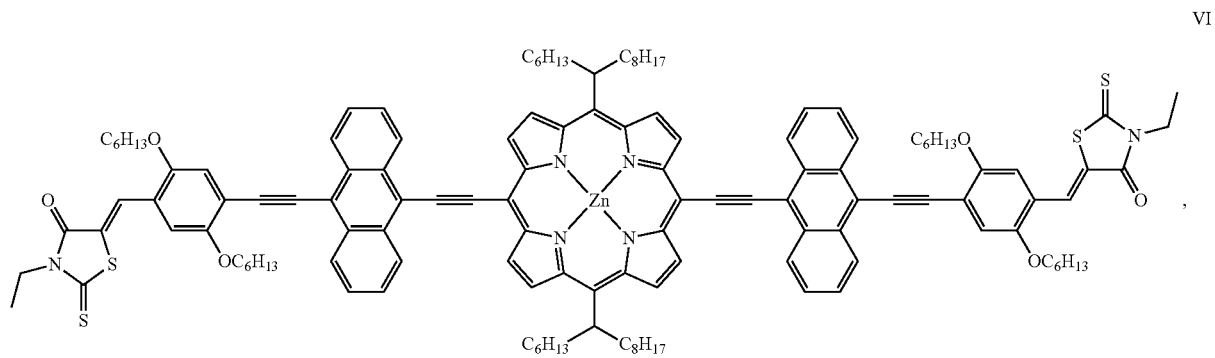
VI comprising the steps of:
contacting a compound of formula XI:

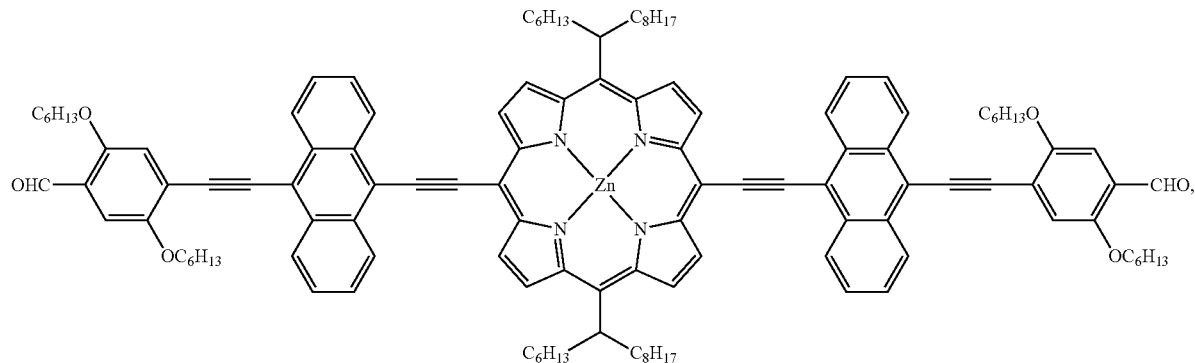

3-ethylrhodanine or a conjugate base thereof, and optionally a base thereby forming a compound represented by the structure VI.

Suitable bases include, but are not limited to, triethylamine, pyridine, diisopropylamine, diisopropylethylamine, ethanolamine, quinine, diethylenetriamine, tetramethylazanium hydroxide, DABCO (1,4-diazabicyclo[2.2.2]octane), imidazole, N-methylmorpholine, and the like.

In certain embodiments, the conjugate base of 3-ethylrhodanine can be used, such as the sodium, lithium, calcium, magnesium salt of 3-ethylrhodanine, or the like.

In summary, a series of new unsymmetrical push-pull A-D-A small molecules based on different 5,15-dialkylated porphyrin cores were designed and synthesized, which shows good solubility in common organic solvent, a broad absorption in the visible and NIR regions, a relatively high hole-mobility and good film-forming properties for solution processed BHJ OSC. Based on the blend film of CS-I/ $PC_{71}BM$ spin-coated from a mixture with 3% pyridine in chlorobenzene, a high PCE of 6.49% was achieved (FIG. 2A). These primary results indicate that the A-D-A small molecules based on meso-alkyl directly substituted porphyrin core are new class of donor candidates for highly efficient BHJ OSCs.

In another embodiment, two porphyrin small molecules of CS-V and CS-IV, in which the porphyrin core meso-substituted by 2-octylundecyl groups is connected to 2-(1,1-dicyanomethylene),3-ethylrhodanine and 3-ethylrhodanine, respectively, by terthiophene-ethynylene bridges, and investigate the optical properties, charge carrier mobility and their photovoltaic properties as electron donor material in BHJ OSCs are synthesized.

Materials and Methods

Scheme 2
Synthetic routes for CS-VI and CS-V.

Materials

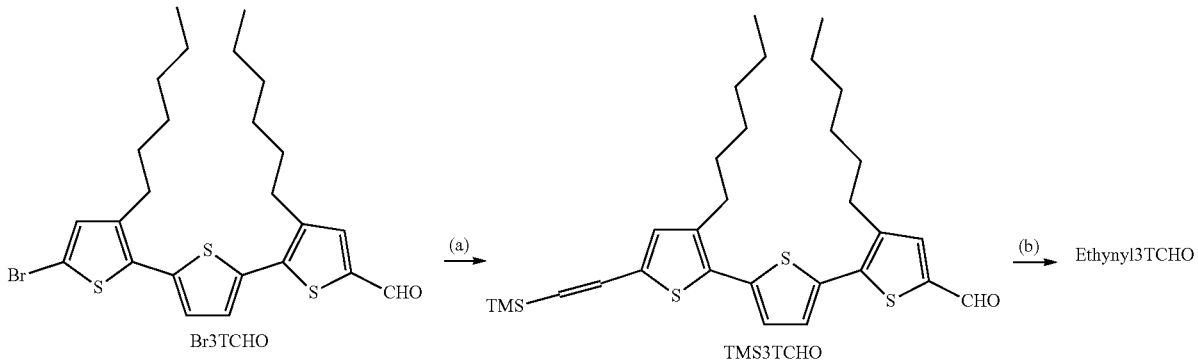

-continued
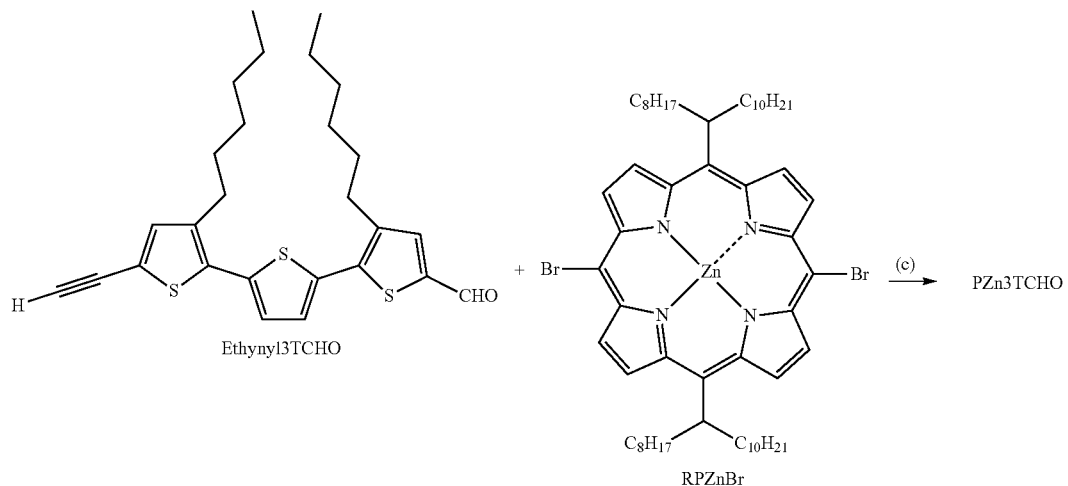
Ethynyl3TCHO + RPZnBr →(c) PZn3TCHO
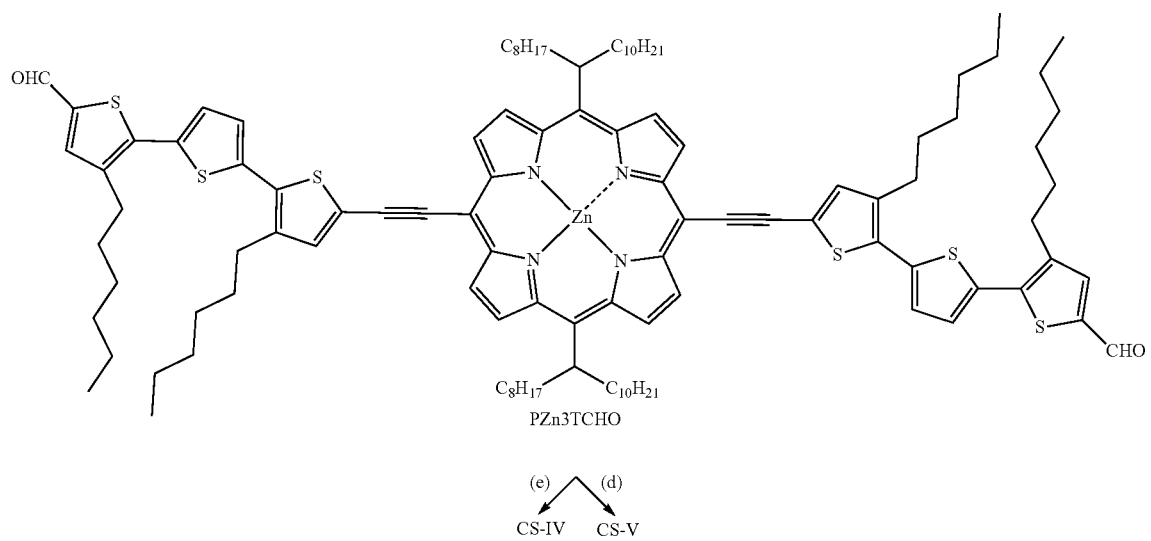
PZn3TCHO
(e) ↙  ↘ (d)
CS-IV  CS-V
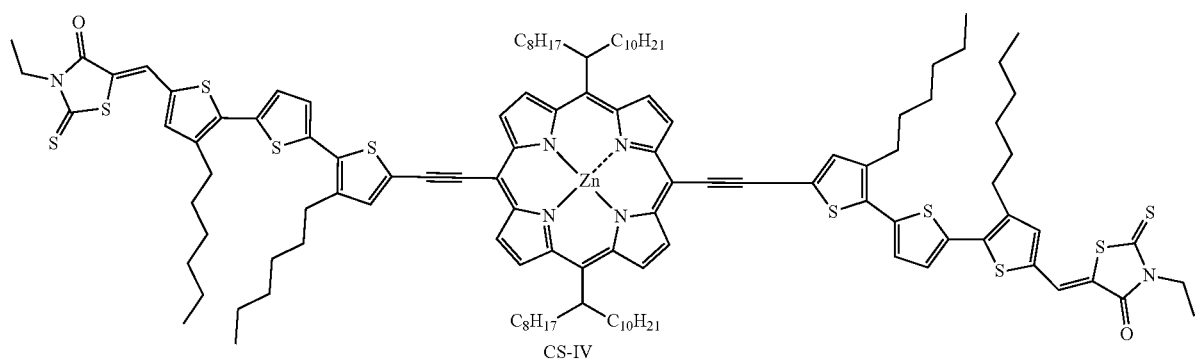
CS-IV -continued

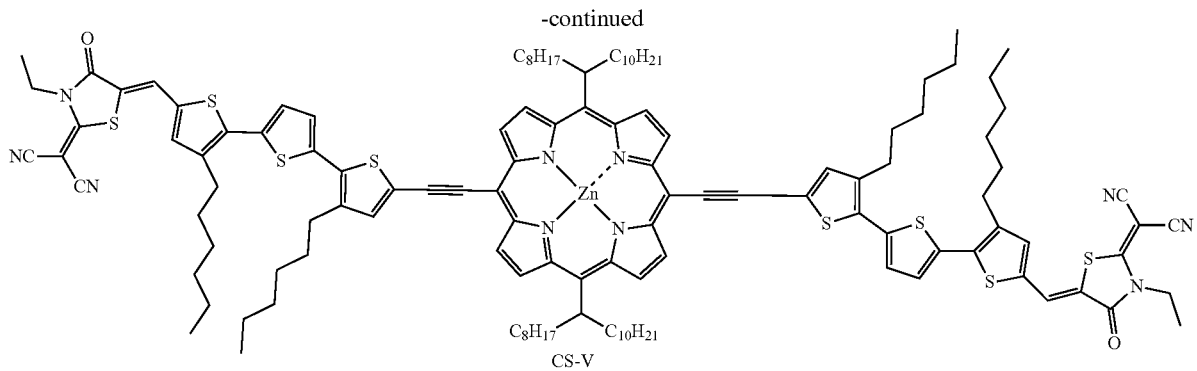

CS-V

Reaction conditions:
a) TMSA, PdCl₂(PPH₃)₂, CuI, THF/ET₃N, 40° C, . overnight;
b) TBAF, THF, 30min;
c) Pd(PPh₃)₄, CuI, THF/Et₃N, 50° C, . overnight;
d) 3-ethylrhodanine, dry CHCl₃, piperidine, reflux, overnight
e) 3-ethylrhodanine-(CN)₂, dry CHCl₃, piperidine, reflux, overnight .

Scheme 2 Synthetic routes for CS-IV and CS-V. Reaction conditions: a) TMSA, PdCl₂(PPH₃)₂, CuI, THF/Et₃N, 40° C., overnight; b) TBAF, THF, 30 min; c) Pd (PPH₃)₄, CuI, THF/Et₃N, 50° C., overnight; d) 3-ethylrhodanine, dry CHCl₃, piperidine, reflux, overnight; e) 3-ethylrhodanine-(CN)₂, dry CHCl₃, piperidine, reflux, overnight.

The synthesis of the two small molecules is shown in Scheme 2 and also in Experimental Section. 5,15-Dibromo-10,20-bis(2-octylundecyl)-porphyrin (RPZnBr) and 5"-bromo-3,3"-dihexyl-[2,2':5',2"-terthiophene]-5-carboxaldehyde (Br3TCHO) were synthesized according to the reported procedures. 5"-Ethynyl-3,3"-dihexyl-[2,2':5',2"-terthiophene]-5-carboxaldehyde (Ethynyl3TCHO) was prepared from Sonogashira coupling between Br3TCHO and trimethylsilyl acetylene, and deprotection by tetrabutylammonium hydrogen fluoride trihydrate (TBAF). Malononitrile was allowed to react with isothiocyanatoethane and ethyl bromoacetate in the presence of 1,8-diazabicyclo[5.4,0]undec-7-ene (DBU) to provide 3-ethylrhodanine-(CN)₂, PZn3TCHO were synthesized by Pd-catalyzed Sonogashira coupling of RPZnBr with Ethynyl3TCHO. Then, 3-ethylrhodanine and 3-ethylrhodanine-(CN)₂ were condensed with PZn3TCHO by Knoevenagel condensation reaction to produce CS-IV and CS-V, respectively. After the condensation, the two materials were purified by silica-gel column and then Soxhlet extraction in acetone (24 hours each) to remove the catalysis and other impurities. And their chemical structures and purities were verified by ¹H NMR and electrospray ionization (ESI)/matrix-assisted laser desorption ionization time-of-flight (MALDI-TOF) mass spectroscopy.

In certain embodiments, provided is a method of preparing the porphyrin small molecule represented by the formula II or III:

II

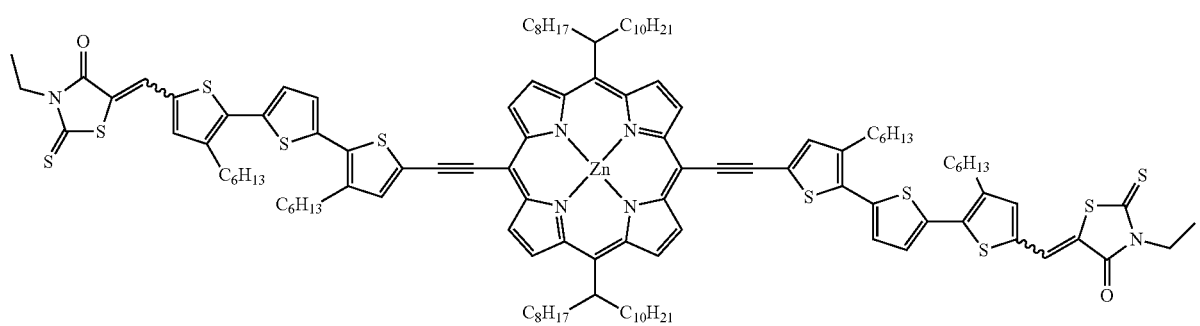

III

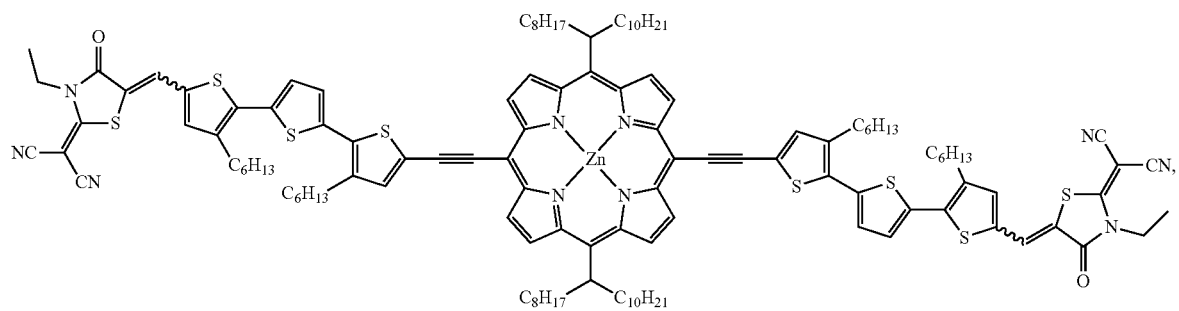

comprising the steps of:
contacting a compound of formula VIII:

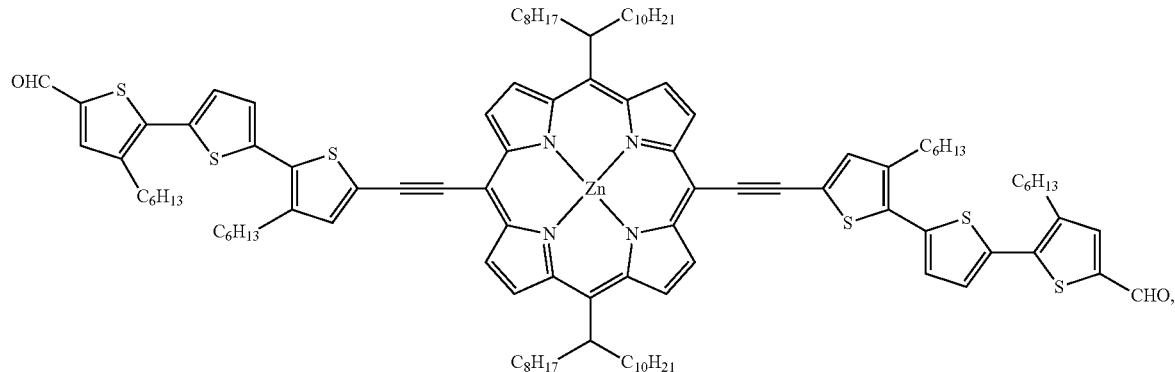

VIII 3-ethylrhodanine 2-(1,1-dicyanomethylene),3-ethylrhodanine, or a conjugate base thereof, and optionally a base thereby forming a compound represented by molecular formula II or III.

2-(1,1-dicyanomethylene),3-ethylrhodanine, also known as 2-(1,1-dicyanomethylene)-1,3-thiazol-4-one, can be represented by the following molecular formula:

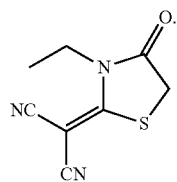

In certain embodiments, the conjugate base of 3-ethylrhodanine can be used, such as the sodium, lithium, calcium, magnesium salt of 3-ethylrhodanine, or the like.

In certain embodiments, the conjugate base of 2-(1,1-dicyanomethylene), 3-ethylrhodanine can be used, such as the sodium, lithium, calcium, magnesium salt of 2-(1,1-dicyanomethylene),3-ethylrhodanine, or the like.

Experimental Section

Materials and Characterization

All air and water-sensitive reactions were performed under nitrogen atmosphere. All of the chemicals were purchased from Dieckmann Chemical Ltd, China. Organic solvents used in this work were purified using standard process. The other materials were of the common commercial level and used as received. $^1$H NMR spectra were recorded using a Bruker Ultrashield 400 Plus NMR spectrometer. High-resolution matrix-assisted laser desorption/ionization time-of-flight (MALDI-TOF) mass spectra were obtained with a Bruker Autoflex MALDI-TOF mass spectrometer. UV-vis spectra of dilute solutions ($1\times10^{-5}$ M) of samples in dichloromethane (DCM) were recorded at room temperature (ca. 25° C.) using a Shimadzu UV-3600 spectrophotometer. Solid films for UV-vis spectroscopic analysis were obtained by spin-coating the molecule solutions onto a quartz substrate.

BHJ-OSC Device Fabrication

Solution-processed bulk-heterojunction solar cells were fabricated as follows: Indium tin oxide (ITO) coated glass substrates were cleaned prior to device fabrication by sonication in acetone, detergent, distilled water, and isopropyl alcohol. After treated with an oxygen plasma for 5 mins, 40 nm thick poly(styrene sulfonate)-doped poly(ethylene-dioxythiophene) (PEDOT:PSS) (Bayer Baytron 4083) layer was spin-coated on the ITO-coated glass substrates at 2500 rpm for 30s, the substrates were subsequently dried at 150° C. for 10 mins in air and then transferred to a $N_2$-glovebox. The active layers were spun from solution of donor material and $PC_{71}BM$ at weight ratio of 1:1(or other ratio) with an overall concentration of 32 mg/mL. The thicknesses of active layers were measured by a profilometer. The ultra-thin PFN layer was deposited by spin casting from a 0.02% (w/v) solution in methanol (from 2000 rpm for 30 s). Finally, Al (~80 nm) was evaporated with a shadow mask as the top electrode. The effective area was measured to be 0.16 cm$^2$.

Characterization and Measurement

The values of power conversion efficiency were determined from J-V characteristics measured by a Keithley 2400 source-measurement unit under AM 1.5G spectrum from a solar simulator (Oriel model 91192). Masks made from laser beam cutting technology with a well-defined area of 0.16 cm$^2$ were attached to define the effective area for accurate measurement. Solar simulator illumination intensity was determined using a monocrystal silicon reference cell (Hamamatsu S1133, with KG-5 visible color filter) calibrated by the National Renewable Energy Laboratory (NREL). The active layer was spin coated from blend chloroform or chlorobenzene solutions with a weight ratio of donor materials and $PC_{71}BM$ at 1:1 (or other ratios) and then was placed in a glass petri dish containing 0.3 mL $CHCl_3$ for 80 s for solvent vapor annealing. External quantum efficiency (EQE) values of the encapsulated devices were measured by using an integrated system (Enlitech, Taiwan, China) and a lock-in amplifier with a current preamplifier under short-circuit conditions. The devices were illuminated by monochromatic light from a 75 W xenon lamp. The light intensity was determined by using a calibrated silicon photodiode.

Synthesis of CS-IV

PZn3TCHO (160 mg, 0.086 mmol) was dissolved in a solution of dry $CHCl_3$, three drops of piperdine and then 3-ethylrhodanine (128 mg, 0.80 mmol) were added, and the resulting solution was refluxed and stirred for 12 hours under argon. The reaction was quenched into water (30 mL). The aqueous layers were extracted with $CHCl_3$ (3×20 mL).

The organic layer was dried over NaSO$_4$. After removal of solvent, it was purified by chromatography on a silica gel column using CHCl$_3$ as eluent. Then the crude solid was recrystallized from CHCl$_3$ and methanol mixture to afford CS-IV as a gray green solid (102 mg, 55%). $^1$H NMR (400 MHz, CDCl$_3$) δ (ppm): 0.73 (m, 12H), 0.94-1.69 (m, 96H), 1.63-1.70 (m, 4H), 1.78-1.86 (m, 4H), 2.66-2.71 (m, 4H), 2.79-2.83 (m, 4H), 2.90-2.94 (m, 8H), 4.19 (m, 4H), 5.17 (m, 2H), 7.18 (s, 2H), 7.24 (d, J=1.6 Hz, 4H), 7.50 (s, 4H), 7.73 (s, 2H), 9.57 (d, J=4.8 Hz, 2H), 9.64 (m, 6H). (MALDI-TOF, m/z) calculated for C$_{122}$H$_{158}$N$_6$O$_2$S$_{10}$Zn: 2126.8884; found: 2126.8942.

Synthesis of CS-V

PZn3TCHO (160 mg, 0.086 mmol) was dissolved in a solution of dry CHCl$_3$, three drops of piperdine and then 3-ethylrhodanine-(CN)$_2$ (2-(1,1-dicyanomethylene),3-ethyl-rhodanine) (87.7 mg, 0.500 mmol) were added, and the resulting solution was refluxed and stirred for 12 hours under argon. The reaction was quenched into water (30 mL). The aqueous layers were extracted with CHCl$_3$ (3×20 mL). The organic layer was dried over NaSO$_4$. After removal of solvent, it was purified by chromatography on a silica gel column using CHCl$_3$ as eluent and was purified by preparative thin layer chromatography using a CHCl$_3$ as eluent. Then the crude solid was recrystallized from CHCl$_3$ and methanol mixture to afford CS-V as a gray green solid (98 mg, 52%). $^1$H NMR (400 MHz, CDCl$_3$) δ (ppm): 0.77 (m, 12H), 0.86-1.41 (m, 90H), 1.53 (m, 12H), 1.83 (m, 4H), 2.65 (m, 8H), 2.91 (m, 8H), 4.23 (q, J=7.2 Hz, 4H), 5.17 (m, 2H), 6.78 (m, 2H), 7.11 (q, J=4.4 Hz, 2H), 7.24 (m, 4H), 7.46 (m, 2H), 9.57-9.64 (m, 8H). (MALDI-TOF, m/z) calculated for C$_{128}$H$_{158}$N$_{10}$O$_2$S$_8$Zn: 2189.9716; found: 2189.9780.

Results and Discussion

Measurement

Figure 5A:
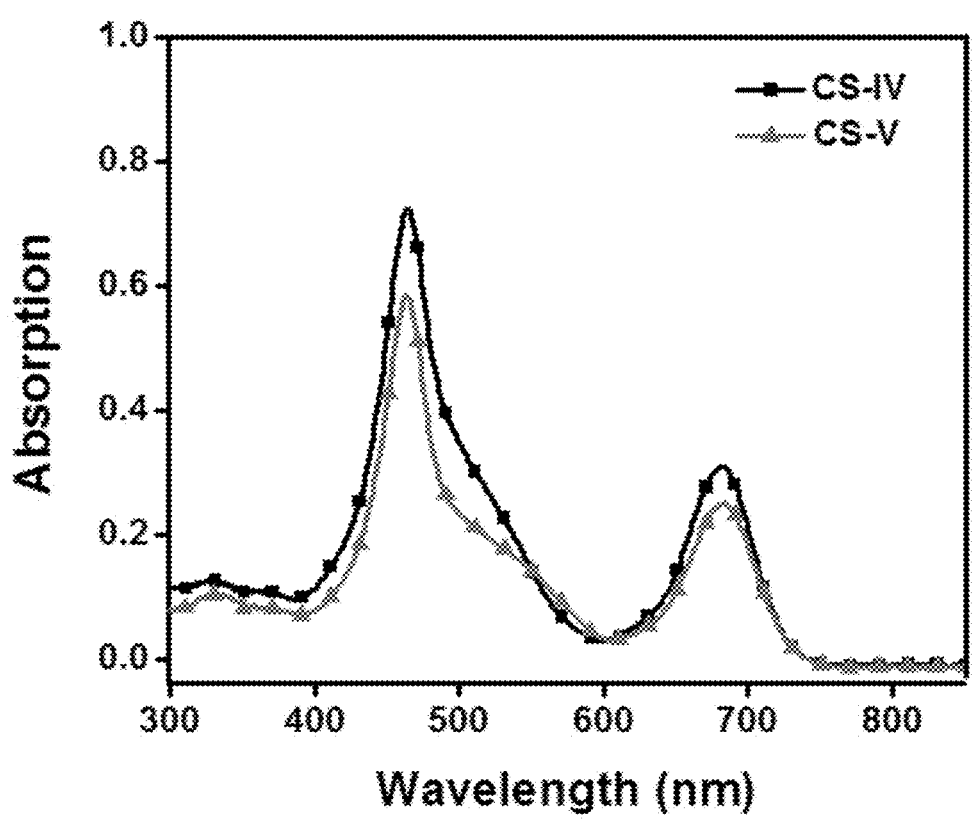
FIG. 5A shows the UV-vis absorption spectra of CS-IV and CS-V in chloroform solution.

The absorption spectra of two molecules both in diluted chloroform solution and in thin film were measured. As seen in FIG. 5A and Table 2, the two porphyrins exhibit similar absorption spectra (CS-IV and CS-V) with two absorption peaks at 464 and 682 nm in solution, which are the typical characteristics of ethynyl linked conjugated D-A porphyrins and can be ascribed to the π-π* transition of the conjugated backbones of Soret band and the intramolecular charge transfer (ICT) of Q band, respectively. The ICT band is weaker and the wavelength is also shorter than those in phenylene ethynylene bridged porphyrins indicating the reduced ICT of the two molecules after the replacement of phenylenes with terthiophenes. And the similar absorption spectra of CS-IV and CS-V suggest that the ICT is similar in the two molecules though there are two additional 1,1-dicyanomethylene electron-withdrawing groups on CS-V.

TABLE 2

Optical and electrochemical data of CS-IV and CS-V.

| Materials | $λ_{max}$/nm (solution) | $λ_{max}$/nm (film) | $λ_{onset}$/nm (film) | $E_{HOMO}$[a] [eV] | $E_{LUMO}$[b] [eV] | $E_{g(cv)}$ [eV] | $E_{g(opt)}$ [eV] |
|---|---|---|---|---|---|---|---|
| CS-IV | 465, 682 | 535, 755 | 815 | −5.14 | −3.56 | 1.58 | 1.52 |
| CS-V | 463, 684 | 514, 755 | 855 | −5.17 | −3.63 | 1.54 | 1.45 |

[a] $E_{HOMO}$ = −($E_{ox}$ + 4.71) (eV);
[b] $E_{LUMO}$ = −($E_{red}$ + 4.71) (eV).

Figure 5B:
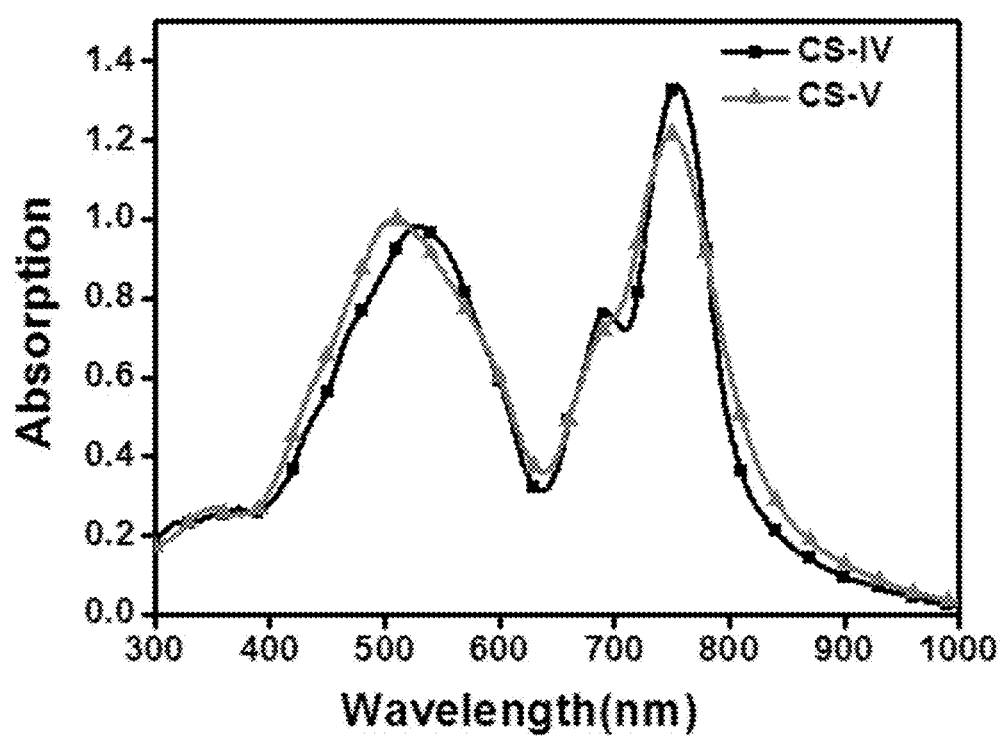
FIG. 5B shows the UV-vis absorption spectra of CS-IV and CS-V in film.

As seen in FIG. 5B, the NIR peak at 682 nm of both CS-IV and CS-V in solution significantly red-shifts to 760 nm with the appearance of vibronic shoulders at 700 nm in films. The optical band gaps, which are estimated from the onsets of the absorption spectra in film, are 1.45 and 1.52 eV for CS-V and CS-IV, respectively. It should be noted that their Q bands of 760 nm are intensified remarkably and they are even higher than the Soret bands in film while they are much lower than the Soret bands in solution, indicating the very effective intermolecular π-π stacking (self-assembly) in the condensed solid state. Comparing to the absorption spectra of the reported porphyrins with similar chemical structures in solution and in film, the inventors ascribed the stronger self-assembly to the elongated π backbones after the replacement of phenylene with terthiophene and the replacement of the bulky 2,6-dioctyloxylphenyl groups with 2-octylundecyl substituents at the meso positions of the porphyrins.

Solution-processed BHJ OSCs were fabricated using CS-IV or CS-V as the electron donor material and PC$_{71}$BM ([6,6]-phenyl-C$_{71}$-butyric acid methyl ester) as the electron acceptor material with a conventional device structure of ITO/PEDOT:PSS/donor:PC$_{71}$BM/PFN/Al (ITO: indium tin oxide, PEDOT:PSS: poly(styrene sulfonate)-doped poly (ethylene-dioxythiophene), PFN: poly[(9,9-bis(3'-(N,N-dimethylamino)propyl)-2,7-fluorene)-alt-2,7-(9,9-dioctylfluorene)]).

During the fabrication of the devices, the inventors noticed that good CS-V blend films can be obtained by using chlorobenzene (CB) solution while only chloroform (CF) solution produces smooth films for CS-IV blends. Therefore, CB and CF were chosen as the solvents in device fabrication. The weight ratio of the donor to PC$_{71}$BM were optimized to be 1:1 for CS-IV/PC$_{71}$BM and 4:3 for CS-V/PC$_{71}$BM (the inventors used different donor/PC$_{71}$BM ratios (w/w) of 1:1.5, 1:1, 4:3 and 1:0.5 to optimize blend ratios). The active layer thickness was about 100 nm.

| Donor materials | Processing conditions | $J_{SC}$ (mA cm$^{-2}$) | $V_{OC}$ (V) | FF (%) | PCE (%) |
|---|---|---|---|---|---|
| CS-IV | CF | 10.80 | 0.86 | 43.66 | 4.05[a]/3.89 [b] |
|  | CF/DIO | 14.49 | 0.80 | 61.86 | 7.17[a]/7.04 [b] |
|  | CF/DIO/SVA | 14.93 | 0.80 | 64.18 | 7.66[a]/7.47 [b] |
| CS-V | CB | 9.28 | 0.89 | 42.13 | 3.47[a]/3.31 [b] |
|  | CB/DIO | 13.22 | 0.84 | 66.78 | 7.42[a]/7.30 [b] |
|  | CB/DIO/SVA | 14.30 | 0.82 | 70.01 | 8.21[a]/8.13 [b] |

Note:
[a] and [b] indicate the best and the average value of 10 devices, respectively.

Figure 6:
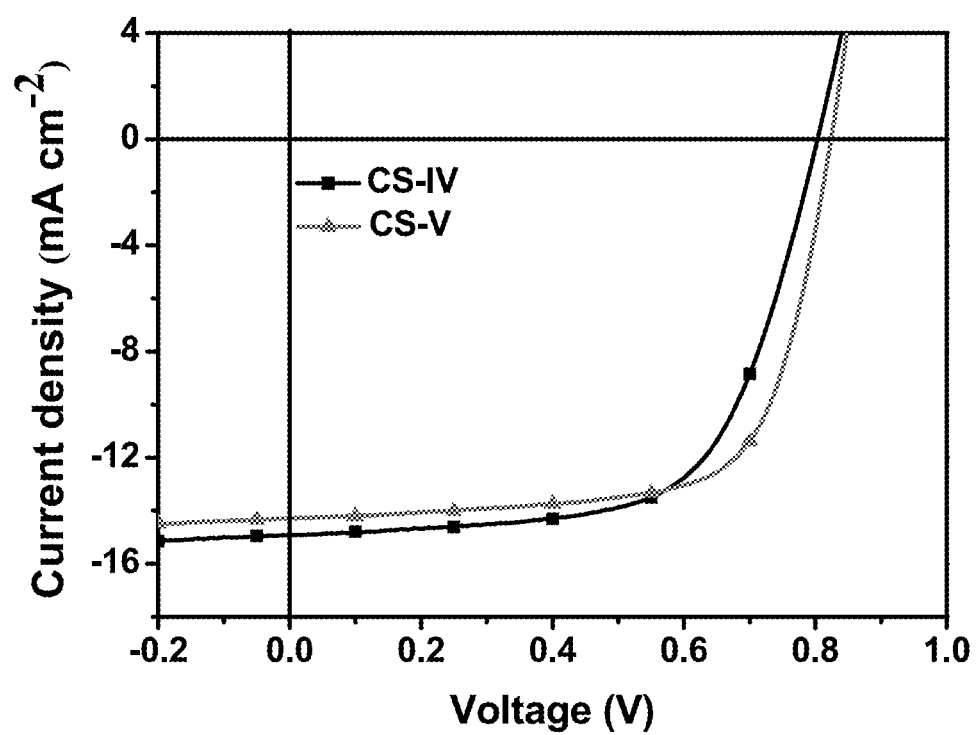
FIG. 6 shows the J-V curves of the devices based on CS-IV and CS-V under optimal condition [CS-IV: chloroform (CF) with 0.4% 1,8-diiodooctane (DIO)/80s solvent vapor annealing (SVA); CS-V: chlorobenzene (CB) with 0.4% 1,8-diiodooctane (DIO)/80 s solvent vapor annealing (SVA)].

The J-V curves of the devices are presented in FIG. 6, and their device parameters are summarized in Table 3. As shown in FIG. 6, PCEs of CS-IV based device were further improved to 7.66% under chloroform with 0.4% DIO as additives (short circuit current ($J_{SC}$)=14.93 mA cm$^{-2}$, open circuit voltage ($V_{OC}$)=0.80, fill factor (FF)=64.18%); and for CS-V based device, the PCEs were further improved to 8.21% under chlorobenzene with 0.4% DIO as additives ($J_{SC}$=14.30 mA cm$^2$, $V_{OC}$=0.82, FF=70.01%). The performance enhancement is contributed improved morphology and optical properties.

Figure 7:
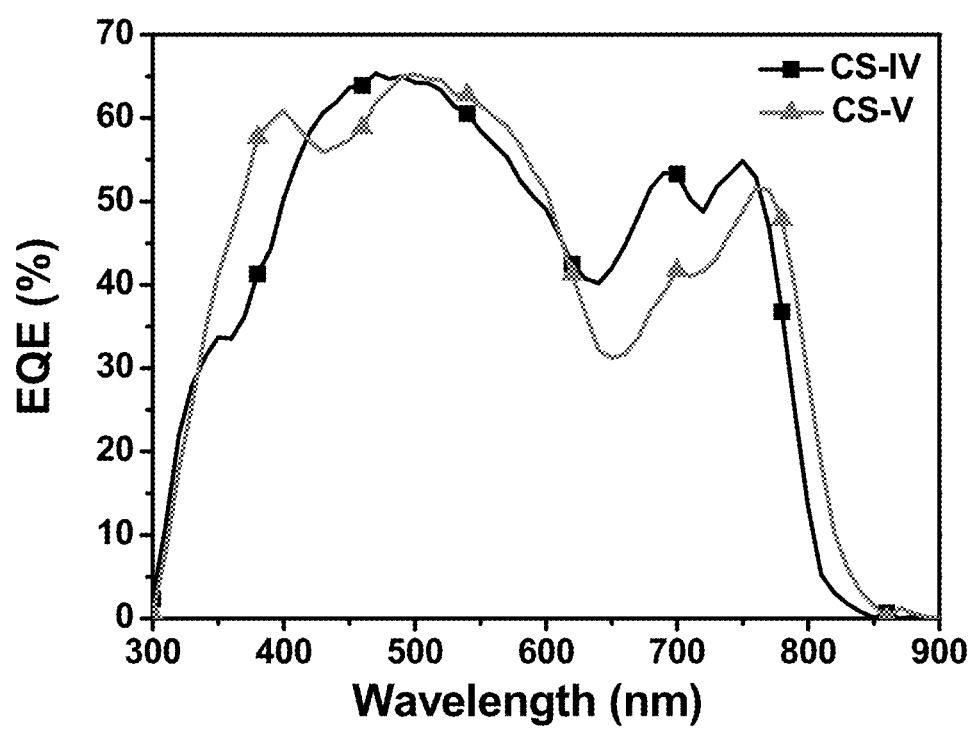
FIG. 7 shows the EQE curves of both devices under optimized conditions [CS-IV: chloroform (CF) with 0.4% 1,8-diiodooctane (DIO)/80s solvent vapor annealing (SVA); CS-V: chlorobenzene (CB) with 0.4% 1,8-diiodooctane (DIO)/80s solvent vapor annealing (SVA)] and simulated AM 1.5G irradiation (100 mW $cm^{-2}$).

FIG. 7 shows the external quantum efficiency (EQE) spectra of optimized devices. It is shown that peak values of EQE reaches up to 65% and the spectra cover a broad region from 300 to 850 nm for both CS-IV- and CS-V-based devices. $J_{SC}$ values integrated from the EQE data are 14.51 and 13.89 mA cm$^{-2}$, respectively, which are within 5% mismatch with that obtained from J-V measurements. The EQE values and response regions are higher and wider compared to the bulky side chain substituted porphyrin molecules, and the inventors suspect the alkyl side chains will elevate the steric hindrance and thus promote intermolecular interactions.

The EQE spectrum of CS-V-based devices showed a slightly broader response but with smaller EQE values from 600 to 750 nm than CS-IV, which is consistent with the absorption spectra of CS-IV and CS-V in pure and blend film. The EQE response for CS-V longer than 750 nm can be ascribed to its stronger J-aggregations and the EQE peak at around 700 nm from CS-IV-based devices was speculated to be H-aggregation features of the molecule. It is also noted that in EQE spectra, a broad peak from 300-600 nm region showed up, and this peak breadth is much wider than soret band of porphyrin molecules, the inventors thus conclude both $PC_{71}BM$ and porphyrin molecules contributed to the photon-to-electron conversions.

Figure 8A:
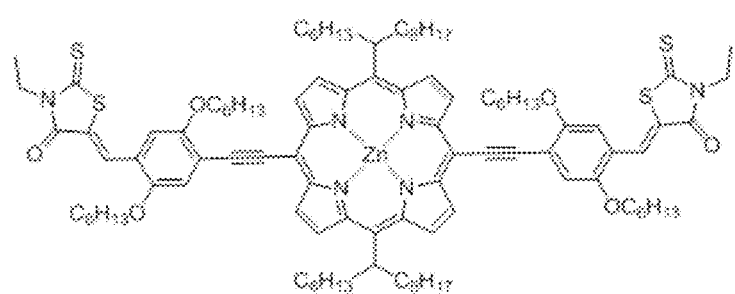
FIG. 8A shows molecular structure of MP.
Figure 8B:
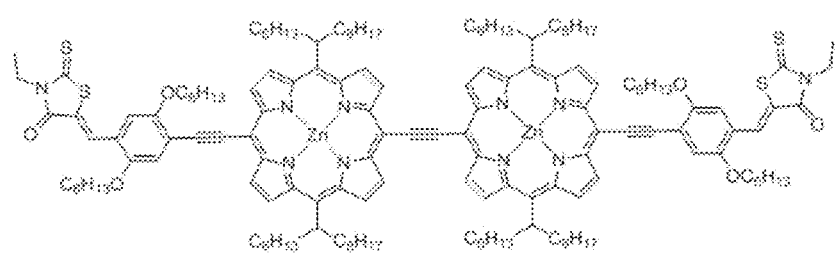
FIG. 8B shows molecular structure of CS-DP.
Figure 12A:
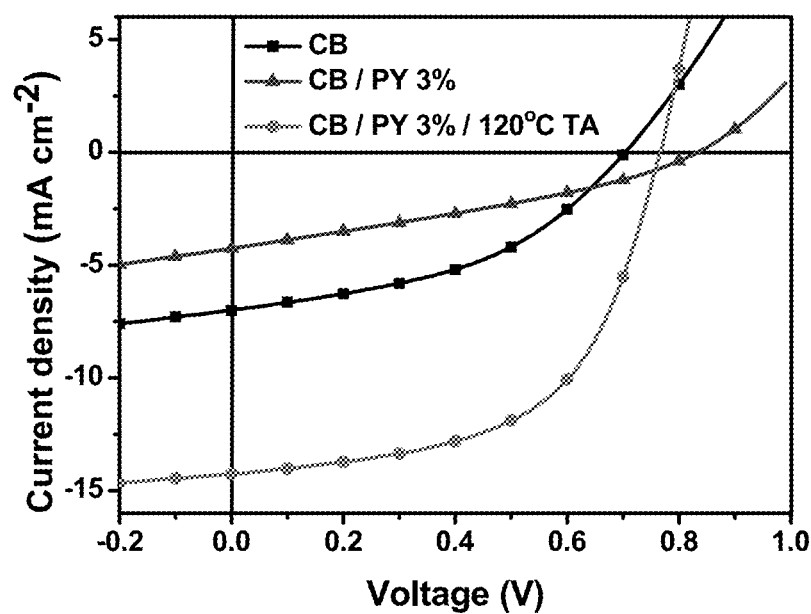
FIG. 12A shows J-V curves based on CS-DP/$PC_{71}BM$ (4:5) under the illumination of AM 1.5G at 100 mW $cm^{-2}$ with three different conditions: 1) chlorobenzene (CB); 2) chlorobenzene (CB)+pyridine (PY) 3%; 3) chlorobenzene (CB)+pyridine (PY) 3%+90° C. thermal annealing (TA)+THF solvent vapour annealing (SVA); 4) chlorobenzene (CB)+pyridine (PY) 3%+110° C. thermal annealing (TA)+THF solvent vapour annealing (SVA) 5) chlorobenzene (CB)+pyridine (PY) 3%+130° C. thermal annealing (TA)+THF solvent vapour annealing (SVA); 6) chlorobenzene (CB)+pyridine (PY) 3%+150° C. thermal annealing (TA)+THF solvent vapour annealing (SVA).
Figure 12B:
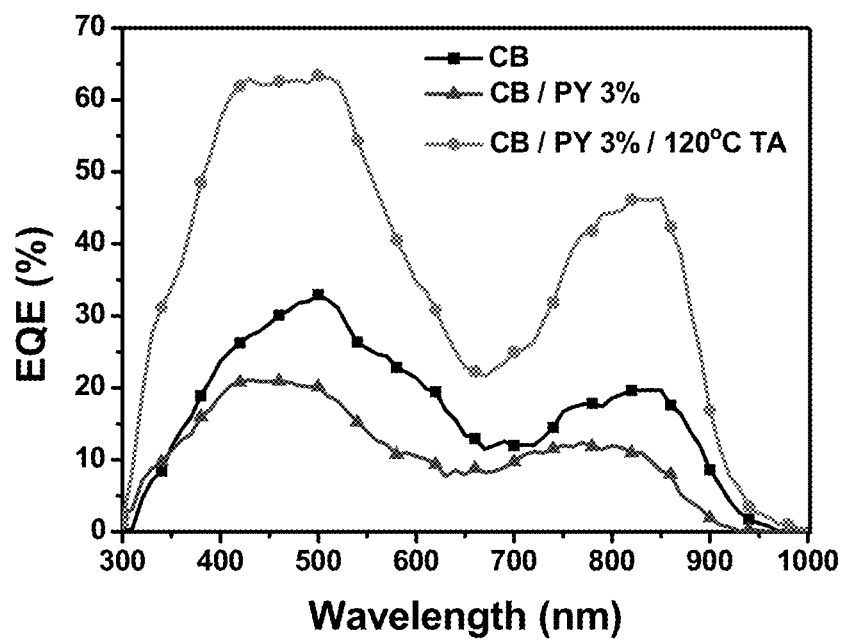
FIG. 12B shows EQE curves of the devices based on CS-DP/$PC_{71}BM$ (4:5) under the illumination of AM 1.5G at 100 mW $cm^{-2}$ with three different conditions: 1) chlorobenzene (CB); 2) chlorobenzene (CB)+pyridine (PY) 3%; 3) chlorobenzene (CB)+pyridine (PY) 3%+90° C. thermal annealing (TA)+THF solvent vapour annealing (SVA); 4) chlorobenzene (CB)+pyridine (PY) 3%+110° C. thermal annealing (TA)+THF solvent vapour annealing (SVA) 5) chlorobenzene (CB)+pyridine (PY) 3%+130° C. thermal annealing (TA)+THF solvent vapour annealing (SVA); 6) chlorobenzene (CB)+pyridine (PY) 3%+150° C. thermal annealing (TA)+THF solvent vapour annealing (SVA).

In the present invention, the inventors designed a dimeric porphyrin dye (CS-DP) based on an efficient push-pull zinc porphyrin (MP) with extended π-conjugation through coupling of two zinc porphine cores via an acetylene bridge at the meso position of the porphyrin to extend the absorption spectrum effectively into the near infrared region. FIG. 8A shows molecular structure of MP and FIG. 8B shows molecular structure of CS-DP. As shown in FIG. 12B, the device based on CS-DP/$PC_{71}BM$ showed panchromatic spectral features in the incident photon-to-current conversion efficiency (IPCE) action spectrum in the region 300-950 nm, and the devices displayed power conversion efficiencies as high as 8.23% with $J_{SC}$/mA cm$^{-2}$=15.14, $V_{OC}$/mV=0.78 and FF=69.8% (FIGS. 12A-12B) under AM 1.5G solar irradiation. This performance is superior to what is obtained from the individual near-infrared small molecule based single-layer devices systems.

Scheme 3
The synthetic routes of CS-DP and MP

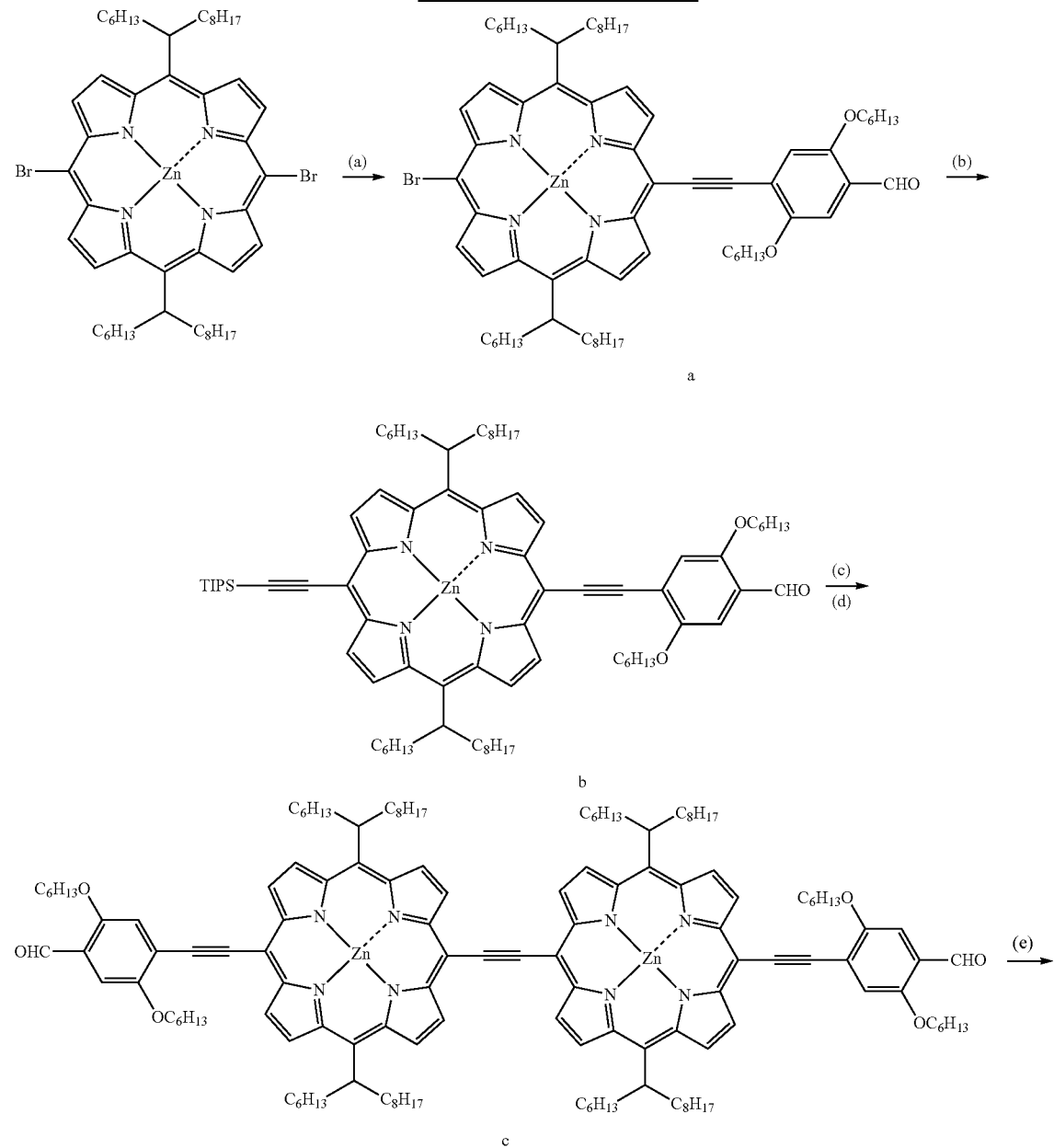

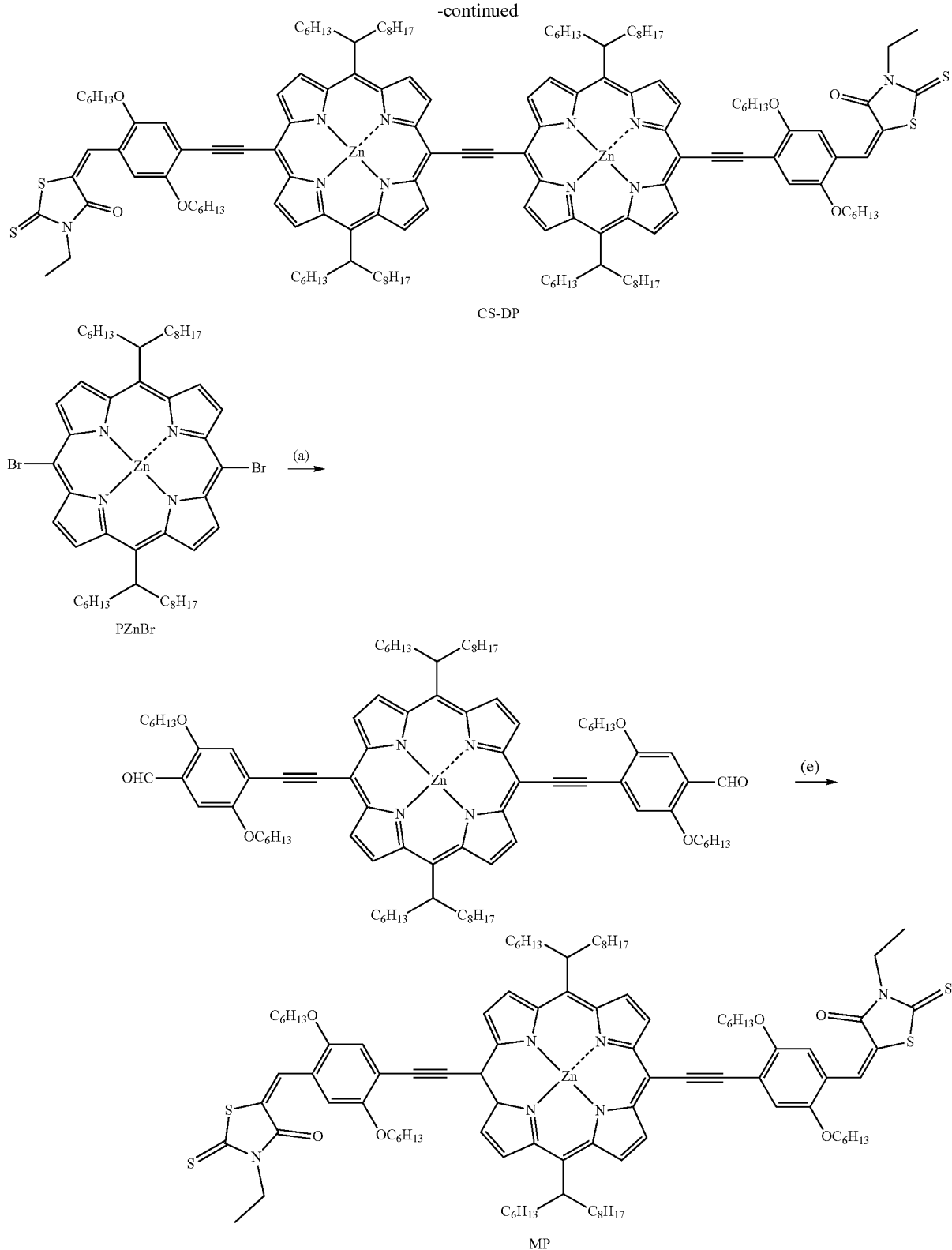
Reaction conditions:
a) Pd(PPh$_3$)$_4$, CuI, THF/Et$_3$N, 50° C, . overnight;
b) Triisopropylacetylene, Pd(PPH$_3$)$_2$Cl$_2$, CuI, THF/ET$_3$N, 50° C, . overnight;
c) TBAF, THF, 30min;
d) Compound 1, Pd(PPh$_3$)$_4$, CuI, THF/ET$_3$N, 50° C, . overnight;
e) 3-ethylrhodanine, dry CHCl$_3$, piperidine, reflux, overnight.

The synthetic route for the porphyrin is shown in Scheme 3. It should be noted that the use of zinc as the central metal atom is necessary for high stability. The Sonogashira coupling of PZnBr with arylacetylenes produced the monobrominated intermediates. The important asymmetry intermediates was obtained in good yield by same coupling of monobrominated intermediates and triisopropylacetylene in the presence of catalytic amounts of bis(triphenylphosphine) palladium(II) dichloride [$PdCl_2(PPh_3)_2$] in quantitative yields. In order to get higher yield, the target small molecule CS-DP was obtained by one step that combined deprotection reaction with sonogashira coupling. The targeted molecules CS-DP were prepared by the Knoevenagel condensation of 3-ethylrhodanine with c respectively. Detailed synthetic procedures are described in the experimental section. They are well soluble in common organic solvents such as chloroform, THF, and toluene, and can be readily processed to form smooth and pinhole-free films upon spin-coating.

Optical and Electrochemical Properties

Figure 9:
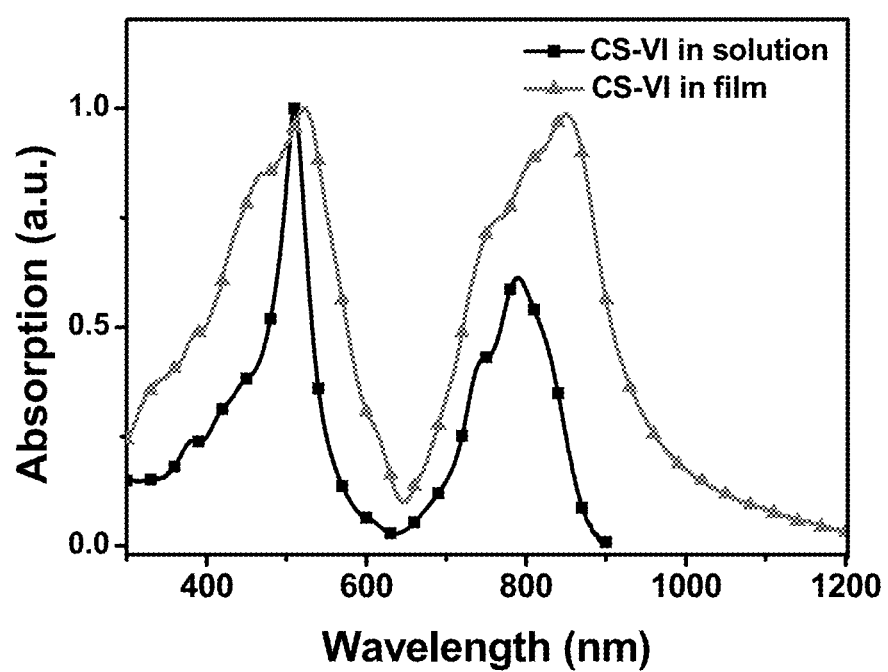
FIG. 9 shows absorption spectra of CS-DP in $CHCl_3$ solution and in films.
Figure 10:
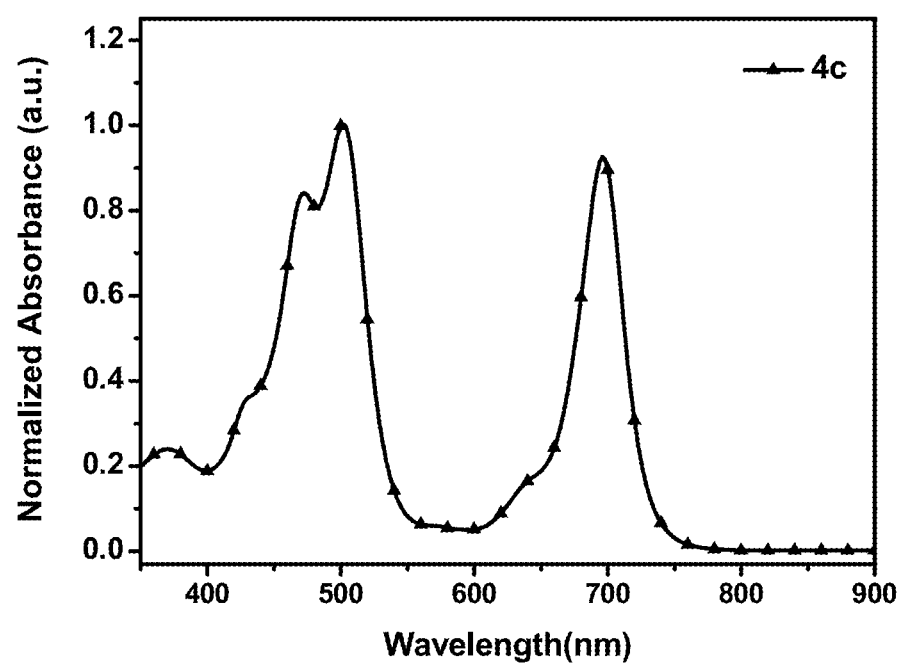
FIG. 10 shows absorption spectra of MP in $CHCl_3$ solution.
Figure 11:
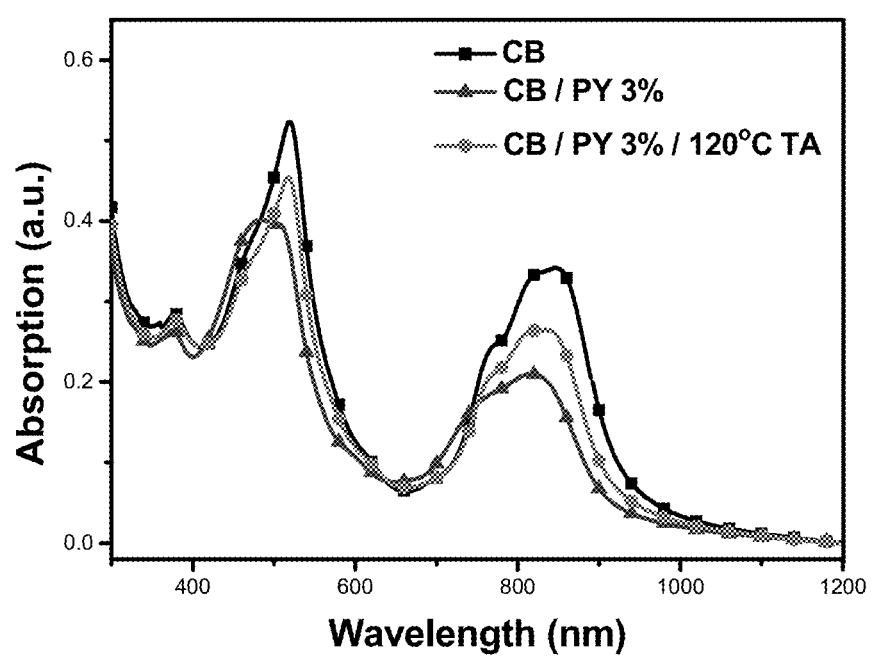
FIG. 11 shows absorption spectra of BHJ films based on CS-DP under six different conditions: 1) chlorobenzene (CB); 2) chlorobenzene (CB)+pyridine (PY) 3%; 3) chlorobenzene (CB)+pyridine (PY) 3%+120° C. thermal annealing (TA).

The inventors evaluated the optical properties of MP and CS-DP by using UV-Vis absorption spectroscopies. The absorption spectra of MP and CS-DP in $CHCl_3$ and in film are shown in FIG. 9-11, and data are collected in Table 4. The absorption spectrum of MP in dilute solution showing exhibits an intensive absorption band at 472 nm, 502 nm and 696 nm with a high molar extinction coefficient of $1.64 \times 10^{-5}$ $cm^{-1}$, $1.95 \times 10^{-5}$ $cm^{-1}$ and $1.81 \times 10^{-5}$ $cm^{-1}$, respectively (FIG. 10). As expected, the maximum absorption of CS-DP was much more red-shifted to 791 nm in comparison to monomer analogue MP, indicating the lower band gap of CS-DP due to the strong electron coupling and electronic delocalization of dimeric porphyrin core tethered by ethynyl linkers (FIG. 9). Compared to its spectrum in solution, the thin film of CS-DP exhibits a significantly broadened and bathochromic absorption with Q band extended into NIR region over 1100 nm (FIG. 9). Impressively, CS-DP with the A-$\pi_2$-D-$\pi_1$-D-$\pi_2$-A configuration shows a red-shifted Q-band by 117 nm in thin film contrasted sharply with the A-$\pi$-D-$\pi$-A structural MP, The result indicates that the dimeric porphyrin center is more favorable in self-assembly, leading to strong intermolecular $\pi$-$\pi$ interactions. The absorption spectrum of CS-DP/$PC_{71}BM$ (w/w, 4:5) was also evaluated in FIG. 11. In BHJ thin film, the absorption in the range of 400 to 600 nm is enhanced due to the inclusion of PCBM with strong absorption in the visible region. In addition, the BHJ thin films prepared under different processing conditions show different absorption features in Q band region, which is strongly correlated with the morphology of BHJ thin films.

electron acceptor under a conventional device structure of ITO/PEDOT:PSS/CS-DP:$PC_{71}BM$/Ca/Al, and the device performance was measured under a simulated solar illumination of 100 mW/$cm^2$. The current density-voltage (J-V) curves and external quantum efficiency (EQE) are shown in FIG. 12A and FIG. 12B, and the photovoltaic performance parameters are listed in Table 5. The CS-DP/$PC_{71}BM$ mass ratios ranging from 1:1 to 1:1.5 were first investigated, and the ratio of the CS-DP/$PC_{71}BM$ was optimized to be 4:5 with pyridine as additive in chlorobenzene solution. Except for the initial thermal annealing (TA), tetrahydrofuran (THF) solvent vapor annealing (SVA) treatment was further processed for the film and best vapor annealing time was found to be 20s. Although CS-DP has a high lying HOMO energy level of −4.96 eV and a small band gap of −1.26 eV, all devices demonstrated high open circuit voltages ($V_{OC}$) in a range of 0.75 to 0.83 V. The energy losses were calculated in-between 0.43-0.51 eV, which are among the smallest values for systems with a high EQE. As ultra-small bandgap donor materials usually process low $V_{OC}$ values, it is great potential to exactly balance the bandgap with the low energy losses and overall performance through finely structural engineering of $\pi$-conjugation systems.

TABLE 5

Key parameters of cell performance under different film processing conditions.

| SVA | Additive | TA °C. | $J_{SC}$ (mA $cm^{-2}$) | $V_{OC}$ (V) | FF (%) | PCE (%) |
|---|---|---|---|---|---|---|
| W/O | WO | W/O | 3.84 ± 0.16 | 0.827 ± 0.01 | 33.1 ± 3.2 | 1.05 ± 0.15 (1.20) |
| W/O | 3% Py | 90 | 9.50 ± 0.20 | 0.835 ± 0.01 | 42.2 ± 1.3 | 3.35 ± 0.13 (3.48) |
| THF | 3% Py | 90 | 12.61 ± 0.31 | 0.826 ± 0.01 | 56.3 ± 1.1 | 5.86 ± 0.18 (6.04) |
| THF | 3% Py | 110 | 15.14 ± 0.05 | 0.781 ± 0.015 | 69.8 ± 0.2 | 8.23 ± 0.06 (8.29) |
| THF | 3% Py | 130 | 14.75 ± 0.19 | 0.765 ± 0.012 | 68.2 ± 0.6 | 7.69 ± 0.14 (7.83) |
| THF | 3% Py | 150 | 14.20 ± 0.23 | 0.756 ± 0.01 | 60.1 ± 1.9 | 6.45 ± 0.27 (6.72) |

Notes:
The Ratio of CS-DP:$PC_{71}BM$ = 4:5;
W/O means without,
Py: Pyridine.
The average values are calculated from >24 devices with standard deviation.

As solvent vapor annealing (SVA) and thermal annealing (TA) are effective treatments to optimize thin film morphol-

TABLE 4

Absorption data for MP and CS-DP in $CHCl_3$.

| Comp. | $\lambda_{max}$ ($\varepsilon$/$10^5$ $M^{-1}$ $cm^{-1}$) | $\lambda_{max}$ (Film) | $\lambda_{onset}$ (Film) | $E_{ox}$ [V][a] | $E_{red}$ [V][a] | $E_{HOMO}$ [eV][a] | $E_{LUMO}$ [eV] | $E_g^{opt}$ [eV][b] |
|---|---|---|---|---|---|---|---|---|
| MP | 472 (1.64), 502 (1.95), 696 (1.81) | 520, 735 | 780 | 0.36 | −1.10 | −5.12 | −3.52 | 1.55 |
| CS-DP | 511 (2.65), 791 (1.65) | 525, 852 | 975 | 0.16 | −1.06 | −4.84 | −3.57 | 1.26 |

[a]Potential are measured relative to a Fc/$Fc^+$ as an external reference.
[b]Estimated from the onset of thin-film absorption.

Photovoltaics Performance

The solution-processed BHJ OSCs were fabricated utilizing CS-DP as the electron donor and $PC_{71}BM$ as the ogy in the active layer, CS-DP based devices also showed dramatically improved PCEs in comparison with those of as-cast devices after two step annealing (TA-SVA) treatments (FIG. 12A). In detail, as-cast devices gave an average PCE of 1.05%, with a $V_{OC}$ of 0.827 V, a $J_{SC}$ of 3.84 mA cm$^{-2}$, and a fill factor (FF) of 33.1%. Using pyridine as an additive and then thermal annealing at 90° C. for 5 min, the PCE value increased to 3.35%, with a $V_{OC}$=0.835 V, a $J_{SC}$=9.50 mA cm$^{-2}$, and an FF=42.2%. And the PCE of the device was further enhanced to 5.86% after SVA of the active layer with THF, corresponding to a $J_{SC}$=12.61 mA cm$^{-2}$ and an FF=56.3%.[35] Since a combined TA and SVA method can effectively enhance performances, it is worthy to note that proper thermal annealing treatment (110° C.) can provide the highest PCE for CS-DP with 20s THF vapor annealing. Under 110° C. thermal annealing, the device showed a $J_{SC}$ to 15.14 mA cm$^{-2}$, a FF of 69.8%, a $V_{OC}$ to 0.781 V and a PCE of 8.23%. However, 130° C. thermal annealing led to a decreased 7.69% PCE with a $V_{OC}$=0.765 V, a $J_{SC}$=14.75 mA cm$^{-2}$ and a FF=68.2%; 150° C. thermal annealing led to a further decreased PCE of 6.45%, with a $V_{OC}$ of 0.756 V, a $J_{SC}$ of 14.20 mA cm$^{-2}$, a fill factor of 60.1%, mainly due to an obvious reduction in $J_{SC}$.

Figure 13:
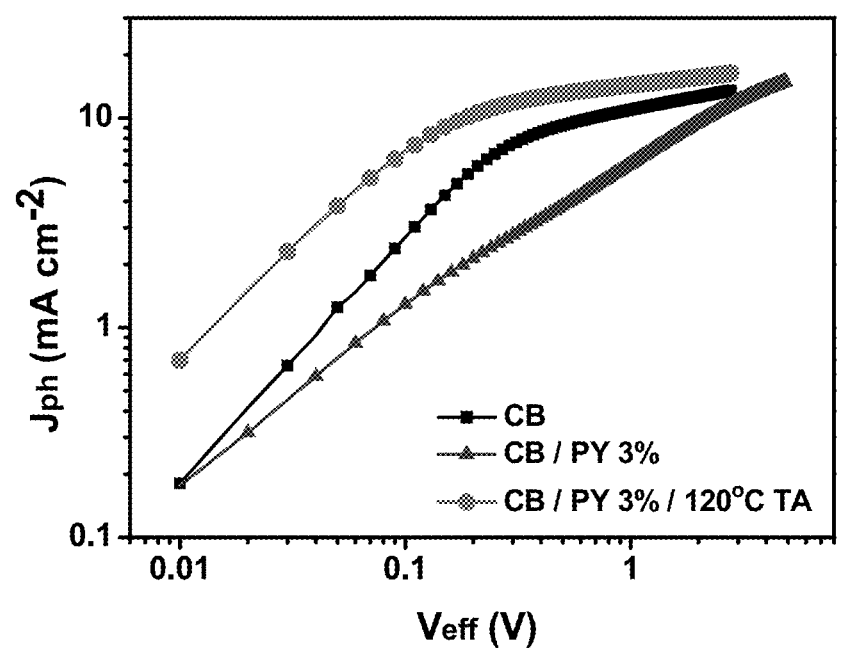
FIG. 13 Photocurrent density ($J_{ph}$) versus effective voltage ($V_{eff}$) characteristics of CS-DP/$PC_{71}BM$ solar cells under three different processing conditions: 1) chlorobenzene (CB); 2) chlorobenzene (CB)+pyridine (PY) 3%; 3) chlorobenzene (CB)+pyridine (PY) 3%+120° C. thermal annealing (TA).

The external quantum efficiency (EQE) was measured to explore the spectral response of the optimized devices. The results are shown in FIG. 12B, which is matched well with J-V measurements. It is clear that the CS-DP based devices can convert photons into electrons efficiently in the wavelength region of 300-900 nm, and a lower EQE tail extended to 950 nm, well inside NIR region. The three prominent peaks around 350, 500 and 800 nm, corresponding to PC$_{71}$BM, Soret band and Q band absorption features. The relationship between photocurrent ($J_{ph}$) and effective voltage ($V_{eff}$) was also examined (FIG. 13). The $J_{ph}$ value reaches the saturation value ($J_{ph,sat}$) at high effective voltage. Theoretically, the $J_{ph,sat}$ was correlated to the maximum exciton generation rate after photons being absorbed. The OPV cell with TA treatment showed a higher $J_{ph,sat}$ compared to pristine device, indicating that more photons could be absorbed, corresponding to the optimized morphology. In addition, the charge collection probabilities P(E,T), which can be assessed by the $J_{ph}/J_{ph,sat}$ ratios under short circuit conditions, are 51.9% and 87.5% for the pristine device and the device with additive and TA treatment, indicating improved charge collection efficiency. Device processed by using only pyridine additive without TA showed a reduced $J_{ph}$-voltage relationship in the carrier-drifting region. This is because the transport of carriers is quite unbalanced and the build-up of space charges strongly limits photon current, thus the correlated device fill factor is low.

Experimental Sections

Synthesis of Compound a (Scheme 3)

PZnBr (1 g, 1.055 mmol) was mixed 4-ethynyl-2,5-bis (hexyloxy)benzaldehyde (313.3 mg, 0.950 mmol, ~0.9 eq) in 50 ml of THF and 20 ml of triethylamine. After degassed with N$_2$ for 20 min, Pd(PPh$_3$)$_4$ (60 mg, 0.053 mmol) and CuI (10 mg, 0.053 mmol) were added to the solution under an N$_2$ atmosphere. The reaction was stirred at 40° C. for 24 hours. The completion of the reaction was monitored by TLC. The solvent was removed by rotary evaporation. The residue was purified by column chromatography using CH$_2$Cl$_2$/n-hexanes=1/2 as eluent to give compound a (403 mg, yield=32%). $^1$H NMR (400 MHz, CDCl$_3$) δ (ppm): 0.68-0.78 (m, 12H), 0.85-1.06 (m, 30H), 1.16-1.38 (m, 12H), 1.39-1.59 (m, 16H), 1.82 (m, 2H), 1.96 (m, 2H), 2.34 (m, 2H), 2.73 (m, 4H), 2.93 (m, 4H), 4.23 (m, 2H), 4.34 (m, 2H), 7.48 (s, 2H), 9.59-9.71 (m, 6H), 9.87 (m, 2H), 10.46 (s, 1H).

Synthesis of Compound b (Scheme 3)

Compound a (200 mg, 0.166 mmol), Pd(PPh$_3$)$_4$(22 mg, 0.019 mmol), CuI (4 mg, 0.021 mmol) were mixed in THF (20 mL) and triethylamine (5 mL) to yield a green solution under nitrogen atmosphere. A solution of (triisopropylsilyl) acetylene (75 mg, 0.412 mmol) in triethylamine (5 mL) was slowly added to the reaction mixture at room temperature. The reaction mixture was then stirred at 40° C. for overnight to give deep green suspension. The completion of the reaction was verified by spot TLC. The solvent was then removed under reduced pressure, and the residue was chromatographed on silica gel using hexane as eluent to give compound b (156 mg, 72%). $^1$H NMR (400 MHz, CDCl$_3$) δ (ppm): 0.67-0.75 (m, 12H), 0.85-1.32 (m, 47H), 1.39-1.61 (m, 32H), 1.84 (m, 2H), 1.96 (m, 2H), 2.35 (m, 2H), 2.68 (m, 4H), 2.91 (m, 4H), 4.28 (t, J=6.4 Hz, 2H), 4.38 (t, J=6.4 Hz, 2H), 7.52 (s, 1H), 7.55 (s, 1H), 9.61 (t, J=4.4 Hz, 2H), 9.69 (d, J=4.8 Hz, 2H), 9.75 (dd, J=4.8 Hz, J$_2$=6.8 Hz, 2H), 9.92 (t, J=4.8 Hz, 2H), 10.53 (s, 1H).

Synthesis of Compound c (Scheme 3)

To a solution of compound b (150 mg, 0.115 mmol) was added TBAF (0.15 mL of 1.0 M solution in THF, 0.15 mmol) in THF (2 mL). The solution was stirred under N$_2$ for 30 min, and then added mixture of Compound a (150 mg, 0.124 mmol) in dry THF (10 mL) and triethylamine (5 mL). The solution was degassed with dinitrogen for 20 min; then Pd(PPh$_3$)$_4$(22 mg, 0.019 mmol) and CuI (4 mg, 0.021 mmol) were added to the mixture. The reaction mixture was then stirred at 50° C. for overnight under nitrogen. The solvent was removed in vacuo, and the residue was purified on a column chromatograph (silica gel) using CHCl$_3$ as eluent. Recrystallization from CHCl$_3$/methanol gave compound c (165 mg, 63%). (MALDI-TOF, m/z) calculated for C$_{144}$H$_{198}$N$_8$O$_6$Zn$_2$: 2267.4032; found: 2267.3987.

Synthesis of CS-DP (Scheme 3)

Compound c (150 mg, 0.066 mmol) was dissolved in a solution of dry CHCl$_3$, two drops of piperdine and then 3-ethylrhodanine (106 mg, 0.66 mmol) were added, and the resulting solution was refluxed and stirred for 12 hours under argon. The reaction was quenched into water (30 mL). The aqueous layers were extracted with CHCl$_3$ (3×20 mL). The organic layer was dried over NaSO$_4$. After removal of solvent, it was purified by chromatography on a silica gel column using CHCl$_3$ as eluent and was purified by preparative thin layer chromatography using a CHCl$_3$ as eluents. Then the crude solid was recrystallized from CHCl$_3$ and methanol mixture to afford CS-DP as a gray green solid (102 mg, 60%). (MALDI-TOF, m/z) calculated for C$_{154}$H$_{208}$N$_{10}$O$_6$S$_4$Zn$_2$: 2554.3430; found: 2554.3836.

Scheme 4.
Synthetic routes for CS-VI.
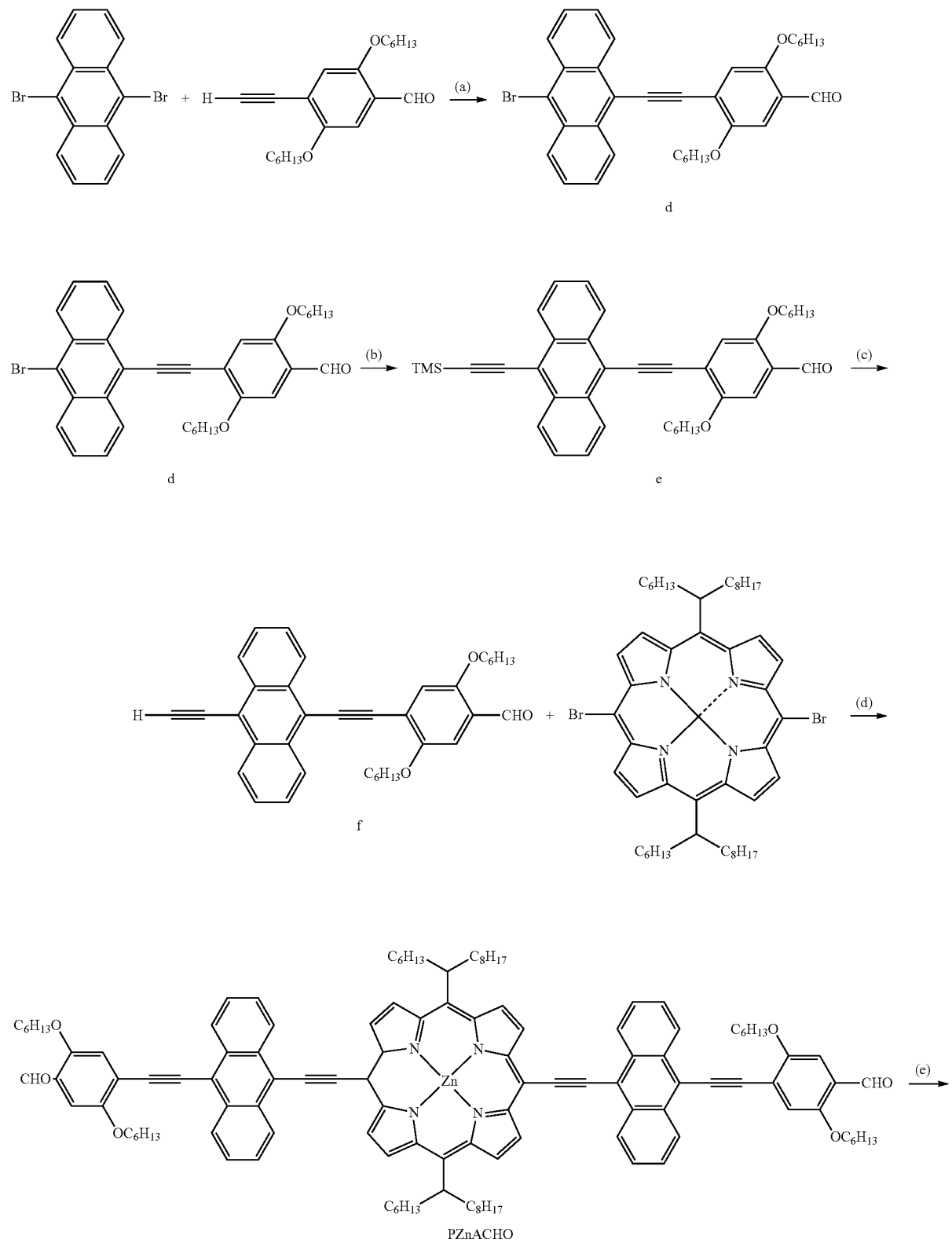

-continued

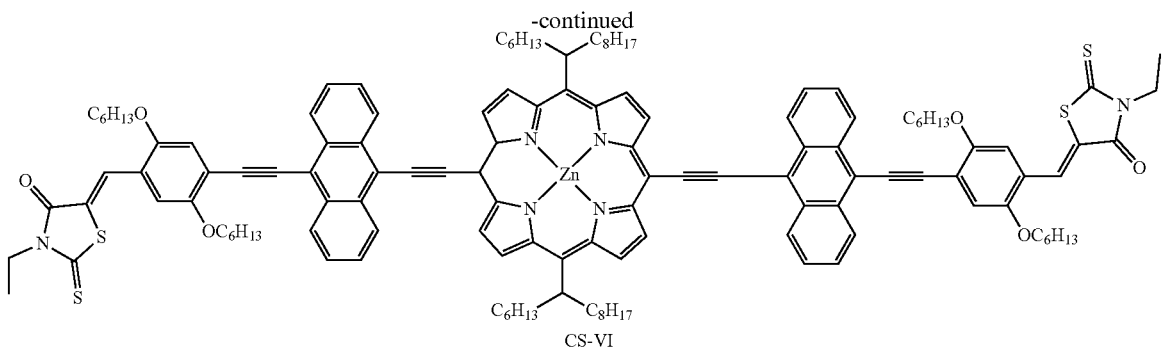

CS-VI

Reaction conditions:
a) Pd(PPh₃)₄, CuI, THF/Et₃N, 50° C, . overnight;
b) TMSA, PdCl₂(PPh₃)₂, CuI, THF/ET₃N, 40° C, . overnight;
c) KOH$_{(aq)}$, THF/MeOH, RT, 2h
d) Pd(PPh₃)₄, CuI, THF/ET₃N, 50° C, . overnight;
e) 3-ethylrhodanine, dry CHCl₃, piperidine, reflux, overnight.

4-((10-bromoanthracen-9-yl)ethynyl)-2,5-bis(hexyloxy) benzaldehyde (compound d in Scheme 4): 380 mg of 9,10-dibromoanthracene was mixed with 335 mg of 4-ethynyl-2,5-bis(hexyloxy)benzaldehyde in 30 ml of THF and 5 ml of triethylamine. After degassed with $N_2$ for 20 min, 43.6 mg Pd(PPh₃)₄ and 7.2 mg CuI were added to the solution under $N_2$ atmosphere. The reaction was stirred at 70° C. for overnight. The completion of the reaction was monitored by TLC. The solvent was removed by rotary evaporation. The residue was purified by column chromatography using $CH_2Cl_2$/n-hexanes=1/4 as eluent to give 378 mg of compound d (yield=57%).

4-((10-ethynylanthracen-9-yl)ethynyl)-2,5-bis(hexyloxy) benzaldehyde (compound e in Scheme 4): 300 mg of compound d was mixed with 1 ml of trimethylsilyl acetylene in 30 ml of THF and 5 ml of triethylamine. After degassed with $N_2$ for 20 min, 29.3 mg PdCl₂(PPh₃)₂ and 8 mg CuI were added to the solution under $N_2$ atmosphere. The reaction was stirred at 40° C. for overnight. The completion of the reaction was monitored by TLC. The solvent was removed by rotary evaporation. The residue was purified by column chromatography using $CH_2Cl_2$/n-hexanes=1/1 as eluent, 300 mg of compound e were collected (yield=97%). For the de-protection process, 300 mg of yellow solids were put in THF/MeOH=4/1 (v/v) to react with 1 ml of 1.0 M KOH$_{(aq)}$ for 2 hours at room temperature. The solvents were then removed under reduced pressure, followed by chromatographic separation on silica gel with $CH_2C_{12}$/n-hexanes=1/1 to afford 224 mg of compound f (yield=85%).

PZnACHO:
220 mg of compound f was mixed with 177 mg of PZnBr in 30 ml of THF and 5 ml of triethylamine. After degassed with $N_2$ for 20 min, 26.9 mg of Pd(PPh₃)₄ and 4.4 mg of CuI were added to the solution under $N_2$ atmosphere. The reaction was stirred at 40° C. for 24 hours. The completion of the reaction was monitored by TLC. The solvent was removed by rotary evaporation. The residue was purified by column chromatography (silica gel) using $CHCl_3$/n-hexanes=2/1 as eluent to give 238 mg of PZnACHO (yield=62%).

CS-VI:
150 mg of compound PZnACHO was dissolved in a solution of dry $CHCl_3$, two drops of piperdine and then 3-ethylrhodanine (106 mg, 0.66 mmol) were added, and the resulting solution was refluxed and stirred for 12 h under argon. The reaction was quenched into water (30 mL). The aqueous layers were extracted with $CHCl_3$ (3×20 mL). The organic layer was dried over $NaSO_4$. After removal of solvent, it was purified by chromatography on a silica gel column using $CHCl_3$ as eluent and was purified by preparative thin layer chromatography using a $CHCl_3$ as eluents. Then the crude solid was recrystallized from $CHCl_3$ and methanol mixture to afford CS-VI as a black solid (95 mg, 55%).

INDUSTRIAL APPLICABILITY

The present disclosure relates to porphyrin small molecules designed and synthesized for bulk heterojunction (BHJ) organic solar cells (OSCs). Provided are synthesized materials with strong and ordered self-assembly property, leading to form bi-continuous, interpenetrating networks which are required for efficient charge separation and transport in organic solar cells. The power conversion efficiency (PCE) of the solar cells devices based on the embodiments of the present disclosure have the highest PCE among the solution-processed BHJ solar cell based on porphyrin small molecules up to date.

We claim:
1. A porphyrin small molecule having a molecular formula represented by Type 1, Type 2, Type 3, or Type 4:

Type 1

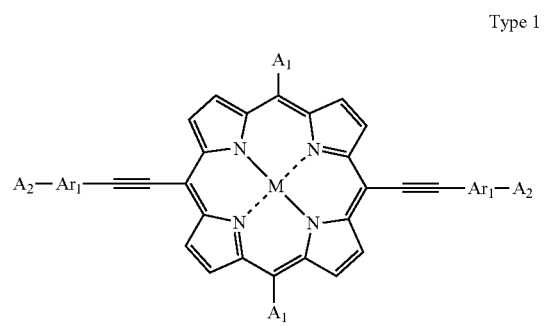

-continued
Type 2
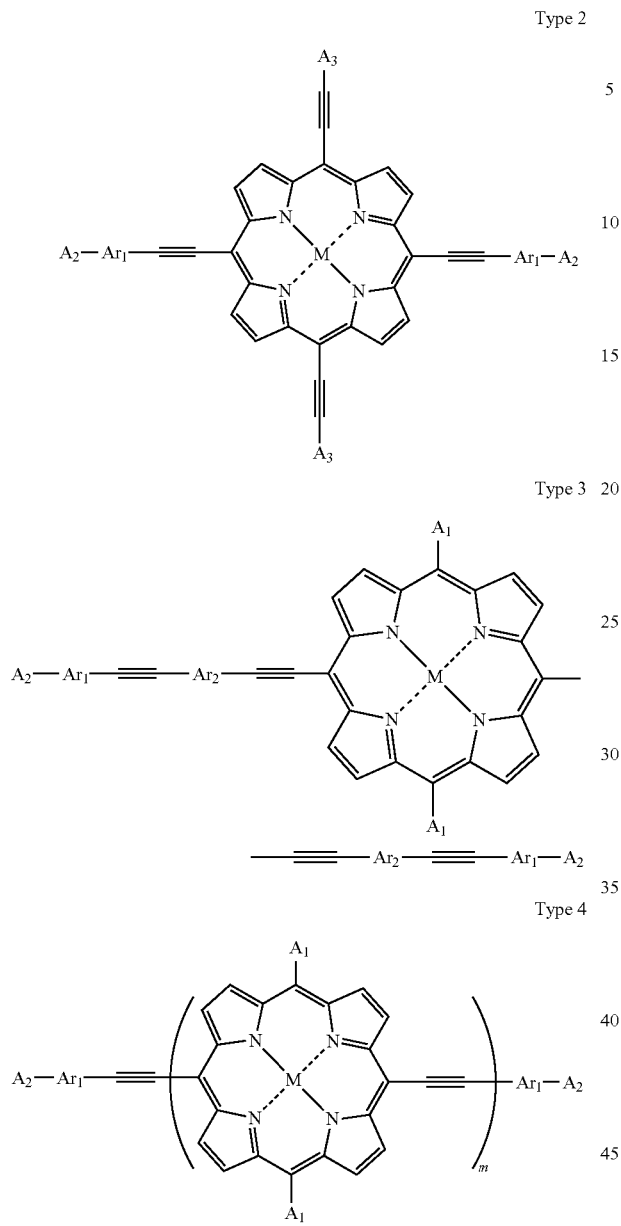
Type 3
Type 4
wherein,
m is an integer selected from 2, 3, 4, or 5;
M is selected from the group consisting of $Fe^{2+}$, $Co^{2+}$, $Ni^{2+}$, $Zn^{2+}$, $Cu^{2+}$, $Ru^{2+}$, $Pd^{2+}$, and $Pt^{2+}$;
$Ar_1$ for each occurrence is independently selected from the group consisting of:
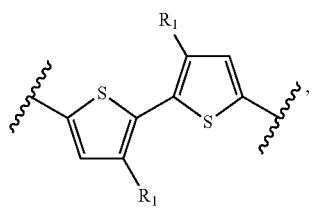
-continued
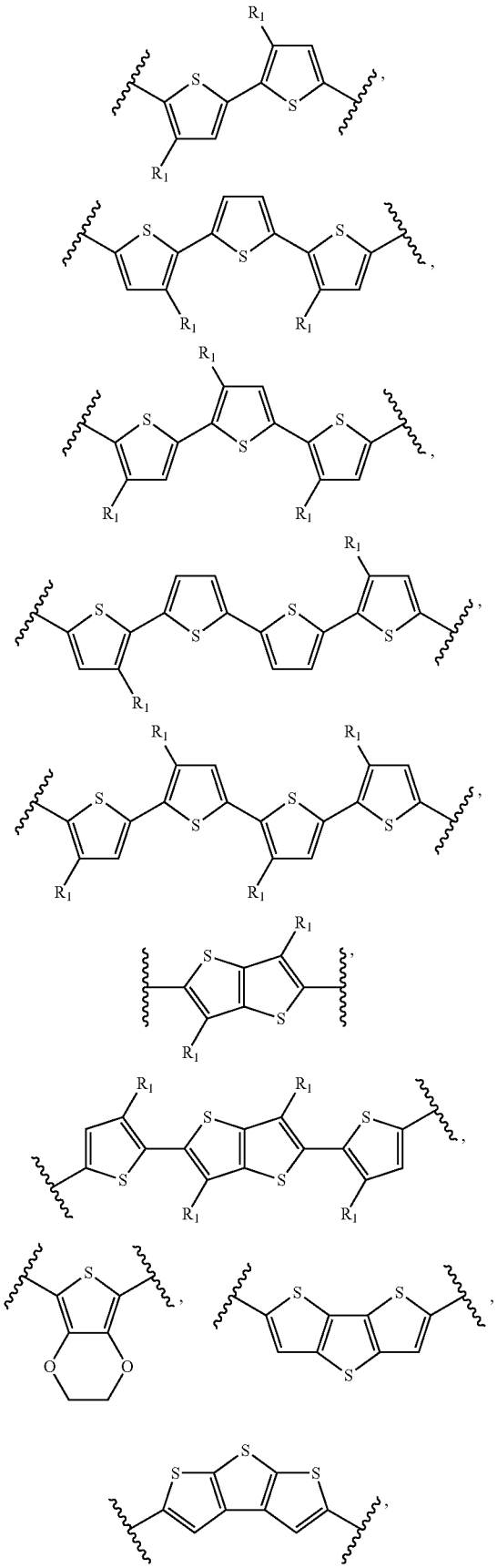

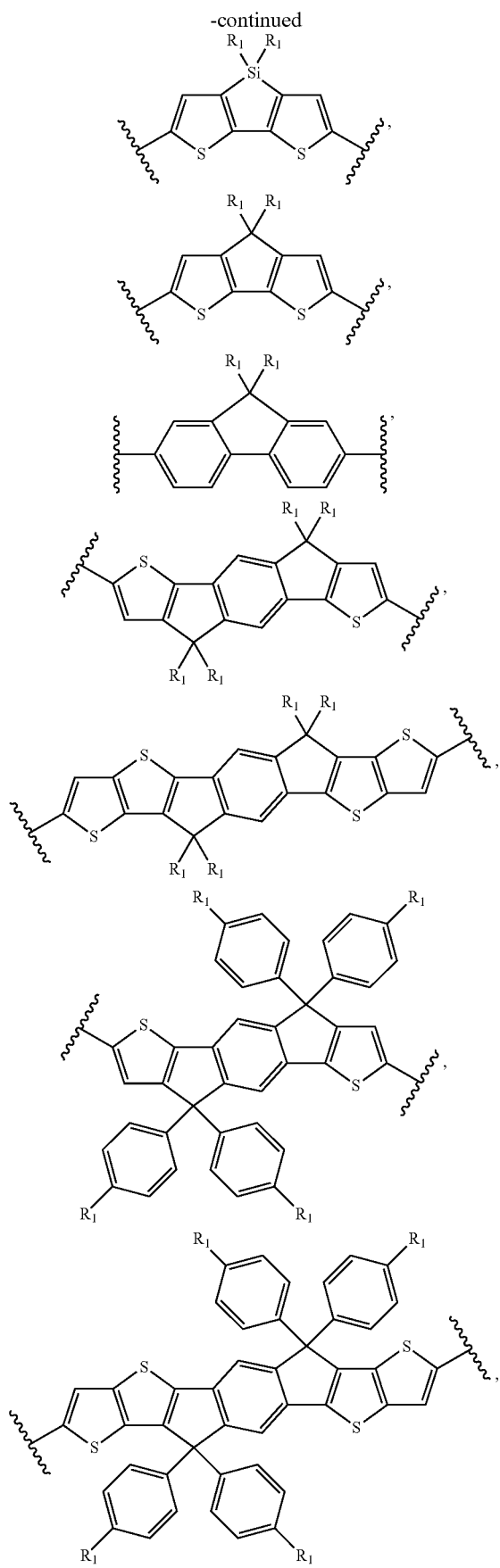
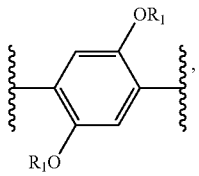
and
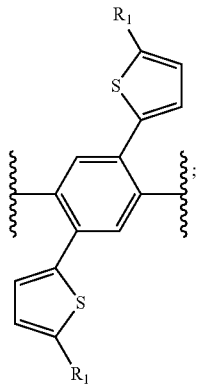
Ar₂ for each occurrence is independently selected from the group consisting of:
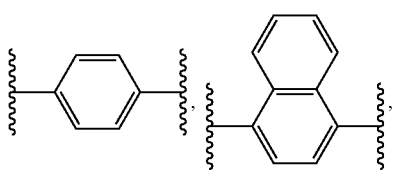
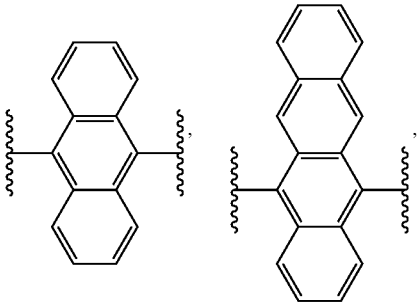
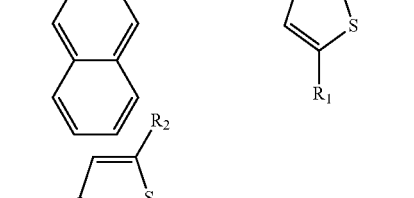
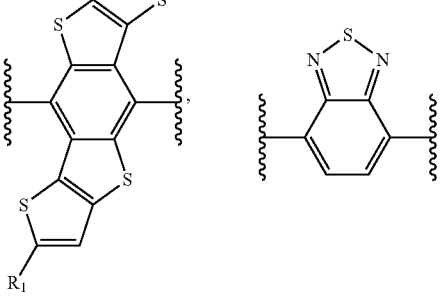

83
-continued

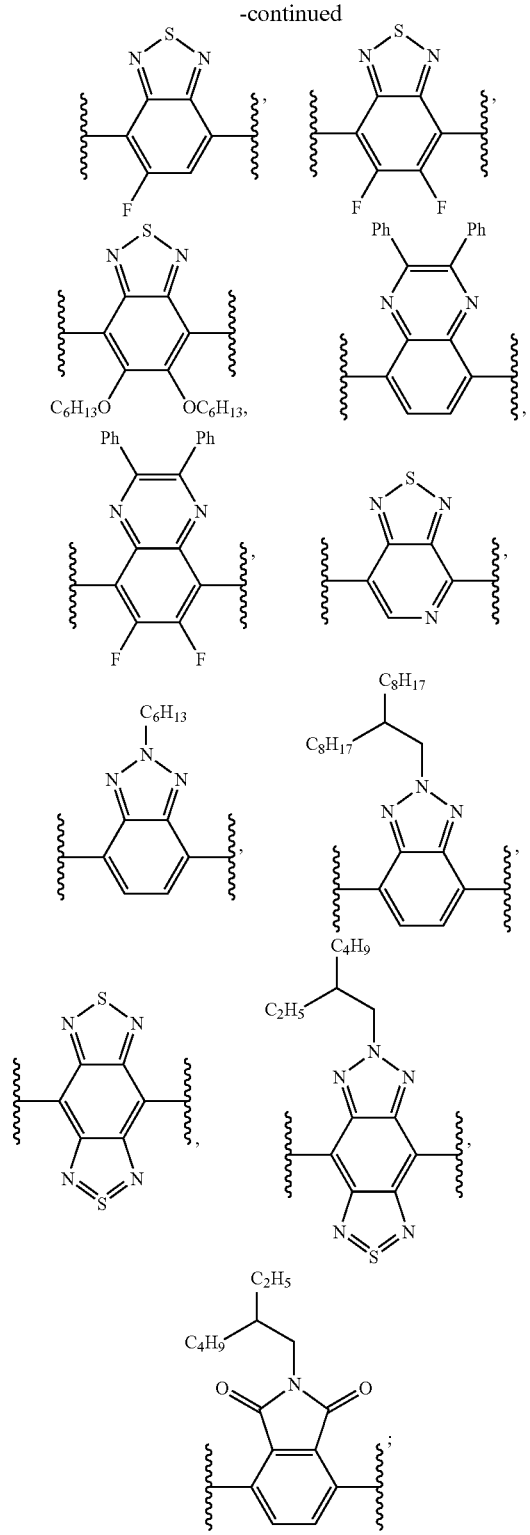

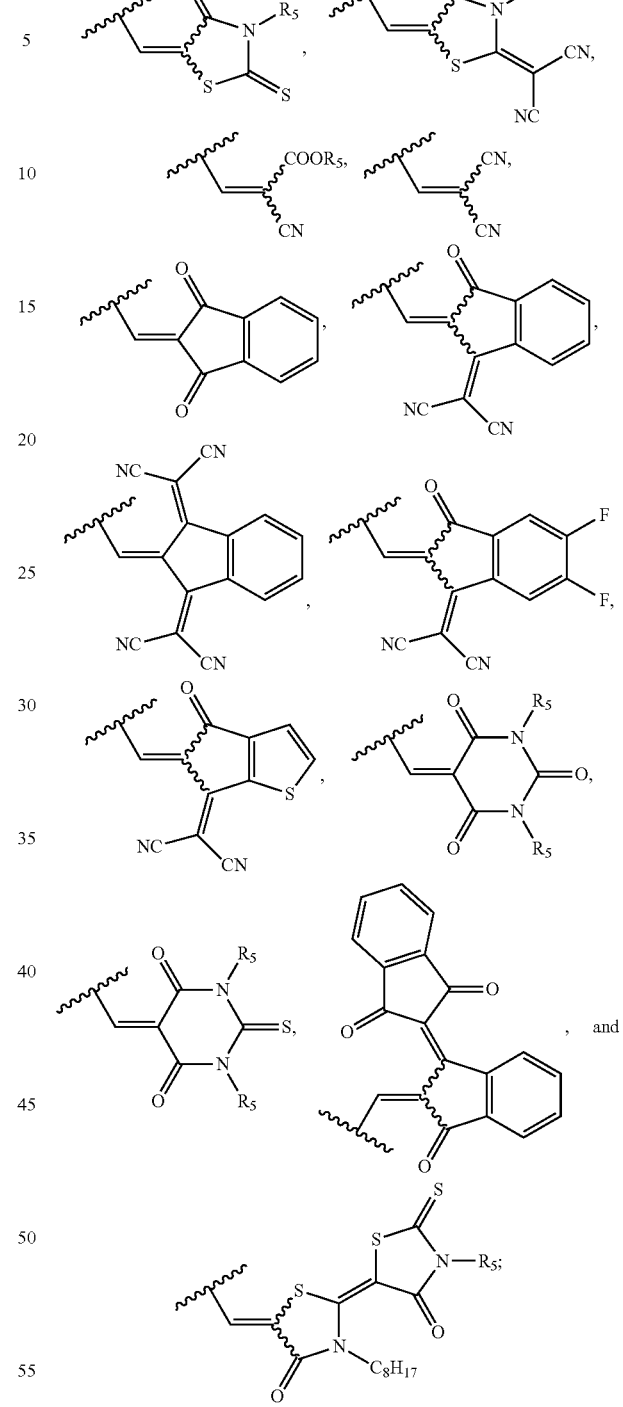

A₁ for each instance is independently selected from the group consisting of hydrogen, alkyl, cycloalkyl, haloalkyl, R₃, —CH(R₃)(R₄), —CH₂CH(R₃)(R₄), —CH₂CH₂CH(R₃)(R₄), —CH₂(OCH₂CH₂)$_n$OCH₃, —CH₂(CH₂)$_n$CF₃, and —CF₂(CF₂)₅CF₃, wherein n is an integer number ranging from 0 to 20;

A₂ for each instance is independently selected from the group consisting from the group consisting of:

A₃ for each instance is independently selected from the group consisting of:

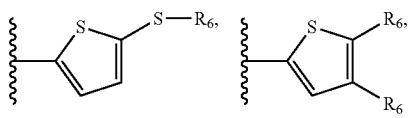

-continued

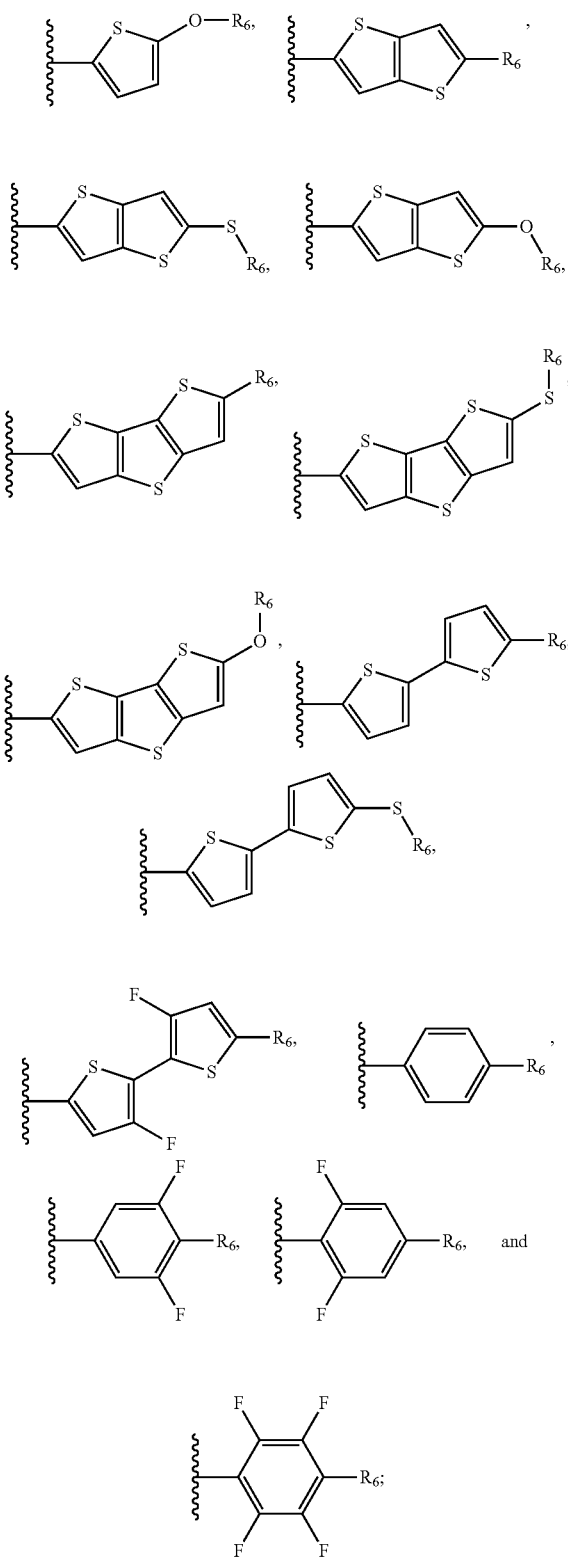

each instance of $R_1$, $R_2$, $R_5$, and $R_6$, is independently selected from the group consisting of hydrogen, halogen, cyano, alkyl, haloalkyl, alkoxy, haloalkoxy, aryl, haloaryl, aryloxy, halogenated aryloxy, cycloalkyl, heterocyclic alkyl, halogenated heterocyclic alkyl, heterocyclic alkoxy, halogenated heterocyclic alkoxy, heteroaryl, halogenated heteroaryl, heteroaryloxy, halogenated heterocyclic aryloxy, amino, halogenated amino, nitro,

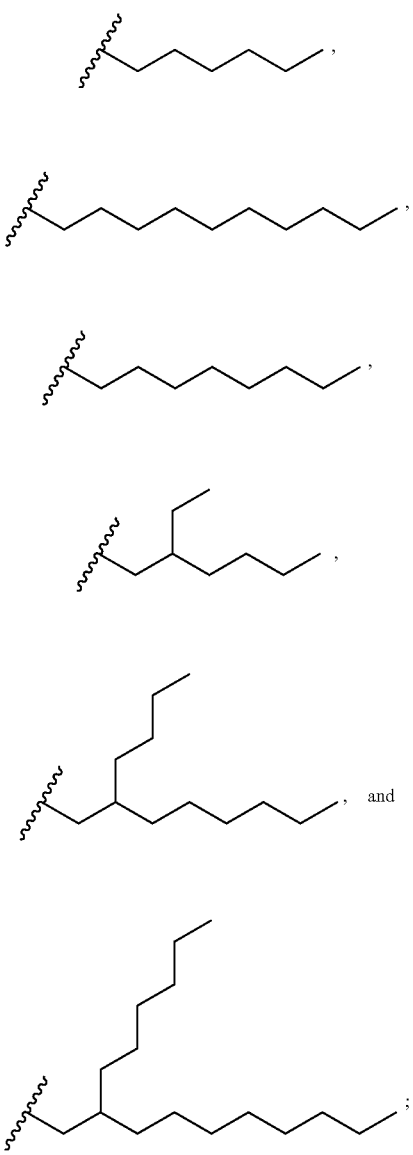

and $R_3$ and $R_4$ are independently selected from the group consisting of $C_1$-$C_{20}$ alkyl, cycloalkyl, alkoxyl, aryloxyl, thioalkoxyl, and thioaryloxyl.

2. The porphyrin small molecule according to claim 1, wherein said porphyrin small molecule has a molecular formula represented by Formula I:

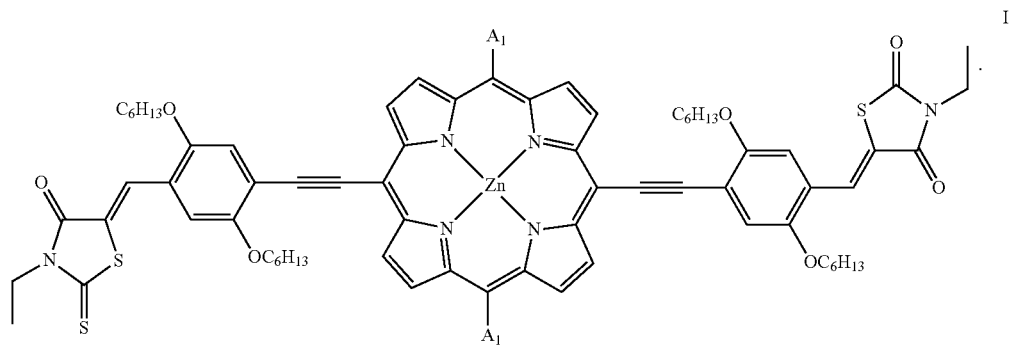
wherein, $A_1$ for each instance is independently selected from the group consisting of:
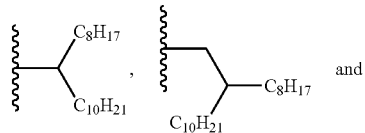 and 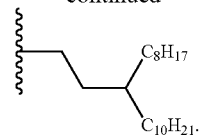
3. The porphyrin small molecule according to claim 1, wherein said porphyrin small molecule has a molecular formula represented by formula II or III:
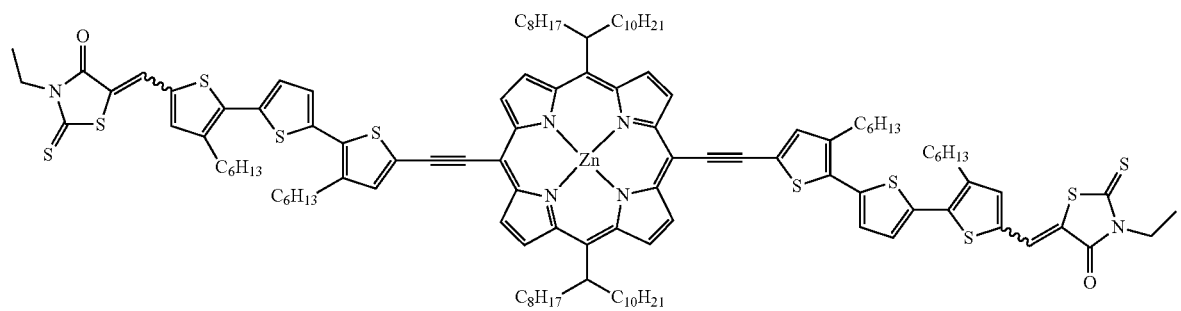
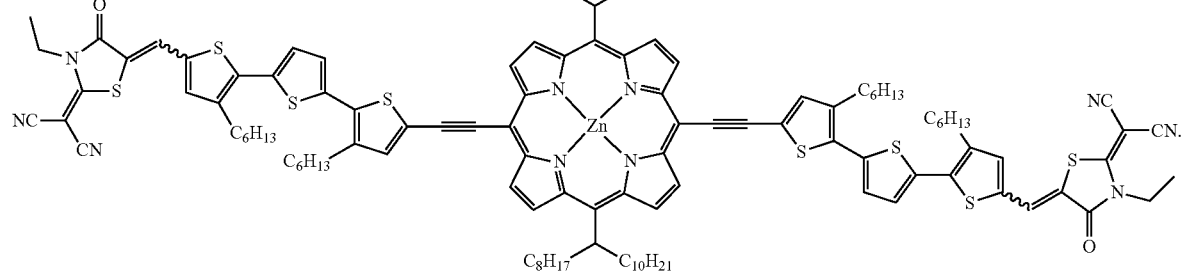

4. The porphyrin small molecule of claim 1, wherein said porphyrin small molecule has a molecular formula represented by IV or V:
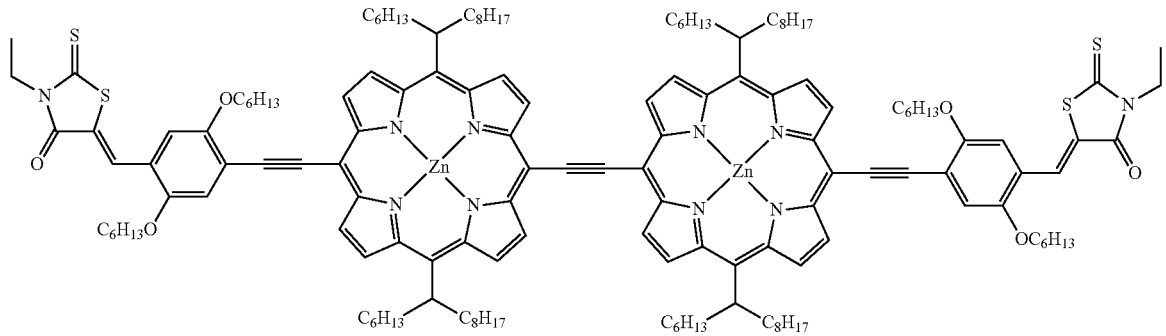
IV
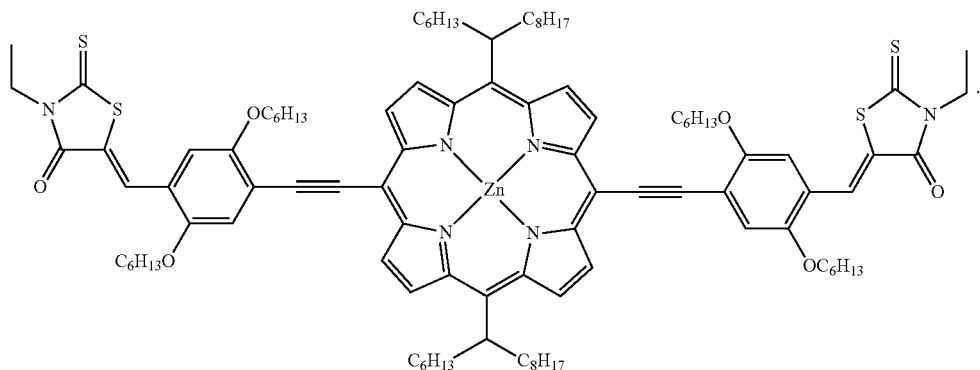
V
5. The porphyrin small molecule of claim 1 wherein said porphyrin small molecule has a molecular formula represented by the structure VI:
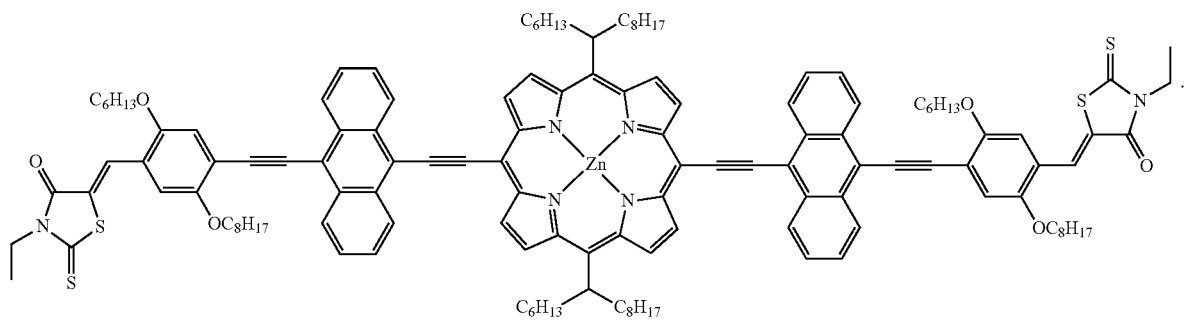
VI 6. A method of preparing the porphyrin small molecule of claim 2, comprising the steps of:
contacting a compound with molecular formula VII:

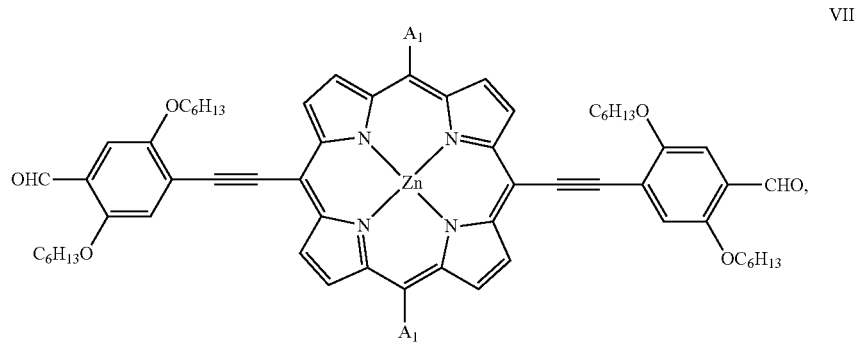

VII with 3-ethylrhodanine or a conjugate base thereof, and optionally a base thereby forming the porphyrin small molecule of claim 2, wherein Ai is as defined in claim 2.

7. A method of preparing the porphyrin small molecule of claim 3, comprising the steps of:
contacting a compound of formula VIII:

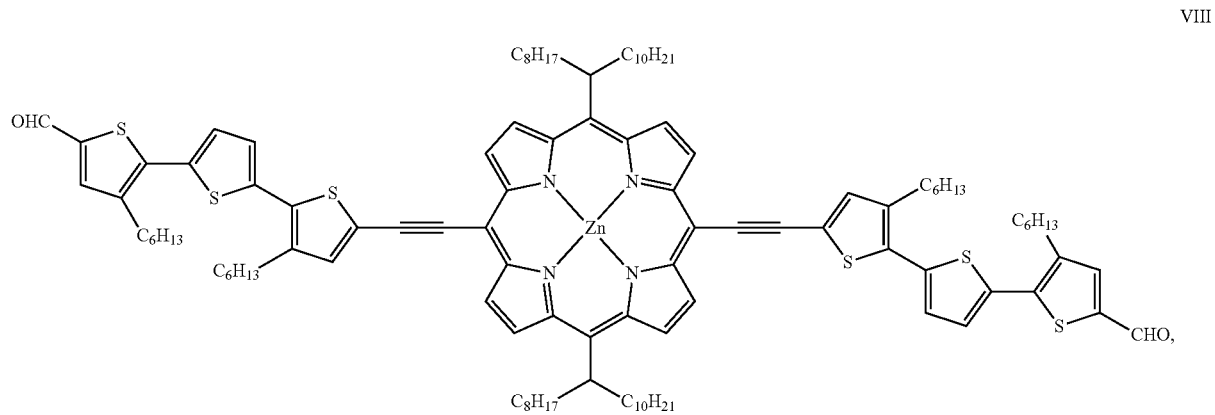

VIII 3-ethylrhodanine or 2-(1,1-dicyanomethylene), 3-ethyl-rhodanine or a conjugate base thereof, and optionally a base thereby forming the porphyrin small molecule of claim 3.

8. A method of preparing the porphyrin small molecule of claim 4 comprising the steps of:

contacting a compound of formula IX or X:

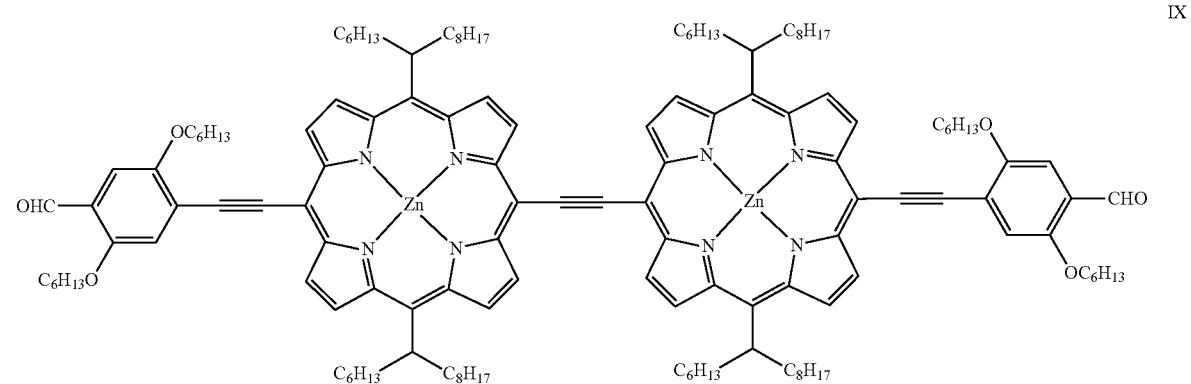

IX

-continued

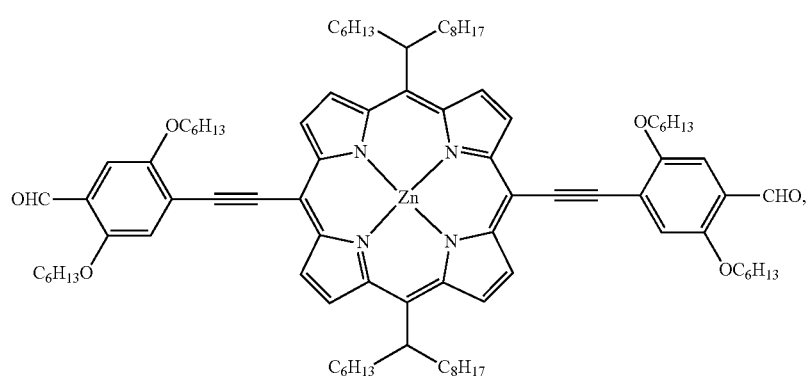

X 3-ethylrhodanine or a conjugate base thereof, and optionally a base thereby forming the porphyrin small molecule of claim 4.

9. A method of preparing the porphyrin small molecule of claim 5 comprising the steps of:

contacting a compound of formula XI:

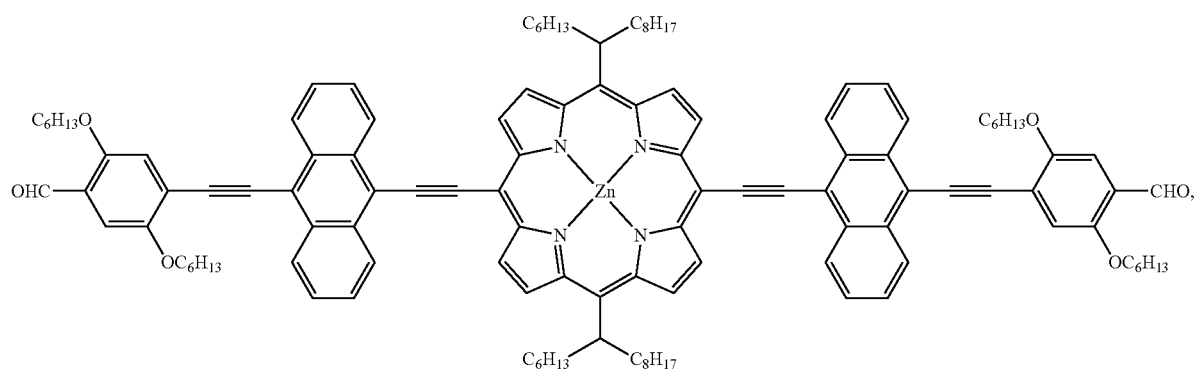

XI 3-ethylrhodanine or a conjugate base thereof, and optionally a base thereby forming the porphyrin small molecule of claim 5.

10. A bulk heterojunction (BHJ) organic solar cell comprising a porphyrin small molecule of claim 1.

11. A bulk heterojunction (BHJ) organic solar cell comprising a porphyrin small molecule of claim 2.

12. A bulk heterojunction (BHJ) organic solar cell comprising a porphyrin small molecule of claim 3.

13. A bulk heterojunction (BHJ) organic solar cell comprising a porphyrin small molecule of claim 4.

14. A bulk heterojunction (BHJ) organic solar cell comprising a porphyrin small molecule of claim 5.

* * * * *